United States Patent
Hasegawa et al.

(10) Patent No.: US 9,268,072 B2
(45) Date of Patent: Feb. 23, 2016

(54) OPTICAL FILTER, SOLID-STATE IMAGING ELEMENT, IMAGING DEVICE LENS AND IMAGING DEVICE

(71) Applicant: ASAHI GLASS COMPANY, LIMITED, Chiyoda-ku (JP)

(72) Inventors: Makoto Hasegawa, Tokyo (JP); Satoshi Kashiwabara, Tokyo (JP); Hiroshi Shimoda, Tokyo (JP); Kenta Sekikawa, Tokyo (JP); Takashi Shibuya, Tokyo (JP); Mitsuo Osawa, Tokyo (JP); Katsushi Kamijyo, Shizuoka (JP); Hiroyuki Arishima, Tokyo (JP); Hiroshi Kumai, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 30 days.

(21) Appl. No.: 14/099,328

(22) Filed: Dec. 6, 2013

(65) Prior Publication Data

US 2014/0091419 A1    Apr. 3, 2014

Related U.S. Application Data

(63) Continuation of application No. PCT/JP2012/064326, filed on Jun. 1, 2012.

(30) Foreign Application Priority Data

Jun. 6, 2011    (JP) .................................. 2011-126555

(51) Int. Cl.
*G02B 5/20* (2006.01)
*G02B 13/00* (2006.01)
(Continued)

(52) U.S. Cl.
CPC .............. *G02B 5/208* (2013.01); *C09B 23/086* (2013.01); *C09B 57/007* (2013.01); *G02B 1/04* (2013.01); *G02B 5/282* (2013.01); *G02B 13/004* (2013.01); *H01L 27/14621* (2013.01)

(58) Field of Classification Search
CPC .............. G02B 5/20; G02B 5/28; G02B 1/04; G02B 5/08; G02B 5/282; G02B 13/004; H01L 27/146; H01L 27/14621
See application file for complete search history.

(56) References Cited

U.S. PATENT DOCUMENTS 5,543,086 A * 8/1996 Bertelson et al. ............. 252/582
8,014,071 B2   9/2011 Matsumoto et al.
(Continued)

FOREIGN PATENT DOCUMENTS

CN    102262254    11/2011
JP    01-228960    9/1989
(Continued)

OTHER PUBLICATIONS

Sultanova et al., Disperdion Properties of Optical Polymers, Acta Physica Polonica A 116, 585-587 (2009).*
(Continued)

*Primary Examiner* — Michael Jung
*Assistant Examiner* — Charles R Peters
(74) *Attorney, Agent, or Firm* — Oblon, McClelland, Maier & Neustadt, L.L.P.

(57) ABSTRACT

The present invention relates to an optical filter, a solid-state imaging element and an imaging device lens which contain a near infrared ray absorbing layer having a specific near infrared ray absorbing dye dispersed in a transparent resin having a refractive index of 1.54 or more, and also relates to an imaging device containing the solid-state imaging element or the imaging device lens. The near infrared ray absorbing layer has a transmittance of visible light of from 450 to 600 nm of 70% or more, a transmittance of light in a wavelength region of from 695 to 720 nm of not more than 10%, and an amount of change of transmittance of not more than −0.8.

24 Claims, 8 Drawing Sheets (a)

(b)

(51) Int. Cl.
*G02B 1/04* (2006.01)
*G02B 5/28* (2006.01)
*H01L 27/146* (2006.01)
*C09B 23/08* (2006.01)
*C09B 57/00* (2006.01)

(56) References Cited

U.S. PATENT DOCUMENTS

| 8,693,089 B2 | 4/2014 | Saitoh et al. | |
|---|---|---|---|
| 2002/0017636 A1* | 2/2002 | Harada et al. | 252/582 |
| 2011/0070407 A1* | 3/2011 | Kato et al. | 428/172 |
| 2011/0110094 A1* | 5/2011 | Kashiwagi et al. | 362/293 |

FOREIGN PATENT DOCUMENTS

| JP | 2005-338395 | 12/2005 |
|---|---|---|
| JP | 2006-033138 | 2/2006 |
| JP | 2006-106570 | 4/2006 |
| JP | 2006-301489 | 11/2006 |
| JP | 2007-271745 | 10/2007 |
| JP | 2008-051985 | 3/2008 |
| JP | 2008-181028 | 8/2008 |
| JP | 2008-303130 | 12/2008 |
| JP | 2011-100084 | 5/2011 |
| JP | 2011-101089 | 5/2011 |
| JP | 2011-183570 | 9/2011 |
| JP | 2012-008532 | 1/2012 |
| JP | 2012-103340 | 5/2012 |
| JP | 2012-137645 | 7/2012 |
| JP | 2012-137646 | 7/2012 |
| JP | 2012-137647 | 7/2012 |
| JP | 2012-137648 | 7/2012 |
| JP | 2012-137649 | 7/2012 |
| JP | 2012-137650 | 7/2012 |
| JP | 2012-137651 | 7/2012 |
| KR | 10-2011-0129832 | 12/2011 |
| TW | 201211125 | 3/2012 |
| WO | 2011/040578 | 4/2011 |

OTHER PUBLICATIONS

U.S. Appl. No. 14/166,080, filed Jan. 28, 2014, Osawa, et al.
U.S. Appl. No. 13/972,056, filed Aug. 21, 2013, Hasegawa, et al.
International Search Report issued Sep. 4, 2012 in PCT/JP2012/064326 filed Jun. 1, 2012.
K.A. Bello et al. "Near-Infrared Absorbing Squarylium Dyes", Dyes and Pigments, 1996, vol. 31, No. 2, pp. 79-87.
Zhang et al, "Amino Acid Promoted CuI-Catalyzed C—N Bond Formation between Aryl Halides and Amines or N-containing Heterocycles" JOC Article 2005, 70,5164-5173.
B. I. Berezin, "Printing Ingredient Handbook", Light Industry Press, First Edition, Oct. 1958 (cited in Office Action issued Dec. 15, 2015 in corresponding Chinese Patent Application) (w/ English translation).

* cited by examiner (a)

(b)

(a)

(b)

(a)

(b)

US 9,268,072 B2

OPTICAL FILTER, SOLID-STATE IMAGING ELEMENT, IMAGING DEVICE LENS AND IMAGING DEVICE

TECHNICAL FIELD

The present invention relates to an optical filter, a solid-state imaging element and an imaging device lens, which have a near infrared ray shielding effect, and it also relates to an imaging device using the same.

BACKGROUND ART

In recent years, optical filters that sufficiently transmit light in a visible wavelength region therethrough but shield light in a near infrared wavelength region are used for various applications.

For example, in imaging devices using a solid-state imaging element (e.g., CCD, CMOS, etc.), such as a digital still camera, a digital video camera, etc., or in display devices using a light receiving element, such as an automatic exposure meter, etc., in order to approximate the sensitivity of the solid-state imaging element or light receiving element to the luminosity factor of a human being, such an optical filter is disposed between an imaging lens and the solid-state imaging element or light receiving element. In addition, in PDP (plasma display panel), in order to prevent malfunction of a household electrical appliance remote controller operating at a near infrared ray from occurring, the optical filter is disposed on the front (viewing side) thereof.

Among them, as an optical filter for imaging device, glass filters in which CuO or the like is added to a fluorophosphate-based glass or a phosphate-based glass so as to selectively absorb light in a near infrared wavelength region are known. However, light absorption type glass filters involved such a problem that not only they are expensive, but also they are difficult to achieve slimming, so that they may be impossible to sufficiently respond to downsizing and slimming requirements for imaging devices of recent years.

Then, in order to solve the foregoing problem, there have been developed a reflection type interference filter in which, for example, a silicon oxide ($SiO_2$) layer and a titanium oxide ($TiO_2$) layer are stacked alternately on a substrate and which reflects light in a near infrared wavelength region due to the interference of light to shield the light; a film containing a dye that absorbs light in a near infrared wavelength region in a transparent resin; and the like (see, for example, Patent Document 1). In addition, there has also been developed an optical filter composed of a combination of the foregoing, in which a resin layer containing a dye that absorbs a near infrared ray and a layer that reflects a near infrared ray are stacked (see, for example, Patent Document 2). Furthermore, the resin layer containing a dye that absorbs a near infrared ray is described in, for example, Patent Document 3.

However, in these conventional optical filters for imaging device, the performance for shielding light of a wavelength in a near infrared region and the transmission properties in a wavelength band (630 to 700 nm) required for taking a picture of a dark portion more bright are not sufficient, and furthermore, the layer formation is restricted such that the functions of a solid-state imaging element are not hindered. Therefore, it is the present state that no optical filter having a sufficient near infrared ray cut filter function is obtainable.

On the other hand, a near infrared ray absorbing dye which exhibits a maximum absorption wavelength in the vicinity of from 700 to 750 nm and in which the inclination of an absorption curve of light having a wavelength of from 630 to 700 nm is steep, is used in a near infrared ray cut filter as a resin layer in which it is dispersed in a transparent resin, for example, a cycloolefin resin, in view of the matter that when used in combination with other shielding component or shielding member, good near infrared ray shielding properties are obtainable. However, such a near infrared ray absorbing dye involved such problems that its near infrared ray absorbing wavelength region is narrow, so that in many cases, even when combined with other shielding member, a wavelength region in which the absorption is not sufficient appears.

RELATED ART DOCUMENTS

Patent Documents

Patent Document 1: JP-A-2008-181028
Patent Document 2: JP-A-2008-51985
Patent Document 3: JP-A-2012-008532

SUMMARY OF THE INVENTION

Problem to be Solved by the Invention

The present invention is aimed to provide an optical filter effectively using a near infrared ray absorbing dye, which when used solely or in combination with other selective wavelength shielding member, is excellent in terms of near infrared ray shielding properties and which may achieve sufficient downsizing and slimming.

In addition, the present invention is also aimed to provide a solid-state imaging element and an imaging device lens, which when used solely or in combination with other selective wavelength shielding member, have good near infrared ray shielding properties and which may achieve sufficient downsizing, slimming and low costs of an imaging device, and an imaging device having near infrared ray shielding properties.

Means for Solving the Problem

The first aspect of the present invention provides an optical filter containing a near infrared ray absorbing layer having a near infrared ray absorbing dye (A) dispersed in a transparent resin (B), in which the near infrared ray absorbing dye (A) contains a near infrared ray absorbing dye (A1) having a maximum absorption peak such that in an absorption spectrum of light in a wavelength region of from 400 to 1,000 nm as measured upon being dissolved in a solvent for dye having a refractive index ($n_{20}d$) of less than 1.500, a peak wavelength is present in a region of from 695 to 720 nm, a full width at half maximum is not more than 60 nm, and when calculated with an absorbance at the peak wavelength being 1, a value obtained by dividing a difference between an absorbance at 630 nm and an absorbance at the peak wavelength by a wavelength difference between 630 nm and the peak wavelength is from 0.010 to 0.050;

the transparent resin (B) has a refractive index ($n_{20}d$) of 1.54 or more; and the near infrared ray absorbing layer has a transmittance of visible light of from 450 to 600 nm of 70% or more, a transmittance of light in a wavelength region of from 695 to 720 nm of not more than 10%, and an amount of change D of transmittance expressed by the following equation (1) of not more than −0.8.

$$D(\%/nm) = [T_{700}(\%) - T_{630}(\%)]/[700(nm) - 630(nm)] \quad (1)$$

In the equation (1), $T_{700}$ is a transmittance at a wavelength of 700 nm in a transmission spectrum of the near infrared ray absorbing layer; and $T_{630}$ is a transmittance at a wavelength of 630 nm in the transmission spectrum of the near infrared ray absorbing layer.

Incidentally, the refractive index ($n_{20}d$) refers to a refractive index measured at 20° C. by using a light ray having a wavelength of 589 nm. The solvent for dye as used herein refers to a solvent which may sufficiently dissolve a dye therein in the vicinity of room temperature and enables to measure an absorbance.

The near infrared ray absorbing dye (A1) may be a dye having a maximum absorption peak exhibiting a peak wavelength in a region of from 700 to 720 nm in the absorption spectrum, and the near infrared ray absorbing layer may have an amount of change D of transmittance expressed by the equation (1) of not more than −0.86.

The near infrared ray absorbing dye (A1) may be composed of at least one member selected from squarylium compounds represented by the following formula (F1):

[Chem. 1]

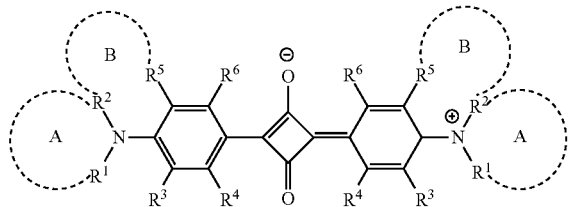

(F1)

Here, the symbols in the formula (F1) are as follows.

$R^1$ and $R^2$ are connected to each other to form a heterocyclic ring (ring A) of a 5-membered or 6-membered ring together with a nitrogen atom, which may contain an oxygen atom as a ring constituent atom, or $R^2$ and $R^5$ are connected to each other to form a heterocyclic ring (ring B) of a 5-membered or 6-membered ring together with a nitrogen atom, which may contain an oxygen atom as a ring constituent atom. Each of $R^1$ and $R^5$ that does not form a heterocyclic ring independently represents a hydrogen atom, a fluorine atom, a bromine atom, an alkyl group having from 1 to 6 carbon atoms which may have a substituent, an allyl group which may have a substituent, an aryl group having from 6 to 10 carbon atoms which may have a substituent, or an alaryl group having from 7 to 11 carbon atoms which may have a substituent. The alkyl group may be any of linear, branched or cyclic.

Each of $R^4$ and $R^6$ independently represents a hydrogen atom or $-NR^7R^8$ (each of $R^7$ and $R^8$ independently represents a hydrogen atom, an alkyl group having from 1 to 20 carbon atoms, or $-C(=O)-R^9$ ($R^9$ represents an alkyl group having from 1 to 20 carbon atoms or an aryl group having from 6 to 10 carbon atoms, which may have a substituent)).

Each $R^3$ independently represents a hydrogen atom or an alkyl group having from 1 to 6 carbon atoms.

The near infrared ray absorbing dye (A) may further contain a near infrared ray absorbing dye (A2) having a maximum absorption peak such that in an absorption spectrum of light in a wavelength region of from 400 to 1,000 nm as measured upon being dissolved in a solvent for dye having a refractive index ($n_{20}d$) of less than 1.500, a peak wavelength is present in a region of more than 720 nm and not more than 800 nm, and a full width at half maximum is not more than 100 nm.

The near infrared ray absorbing dye (A2) may be composed of at least one member selected from cyanine compounds represented by the following general formula (F2):

[Chem. 2]

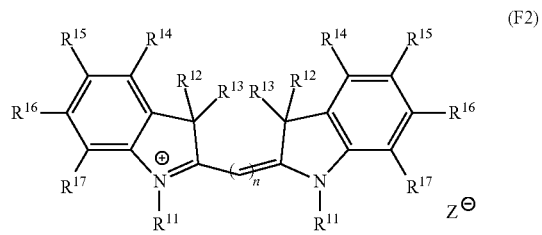

(F2)

Here, the symbols in the formula (F2) are as follows.

Each $R^{11}$ independently represents an alkyl group having from 1 to 20 carbon atoms, an alkoxy group, an alkylsulfone group, or an anion species thereof.

Each of $R^{12}$ and $R^{13}$ independently represents a hydrogen atom or an alkyl group having from 1 to 20 carbon atoms.

Z represents $PF_6$, $ClO_4$, $R^f-SO_2$, $(R^f-SO_2)_2-N$ ($R^f$ represents an alkyl group substituted with at least one fluorine atom), or $BF_4$.

Each of $R^{14}$, $R^{15}$, $R^{16}$, and $R^{17}$ independently represents a hydrogen atom, a halogen atom, or an alkyl group having from 1 to 6 carbon atoms.

n represents an integer of from 1 to 6.

The transparent resin (B) may contain at least one member selected from the group consisting of an acrylic resin, an epoxy resin, an ene/thiol resin, a polycarbonate resin, and a polyester resin. Incidentally, the above-described terms "acrylic resin" are used so as to include, in addition to the acrylic resin, acrylic resin-type resins such as a resin in which the acrylic resin is modified, etc. The same is also applicable to the other resins.

In the near infrared ray absorbing layer, a proportion of the near infrared ray absorbing dye (A1) may be in the range of from 3 to 100% by mass relative to the whole amount of the near infrared ray absorbing dye (A), and a proportion of the near infrared ray absorbing dye (A) may be from 0.05 to 5 parts by mass based on 100 parts by mass of the transparent resin (B).

The near infrared ray absorbing layer may have a film thickness of from 0.1 to 100 μm.

The optical filter may further contain, on one side or both sides of the near infrared ray absorbing layer, a selective wavelength shielding layer transmitting visible light of from 420 to 695 nm therethrough and shielding light in a wavelength region of from 710 to 1,100 nm.

The selective wavelength shielding layer provided in the optical filter may be composed of a dielectric multilayered film in which a low refractive index dielectric film and a high refractive index dielectric film are stacked alternately each other.

The optical filter having such a selective wavelength shielding layer may have a transmittance of visible light of from 420 to 620 nm being 70% or more; a transmittance of light in a wavelength region of from 710 to 860 nm being not more than 0.3%; and an amount of change Df of transmittance expressed by the following equation (2) being not more than −0.8.

$$Df(\%/nm)=[Tf_{700}(\%)-Tf_{630}(\%)]/[700(nm)-630(nm)] \quad (2)$$

In the equation (2), $Tf_{700}$ is a transmittance at a wavelength of 700 nm in a transmission spectrum of the optical filter; and $Tf_{630}$ is a transmittance at a wavelength of 630 nm in the transmission spectrum of the optical filter.

Another aspect of the present invention provides a solid-state imaging element containing a photoelectric conversion element and, formed on the photoelectric conversion element, a near infrared ray absorbing layer having a near infrared ray absorbing dye (A) dispersed in a transparent resin (B) in which the near infrared ray absorbing dye (A) contains a near infrared ray absorbing dye (A1) having a maximum absorption peak such that in an absorption spectrum of light in a wavelength region of from 400 to 1,000 nm as measured upon being dissolved in a solvent for dye having a refractive index ($n_{20}d$) of less than 1.500, a peak wavelength is present in a region of from 695 to 720 nm, a full width at half maximum is not more than 60 nm, and when calculated with an absorbance at the peak wavelength being 1, a value obtained by dividing a difference between an absorbance at 630 nm and an absorbance at the peak wavelength by a wavelength difference between 630 nm and the peak wavelength is from 0.010 to 0.050;

the transparent resin (B) has a refractive index ($n_{20}d$) of 1.54 or more; and the near infrared ray absorbing layer has a transmittance of visible light of from 450 to 600 nm of 70% or more, a transmittance of light in a wavelength region of from 695 to 720 nm of not more than 10%, and an amount of change D of transmittance expressed by the foregoing equation (1) of not more than −0.8.

The solid-state imaging element may further contain, on the photoelectric conversion element, at least one member selected from a light shielding layer, a flattened layer, a color filter layer, and a microlens.

The solid-state imaging element may further contain, on one side or both sides of the near infrared ray absorbing layer, a selective wavelength shielding layer transmitting visible light of from 420 to 695 nm therethrough and shielding light in a wavelength region of from 710 to 1,100 nm.

The selective wavelength shielding layer provided in the solid-state imaging element may be composed of a dielectric multilayered film in which a low refractive index dielectric film and a high refractive index dielectric film are stacked alternately each other.

Another aspect of the present invention provides an imaging device lens containing a near infrared ray absorbing layer having a near infrared ray absorbing dye (A) dispersed in a transparent resin (B), in which the near infrared ray absorbing dye (A) contains a near infrared ray absorbing dye (A1) having a maximum absorption peak such that in an absorption spectrum of light in a wavelength region of from 400 to 1,000 nm as measured upon being dissolved in a solvent for dye having a refractive index ($n_{20}d$) of less than 1.500, a peak wavelength is present in a region of from 695 to 720 nm, a full width at half maximum is not more than 60 nm, and when calculated with an absorbance at the peak wavelength being 1, a value obtained by dividing a difference between an absorbance at 630 nm and an absorbance at the peak wavelength by a wavelength difference between 630 nm and the peak wavelength is from 0.010 to 0.050;

the transparent resin (B) has a refractive index ($n_{20}d$) of 1.54 or more; and the near infrared ray absorbing layer has a transmittance of visible light of from 450 to 600 nm of 70% or more, a transmittance of light in a wavelength region of from 695 to 720 nm of not more than 10%, and an amount of change D of transmittance expressed by the foregoing equation (1) of not more than −0.8.

The near infrared ray absorbing layer may be formed on at least one surface of a lens main body.

The imaging device lens may further contain, on one side or both sides of the near infrared ray absorbing layer, a selective wavelength shielding layer transmitting visible light of from 420 to 695 nm therethrough and shielding light in a wavelength region of from 710 to 1,100 nm.

The selective wavelength shielding layer provided in the imaging device lens may be composed of a dielectric multi-layered film in which a low refractive index dielectric film and a high refractive index dielectric film are stacked alternately each other.

Another aspect of the present invention provides an imaging device containing the above-described solid-state imaging element.

Another aspect of the present invention provides an imaging device containing the above-described imaging device lens.

Here, in the present description, "transmitting light" means that the transmittance of light at that wavelength is 85% or more, unless otherwise indicated. In addition, "shielding light" means that the transmittance of light at that wavelength is not more than 5%. Furthermore, similar to "shielding light", "reflecting light" means that the transmittance of light at that wavelength is not more than 5%. In addition, with respect to the transmittance in a specified wavelength region, the matter that the transmittance is, for example, 85% or more means that the transmittance in the whole wavelength in that wavelength region is not lower than 85%; and similarly, the matter that the transmittance is, for example, not more than 5% means that the transmittance does not exceed 5% in the whole wavelength in that wavelength region.

Effect of the Invention

According to the present invention, it may be possible to obtain an optical filter, a solid-state imaging element, and a lens, each of which when used solely or in combination with other selective wavelength shielding member, has a good near infrared ray shielding function and which may achieve sufficient downsizing, slimming and low costs of an imaging device, and an imaging device using the same.

MODES FOR CARRYING OUT THE INVENTION

Figure 1:
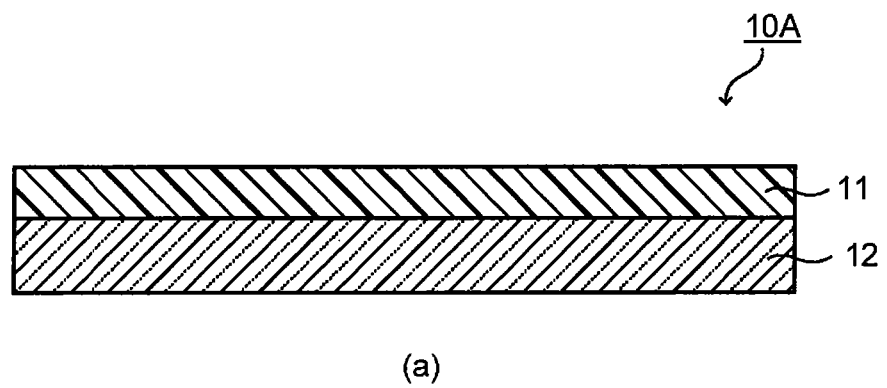
FIG. 1 This is a cross-sectional view showing diagrammatically an optical filter according to an embodiment of the present invention.
Figure 1:
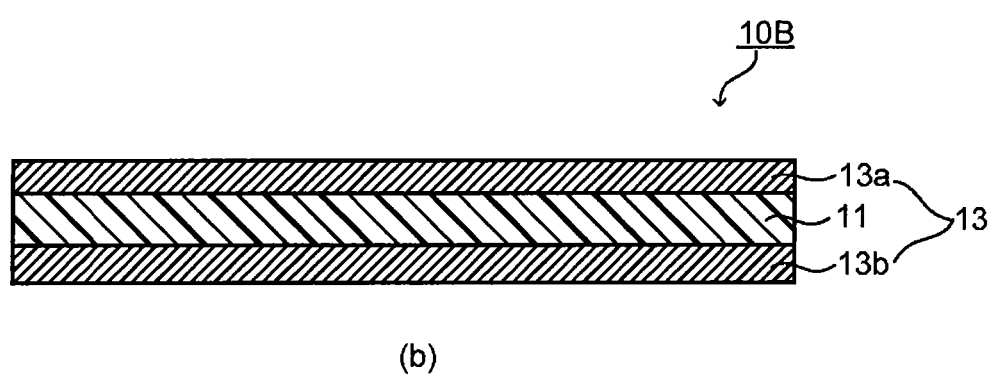

Embodiments of the present invention are hereunder described in detail.

First Embodiment

The present embodiment is concerned with an optical filter containing a near infrared ray absorbing layer having the following near infrared ray absorbing dye (A) dispersed in a transparent resin (B) having a refractive index ($n_{20}d$) of 1.54 or more, in which the near infrared ray absorbing layer has a transmittance of visible light of from 450 to 600 nm of 70% or more, a transmittance of light in a wavelength region of from 695 to 720 nm of not more than 10%, and an amount of change D of transmittance expressed by the foregoing equation (1) of not more than −0.8. Incidentally, in the present description, the refractive index refers to a refractive index ($n_{20}d$), unless otherwise indicated.

The near infrared ray absorbing dye (A) used in the present embodiment contains a near infrared ray absorbing dye (A1) having a maximum absorption peak such that in an absorption spectrum of light in a wavelength region of from 400 to 1,000 nm as measured upon being dissolved in a solvent for dye having a refractive index of less than 1.500, a peak wavelength is present in a region of from 695 to 720 nm, a full width at half maximum is not more than 60 nm, and when calculated with an absorbance at the peak wavelength being 1, a value obtained by dividing a difference between an absorbance at 630 nm and an absorbance at the above-described peak wavelength by a wavelength difference between 630 nm and the above-described peak wavelength is from 0.010 to 0.050.

In the present description, the near infrared ray absorbing dye is also referred to as "NIR absorbing dye". In addition, the absorption spectrum of light in a wavelength region of from 400 to 1,000 nm as measured by dissolving the NIR absorbing dye (A1) in the above-described predetermined solvent for dye in a concentration at which the absorbance at the peak wavelength of the maximum absorption peak is 1 is referred to simply as "absorption spectrum of the NIR absorbing dye (A1)". Furthermore, the peak wavelength of the maximum absorption peak in the absorption spectrum of the NIR absorbing dye (A1) is referred to as "λmax of the NIR absorbing dye (A1)" or "λmax(A1)". The same is also applicable to the NIR absorbing dye (A) other than the NIR absorbing dye (A1).

When calculated with an absorbance at λmax(A1) that is a peak wavelength of the maximum absorption peak in the absorption spectrum of the NIR absorbing dye (A1) being 1, a value obtained by dividing a difference between an absorbance ($Ab_{630}$) at 630 nm and an absorbance at λmax(A1) by a wavelength difference between 630 nm and λmax(A1) is hereinafter referred to as "absorption spectrum inclination". The same is also applicable to the NIR absorbing dye (A) other than the NIR absorbing dye (A1). Incidentally, the absorption spectrum inclination is expressed according to the following equation.

Absorption spectrum inclination=$(1-Ab_{630})/(\lambda max(A1)-630)$

In addition, the amount of change D of transmittance expressed by the foregoing equation (1) in the near infrared ray absorbing layer is also referred to simply as "amount of change D of transmittance".

The solvent for dye used for the measurement of the absorption spectrum of the NIR absorbing dye (A) is not particularly limited so long as it has a refractive index of less than 1.500 and is a solvent for dye specified relative to the NIR absorbing dye (A) to be measured. Though it varies depending upon the kind of the NIR absorbing dye (A), specifically, examples thereof include an alcohol such as methanol, ethanol, etc., a ketone solvent such as acetone, etc., a halogen-based solvent such as dichloromethane, etc., an aromatic solvent such as toluene, etc., and an alicyclic solvent such as cyclohexanone, etc.

Though the λmax at the maximum absorption peak of the absorption spectrum of the NIR absorbing dye (A1) is present in a region of from 695 to 720 nm, it is preferably present in a region of from 700 to 720 nm. Though the full width at half maximum at the maximum absorption peak of the absorption spectrum of the NIR absorbing dye (A1) is not more than 60 nm, it is preferably not more than 50 nm, and more preferably not more than 35 nm. Though the absorption spectrum inclination at the maximum absorption peak of the absorption spectrum of the NIR absorbing dye (A1) is from 0.010 to 0.050, it is preferably from 0.010 to 0.030, and more preferably from 0.010 to 0.014.

In addition, the NIR absorbing dye (A1) not only has the above-described characteristic features in terms of its absorption spectrum, but also preferably does not have an absorption peak having a full width at half maximum of not more than 100 nm and having a sharp shape other than the above-described maximum absorption peak in its absorption spectrum. The above-described light absorption properties of the NIR absorbing dye (A1) are consistent with optical properties required for a near infrared ray cut filter such that the absorbance changes steeply in the wavelength range in the vicinity of from 630 to 700 nm.

In the optical filter of the present embodiment, by using the NIR absorbing dye (A) containing the NIR absorbing dye (A1) and dispersing this in a transparent resin (B) as described later to form a near infrared ray absorbing layer, the above-described light absorption properties of the near infrared ray absorbing layer, namely, the light absorption properties such that the transmittance of visible light of from 450 to 600 nm is 70% or more, a transmittance of light in a wavelength region of from 695 to 720 nm is not more than 10%, and an amount of change D of transmittance is not more than −0.8, are achieved.

Namely, the NIR absorbing dye (A) has an action to make the near infrared ray absorbing layer have high transmitting properties in a visible wavelength band of from 450 to 600 nm and low transmitting (light shielding) properties in a near infrared wavelength band of from 695 to 720 nm and make a boundary region therebetween steep. This action of the NIR absorbing dye (A) is realized by the NIR absorbing dye (A1). For that reason, the NIR absorbing dye (A) does not substantially contain an NIR absorbing dye (A) having a λmax on the side of a shorter wavelength than 695 nm that is the minimum value of λmax(A1) of the NIR absorbing dye (A1). From this viewpoint, the NIR absorbing dye (A) may be constituted of only the NIR absorbing dye (A1).

However, in the optical filter of the present embodiment, it is preferable to widely control the transmittance in a near infrared wavelength region. For that reason, as a preferred mode, there may be the case where a combination of the above-described near infrared ray absorbing layer with, for example, a selective wavelength shielding layer composed of a dielectric multilayered film in which a low refractive index dielectric film and a high refractive index dielectric film are stacked alternately each other is used.

However, it is known that in the selective wavelength shielding layer composed of a dielectric multilayered film or the like, its optical spectrum fluctuates depending upon a visual line angle. For that reason, in actually using the optical filter, it is necessary to take into consideration such a fluctuation of the optical spectrum in a combination of the near infrared ray absorbing layer with the selective wavelength shielding layer. When such a combination with the selective wavelength shielding layer is taken into consideration, it is preferable that the near infrared ray absorbing layer shields light in a longer wavelength region so long as it has the above-described light absorption properties. Therefore, it is preferable that the NIR absorbing dye (A) contains an NIR absorbing dye (A2) having a maximum absorption peak such that in an absorption spectrum thereof, a peak wavelength is present in a wavelength region of more than 720 nm that is the maximum value of the λmax(A1) of the NIR absorbing dye (A1) and not more than 800 nm, and a full width at half maximum is not more than 100 nm.

That is, the NIR absorbing dye (A) is required to have an action such that the near infrared ray absorbing layer containing the same makes the inclination of a light absorption curve in a boundary region between a visible wavelength band and a near infrared wavelength band steep, and more preferably, it is required to impart properties for sufficiently absorbing light to an extent of a long wavelength side of the near infrared wavelength band. Then, as the NIR absorbing dye (A), the NIR absorbing dye (A1) is used such that in the near infrared ray absorbing layer, the inclination of the light absorption curve in the boundary region between the visible wavelength band and the near infrared wavelength band becomes steep, and more preferably, for the purpose of sufficiently absorbing light to an extent of a long wavelength side of the near infrared wavelength band, in addition to the NIR absorbing dye (A1), the NIR absorbing dye (A2) is combined and used.

Though a λmax (λmax(A2)) at the maximum absorption peak of the absorption spectrum of the NIR absorbing dye (A2) is present in a region of more than 720 nm and not more than 800 nm, it is preferably present in more than 720 nm and 760 nm. A full width at half maximum at the maximum absorption peak of the absorption spectrum of the NIR absorbing dye (A2) is not more than 100 nm, and preferably not more than 60 nm. A lower limit of the full width at half maximum is preferably 30 nm, and more preferably 40 nm. An absorption spectrum inclination at the maximum absorption peak of the absorption spectrum of the NIR absorbing dye (A2) is preferably from 0.007 to 0.011, and more preferably from 0.008 to 0.010.

In addition, the NIR absorbing dye (A2) not only has the above-described characteristic features in terms of its absorption spectrum, but also preferably does not have an absorption peak having a full width at half maximum of not more than 100 nm and having a sharp shape other than the above-described maximum absorption peak in its absorption spectrum.

Such NIR absorbing dye (A1) and NIR absorbing dye (A2) are hereunder described, respectively, and subsequently, the NIR absorbing dye (A) containing the same is described.

(NIR Absorbing Dye (A1))

The NIR absorbing dye (A1) is not particularly limited so long as it is a compound having the above-described light absorption properties. A compound having the above-described light absorption properties may be properly selected and used among those which are generally used as an NIR absorbing dye, such as cyanine compounds, phthalocyanine compounds, naphthalocyanine compounds, dithiol metal complex compounds, diimonium compounds, polymethine compounds, phthalide compounds, naphthoquinone compounds, anthraquinone compounds, indophenol compounds, squarylium compounds, etc. Of these, in particular, a squarylium compound is preferable from the standpoints that by adjusting a chemical structure, the steep absorption inclination can be obtained in the wavelength band as required for the above-described NIR absorbing dye (A1), and storage stability and stability against light can be ensured.

Specifically, as the NIR absorbing dye (A1), there is exemplified at least one member selected from squarylium compounds represented by the following formula (F1). In the present description, the compound represented by the formula (F1) is also referred to as "compound (F1)". The same is also applicable to other compounds.

The compound (F1) is a squarylium compound having a structure in which a benzene ring is bound to the left and right sides of a squarylium skeleton, a nitrogen atom is bound at the 4-position of each benzene ring, and a saturated heterocyclic ring containing this nitrogen atom is formed, and is a compound having light absorption properties as the above-described NIR absorbing dye (A1). In the compound (F1), substituents of the benzene ring may be properly adjusted within the following range depending upon other required properties such as an enhancement of solubility in a solvent (hereinafter sometimes referred to as "host solvent") which is used on the occasion of forming a near infrared ray absorbing layer or the transparent resin (B), etc.

[Chem. 3]

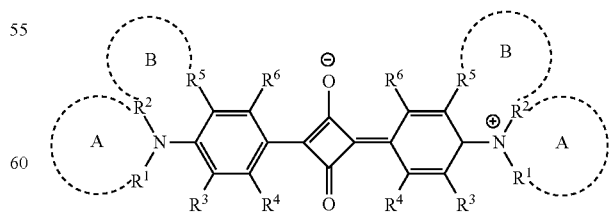

(F1)

Here, the symbols in the formula (F1) are as follows.

$R^1$ and $R^2$ are connected to each other to form a heterocyclic ring (ring A) of a 5-membered or 6-membered ring together with a nitrogen atom, which may contain an oxygen atom as a ring constituent atom, or $R^2$ and $R^5$ are connected to each other to form a heterocyclic ring (ring B) of a 5-membered or 6-membered ring together with a nitrogen atom, which may contain an oxygen atom as a ring constituent atom. Each of $R^1$ and $R^5$ that does not form a heterocyclic ring independently represents a hydrogen atom, a fluorine atom, a bromine atom, an alkyl group having from 1 to 6 carbon atoms which may have a substituent, an allyl group which may have a substituent, an aryl group having from 6 to 10 carbon atoms which may have a substituent, or an alaryl group having from 7 to 11 carbon atoms which may have a substituent. The alkyl group may be any of linear, branched or cyclic. Examples of the substituent include a fluorine atom, a bromine atom, an alkyl group having from 1 to 6 carbon atoms, a fluoroalkyl group having from 1 to 6 carbon atoms, an alkoxy group having from 1 to 6 carbon atoms, and the like.

Each of $R^4$ and $R^6$ independently represents a hydrogen atom or $-NR^7R^8$ (each of $R^7$ and $R^8$ independently represents a hydrogen atom, an alkyl group having from 1 to 20 carbon atoms, or $-C(=O)-R^9$ ($R^9$ represents an alkyl group having from 1 to 20 carbon atoms or an aryl group having from 6 to 10 carbon atoms, which may have a substituent)).

Each $R^3$ independently represents a hydrogen atom or an alkyl group having from 1 to 6 carbon atoms.

Incidentally, the compound (F1) includes a compound (F1-1) having a resonance structure of the structure represented by the foregoing general formula (F1), as represented by the following formula (F1-1).

[Chem. 4]

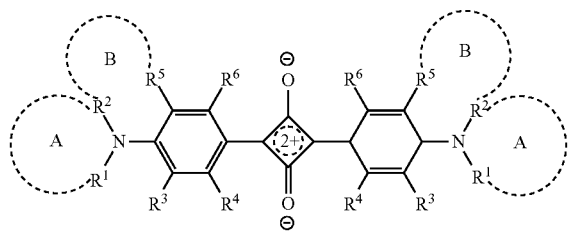

(F1-1)

Here, the symbols in the formula (F1-1) are the same as those defined in the foregoing formula (F1).

In the compound (F1), $R^1$ and $R^2$ are connected to each other to form a heterocyclic ring (ring A) of a 5-membered or 6-membered ring together with a nitrogen atom, which may contain an oxygen atom as a ring constituent atom, or $R^2$ and $R^5$ are connected to each other to form a heterocyclic ring (ring B) of a 5-membered or 6-membered ring together with a nitrogen atom, which may contain an oxygen atom as a ring constituent atom.

Each of $R^5$ in the case where $R^1$ and $R^2$ form the ring A and $R^1$ in the case where $R^2$ and $R^5$ form the ring B independently represents a hydrogen atom, a fluorine atom, a bromine atom, an alkyl group having from 1 to 6 carbon atoms which may have a substituent, an allyl group which may have a substituent, an aryl group having from 6 to 10 carbon atoms which may have a substituent, or an alaryl group having from 7 to 11 carbon atoms which may have a substituent. The alkyl group may be any of linear, branched or cyclic. Examples of the substituent include a fluorine atom, a bromine atom, an alkyl group having from 1 to 6 carbon atoms, a fluoroalkyl group having from 1 to 6 carbon atoms, an alkoxy group having from 1 to 6 carbon atoms, and the like.

Of these, from the viewpoint of solubility in the host solvent or the transparent resin (B), $R^1$ and $R^5$ are preferably an alkyl group having from 1 to 3 carbon atoms, and especially preferably a methyl group.

Each of $R^4$ and $R^6$ independently represents a hydrogen atom or $-NR^7R^8$ (each of $R^7$ and $R^8$ independently represents a hydrogen atom, an alkyl group having from 1 to 20 carbon atoms, or $-C(=O)-R^9$ ($R^9$ represents an alkyl group having from 1 to 20 carbon atoms or an optionally substituted aryl group having from 6 to 10 carbon atoms, which may have a substituent)). A combination in which either one of $R^4$ and $R^6$ is a hydrogen atom, with the other being $-NR^7R^8$, is preferable.

From the viewpoint of solubility in the host solvent or the transparent resin (B), $-NR^7R^8$ is preferably $-NH-C(=O)-R^9$. Examples of $R^9$ include an alkyl group having from 1 to 20 carbon atoms which may have a substituent and an aryl group having from 6 to 10 carbon atoms which may have a substituent. Examples of the substituent include a fluorine atom, an alkyl group having from 1 to 6 carbon atoms, a fluoroalkyl group having from 1 to 6 carbon atoms, an alkoxy group having from 1 to 6 carbon atoms, and the like. Of these, preferred is a group selected from an alkyl group having from 1 to 6 carbon atoms which may be substituted with a fluorine atom and a phenyl group which may be substituted with a fluoroalkyl group having from 1 to 6 carbon atoms and/or an alkoxy group having from 1 to 6 carbon atoms.

In addition, in the compound (F1), though the groups $R^1$ to $R^6$ which the benzene rings bound to the left and right sides of the squarylium skeleton have may be different from each other on the left and right sides, they are preferably identical with each other on the left and right sides.

Preferred examples of the compound (F1) include a compound represented by the following formula (F11) and a compound represented by the following formula (F12). Incidentally, the compound represented by the following formula (F11) is a compound described in U.S. Pat. No. 5,543,086.

[Chem. 5]

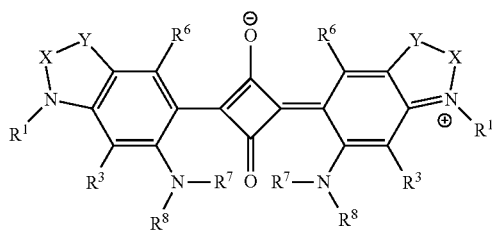

(F11)

Here, the symbols in the formula (F11) are as follows.

$R^1$, $R^3$, $R^6$, $R^7$, and $R^8$ are the same as those defined in the foregoing formula (F1), and preferred modes thereof are also the same. Incidentally, $-NR^7R^8$ is preferably $-NH-C(=O)-CH_3$, $-NH-C(=O)-C_6H_{13}$, $-NH-C(=O)-C_6H_5$, or the like.

Y represents $-CH_2-$ in which the hydrogen atom may be substituted with an alkyl group having from 1 to 3 carbon atoms; and X represents $-CH_2-$ or $-CH_2CH_2-$ in which the hydrogen atom may be substituted with an alkyl group having from 1 to 6 carbon atoms. Y is preferably $-CH_2-$ or $-C(CH_3)_2-$; and X is preferably $-CH_2-$, $-CH(CH_3)-$, or $-C(CH_3)_2-$.

[Chem. 6]

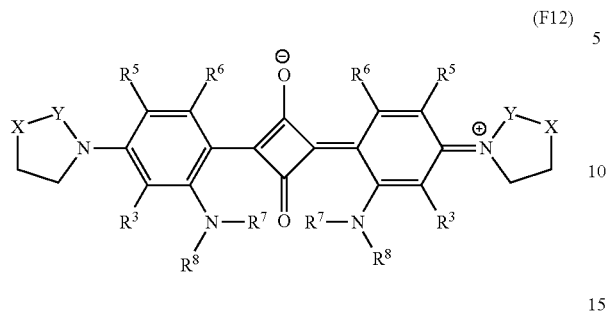

(F12)

Here, the symbols in the formula (F12) are as follows.

$R^3$, $R^5$, $R^6$, $R^7$, and $R^8$ are the same as those defined in the foregoing formula (F1), and preferred modes thereof are also the same. Incidentally, —$NR^7R^8$ is preferably —NH—C(=O)—$(CH_2)_m$—$CH_3$ (m is from 0 to 19), NH—C(=O)-Ph-$R^{10}$ ($R^{10}$ represents an alkyl group having from 1 to 3 carbon atoms, an alkoxy group having from 1 to 3 carbon atoms, or a perfluoroalkyl group having from 1 to 3 carbon atoms), or the like.

Y represents —$CH_2$— in which the hydrogen atom may be substituted with an alkyl group having from 1 to 3 carbon atoms; and X represents —$CH_2$— or —$CH_2CH_2$— in which the hydrogen atom may be substituted with an alkyl group having from 1 to 3 carbon atoms. Both of Y and X are preferably —$CH_2$— or —$C(CH_3)_2$—.

Here, the compound (F12) has a λmax of from 700 to 720 nm and is a preferred compound as the NIR absorbing dye (A1), which may allow the near infrared ray absorbing layer containing the same to have an amount of change D of transmittance of not more than −0.86. By allowing the λmax to fall within the foregoing range, it may be possible to widen a transmission region of the visible wavelength band.

Chemical structures and light absorption properties of specific examples of the compound (F11) and the compound (F12) are given below.

Specifically, examples of the compound (F11) include a compound represented by the following formula (F11-1).

[Chem. 7]

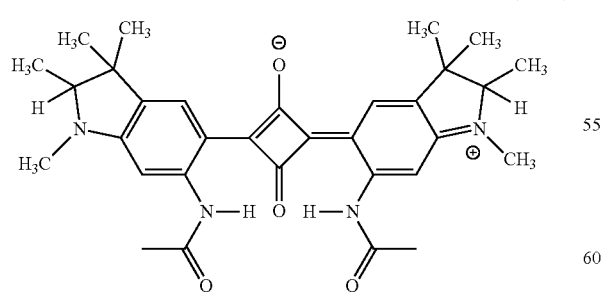

(F11-1)

In addition, specifically, examples of the compound (F12) include compounds represented by the following formula (F12-1), formula (F12-1), formula (F12-2), formula (F12-3), formula (F12-4), and formula (F12-5).

[Chem. 8]

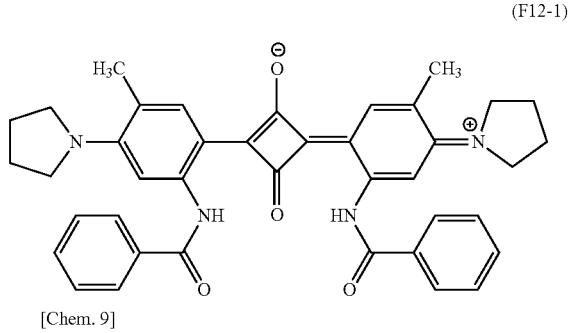

(F12-1)

[Chem. 9]

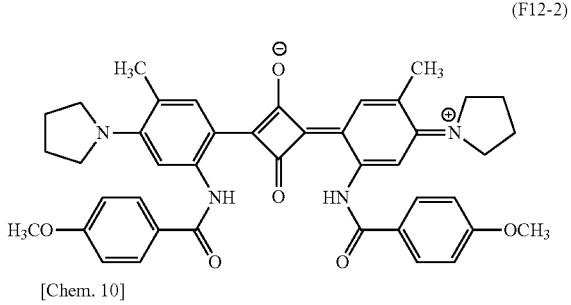

(F12-2)

[Chem. 10]

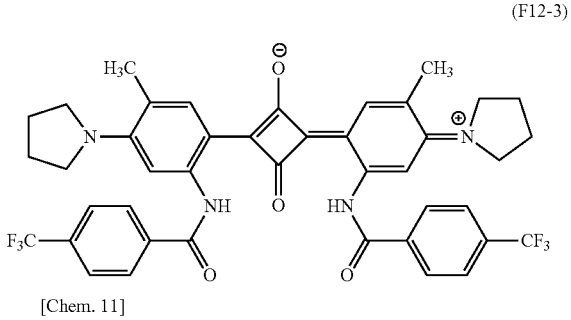

(F12-3)

[Chem. 11]

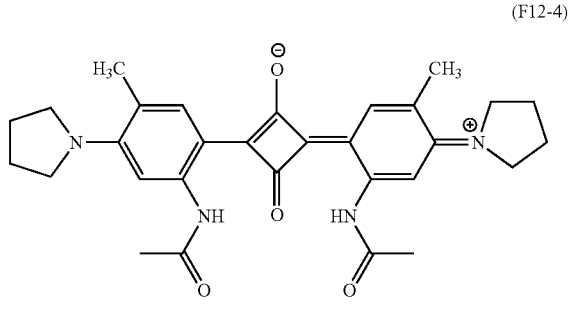

(F12-4)

[Chem. 12]

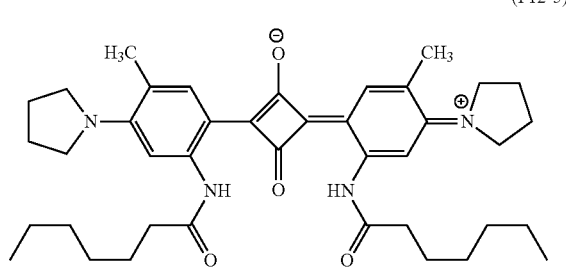

(F12-5)

Light absorption properties of the foregoing compound (F11-1) and compound (F12-1) to compound (F12-5) are shown in Table 1.

TABLE 1

| Compound code | Structural formula | Solvent for measuring absorbance | λmax | Full width at half maximum | Absorption spectrum inclination |
|---|---|---|---|---|---|
| F11-1 | F11-1 | Acetone | 695 | 35 | 0.0136 |
| F12-1 | F12-1 | Dichloromethane | 704 | 34 | 0.0127 |
| F12-2 | F12-2 | Dichloromethane | 705 | 35 | 0.0125 |
| F12-3 | F12-3 | Dichloromethane | 707 | 35 | 0.0123 |
| F12-4 | F12-4 | Dichloromethane | 700 | 34 | 0.0132 |
| F12-5 | F12-5 | Dichloromethane | 700 | 35 | 0.0133 |

Incidentally, the compound (F1) such as the foregoing compound (F11) and compound (F12), etc. may be manufactured by a conventionally known method.

The compound (F11) such as the compound (F11-1), etc. may be, for example, manufactured by a method described in U.S. Pat. No. 5,543,086 which is herein cited by reference.

In addition, the compound (F12) may be, for example, manufactured by a method described in J. Org. Chem., 2005, 70(13), 5164-5173 which is herein cited by reference.

Of these, the compound (F12-1) to compound (12-5) may be, for example, manufactured according to a synthesis route represented by the following reaction scheme (F3).

According to the reaction scheme (F3), an amino group of 1-methyl-2-iodo-4-aminobenzene is allowed to react with a carboxylic acid chloride having a desired substituent $R^9$ to form an amide. Subsequently, the resultant is allowed to react with pyrrolidine, and further allowed to react with 3,4-dihydroxy-3-cyclobutene-1,2-dione. There are thus obtained the compound (F12-1) to compound (12-5).

[Chem. 13]

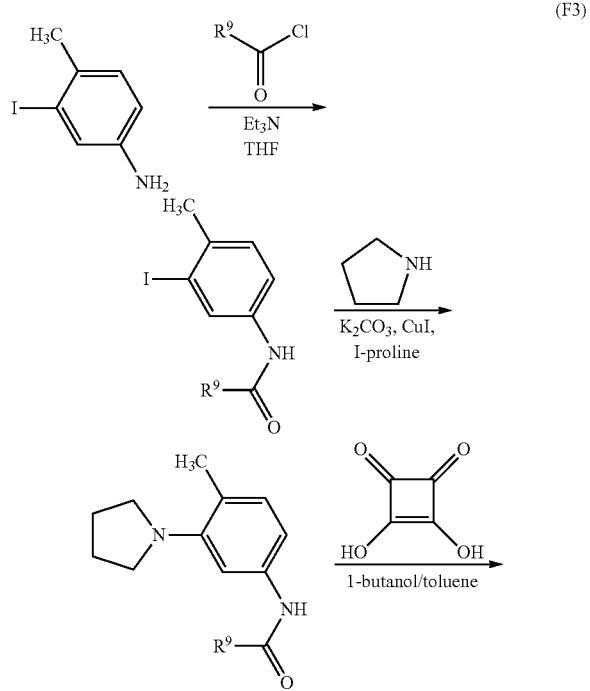

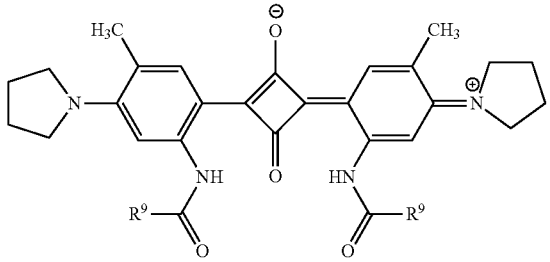

In the reaction formula (F3), $R^9$ represents —$CH_3$, —$(CH_2)_5$—$CH_3$, -Ph, -Ph-$OCH_3$, or Ph-$CF_3$. -Ph represents a phenyl group, and -Ph- represents a 1,4-phenylene group. Et represents an ethyl group, and THF represents tetrahydrofuran.

In the present embodiment, as the NIR absorbing dye (A1), one member selected from plural compounds having light absorption properties as the above-described NIR absorbing dye (A1) may be used solely, or two or more kinds thereof may be used jointly.

(NIR Absorbing Dye (A2))

The NIR absorbing dye (A2) is not particularly limited so long as it is a compound having the above-described light absorption properties, specifically having a maximum absorption peak such that in an absorption spectrum thereof, the λmax(A2) is present in a wavelength region of more than 720 nm and not more than 800 nm, and the full width at half maximum is not more than 100 nm. A compound having the above-described light absorption properties may be properly selected and used among those which are generally used as an NIR absorbing dye, such as cyanine compounds, phthalocyanine compounds, naphthalocyanine compounds, dithiol metal complex compounds, diimonium compounds, polymethine compounds, phthalide compounds, naphthoquinone compounds, anthraquinone compounds, indophenol compounds, squarylium compounds, etc.

The NIR absorbing dye (A2) is preferably a compound which may ensure the absorption of light on the side of a relatively long wavelength of the near infrared wavelength band widely as far as possible within the range where the absorption properties of light of the NIR absorbing dye (A1) in the boundary region between the visible wavelength band and the near infrared wavelength band are not hindered as described above. From such a viewpoint, the NIR absorbing dye (A2) is preferably a cyanine compound in which light absorption properties required for the above-described NIR absorbing dye (A2) are imparted by adjusting the chemical structure. The cyanine compound is a dye which has been used as a recording dye of CD-R or the like for a long time and is low in cost, and also, it is known to be able to ensure long-term stability through salt formation.

Specifically, examples of the cyanine compound which can be used as the NIR absorbing dye (A2) include a compound represented by the following general formula (F2).

[Chem. 14]

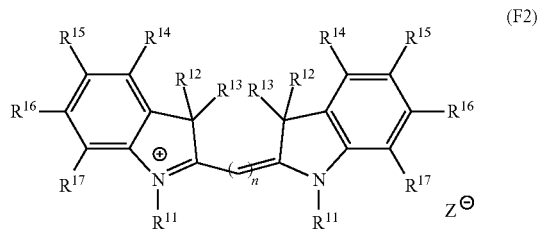

(F2)

Here, the symbols in the formula (F2) are as follows.

Each $R^{11}$ independently represents an alkyl group having from 1 to 20 carbon atoms, an alkoxy group, an alkylsulfone group, or an anion species thereof.

Each of $R^{12}$ and $R^{13}$ independently represents a hydrogen atom or an alkyl group having from 1 to 20 carbon atoms.

Z represents $PF_6$, $ClO_4$, $R^1$—$SO_2$, $(R^f$—$SO_2)_2$—$N(R^f$ represents an alkyl group substituted with at least one fluorine atom), or $BF_4$.

Each of $R^{14}$, $R^{15}$, $R^{16}$, and $R^{17}$ independently represents a hydrogen atom, a halogen atom, or an alkyl group having from 1 to 6 carbon atoms.

n represents an integer of from 1 to 6.

Incidentally, in the compound (F2), $R^{11}$ is preferably an alkyl group having from 1 to 20 carbon atoms; and each of $R^{12}$ and $R^{13}$ is independently preferably a hydrogen atom or an alkyl group having from 1 to 6 carbon atoms. Each of $R^{14}$, $R^{15}$, $R^{16}$, and $R^{17}$ is independently preferably a hydrogen atom; and n is preferably an integer of from 1 to 4. Though the left and right structures interposing the repeating unit(s) in the number of n may be different from each other, they are preferably identical with each other.

More specifically, examples of the compound (F2) include a compound represented by the following formula (F21), a compound represented by the following formula (F22), and the like.

[Chem. 15]

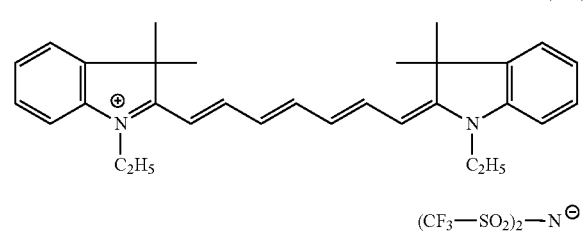

(F21)

[Chem. 16]

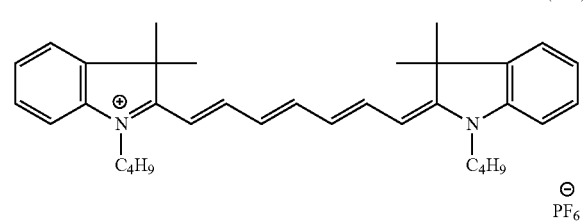

(F22)

In addition, a squarylium compound represented by the following formula (F4) can also be used as the NIR absorbing dye (A2).

[Chem. 17]

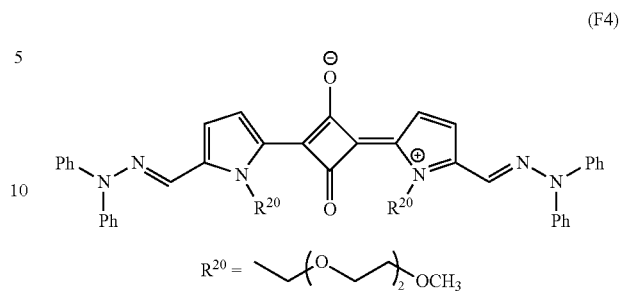

(F4)

Light absorption properties of the compound (F21), the compound (F22), and the compound (F4) which are preferably used as the above-described NIR absorbing dye (A2) are shown in Table 2.

TABLE 2

| Compound code | Structural formula | Solvent for measuring absorbance | λmax | Full width at half maximum | Absorption spectrum inclination |
|---|---|---|---|---|---|
| F21 | F21 | Cyclohexanone | 740 | 52 | 0.0082 |
| F22 | F22 | Methanol | 747 | 52 | 0.0082 |
| F4 | F4 | Dichloromethane | 729 | 57 | 0.0094 |

Incidentally, the foregoing compound (F21), compound (F22) and compound (F4) can be manufactured by a conventionally known method. In the present embodiment, as the NIR absorbing dye (A2), one member selected from plural compounds having light absorption properties as the above-described NIR absorbing dye (A2) may be used solely, or two or more kinds thereof may be used jointly.

(NIR Absorbing Dye (A))

The NIR absorbing dye (A) used in the present embodiment contains the NIR absorbing dye (A1) as an essential component, and preferably, further contains the NIR absorbing dye (A2).

Though the content of the NIR absorbing dye (A1) in the NIR absorbing dye (A) varies depending upon the kind of the NIR absorbing dye (A) other than the NIR absorbing dye (A1), which the NIR absorbing dye (A) contains, for example, the NIR absorbing dye (A2) or the like, it is preferably in the range of from 3 to 100% by mass, more preferably in the range of from 30 to 100% by mass, and especially preferably in the range of from 50 to 100% by mass relative to the whole amount of the NIR absorbing dye (A). In the NIR absorbing dye (A), by allowing the content of the NIR absorbing dye (A1) to fall within the foregoing range, it may be possible to impart properties of making the inclination of an absorption curve of light in the boundary region between the visible wavelength band and the near infrared wavelength band steep, specifically properties of regulating the amount of change D of transmittance to not more than −0.8.

In addition, the content of the NIR absorbing dye (A2) in the NIR absorbing dye (A) is in the range of preferably from 0 to 97% by mass, more preferably from 0 to 70% by mass, and especially preferably from 0 to 50% by mass relative to the whole amount of the NIR absorbing dye (A).

By allowing the content of the NIR absorbing dye (A2) to fall within the foregoing range, it may be possible to impart properties of sufficiently absorbing light to an extent of a long wavelength side of the near infrared wavelength band to the near infrared ray absorbing layer containing the NIR absorbing dye (A) without hindering the above-described effects to be brought due to the NIR absorbing dye (A1).

The NIR absorbing dye (A) contains one or two or more kinds of the NIR absorbing dye (A1), and preferably, further contains, in addition to this, one or two or more kinds of the NIR absorbing dye (A2). Incidentally, the NIR absorbing dye (A) may contain other NIR absorbing dye (A) as the need arises, so long as the above-described effects to be brought due to the NIR absorbing dye (A1) and the NIR absorbing dye (A2) are not hindered.

Here, in the present embodiment, for the purpose of imparting properties of making the inclination of an absorption curve of light in the boundary region between the visible wavelength band and the near infrared wavelength band steep and properties of sufficiently absorbing light to an extent of a long wavelength side of the near infrared wavelength band to the near infrared ray absorbing layer, as described above, it is preferable to use a plurality of the NIR absorbing dyes (A) containing the NIR absorbing dye (A1), as the NIR absorbing dye (A). In the case of using a plurality of the NIR absorbing dyes (A), though the number thereof is not limited, it is preferably from 2 to 4. It is preferable that the plural NIR absorbing dyes (A) are close to each other in terms of compatibility.

Furthermore, with respect to the λmax of the plural NIR absorbing dyes (A) used, a relation between the NIR absorbing dye (A) having a λmax on the longest wavelength side and the NIR absorbing dye (A) having a λmax on the shortest wavelength side preferably satisfies the following relation in view of necessity of suppressing the leakage of absorbed light.

When among the NIR absorbing dyes (A), the NIR absorbing dye (A) having a λmax on the longest wavelength side is defined as an NIR absorbing dye (Ay), with the λmax thereof being defined as a λmax(Ay), and among the NIR absorbing dyes (A), the NIR absorbing dye (A) having a λmax on the shortest wavelength side is defined as an NIR absorbing dye (Ax), with the λmax thereof being defined as a λmax(Ax), it is preferable that a relation of [10 nm≤{λmax(Ay)−λmax(Ax)}≤40 nm] is satisfied.

Incidentally, the NIR absorbing dye (Ax) is selected from the NIR absorbing dye (A1). Though the NIR absorbing dye (Ay) may be selected from the NIR absorbing dye (A1), it is preferably selected from the NIR absorbing dye (A2). In the case where the NIR absorbing dye (Ay) is selected from the NIR absorbing dye (A2), for example, by using the NIR absorbing dye (A2) having an absorption spectrum inclination of from 0.007 to 0.011 and a full width at half maximum of from 30 to 100 nm, it becomes possible to have high transmitting properties in a visible wavelength band while ensuring a wide absorption band in a near infrared wavelength band, and hence, such is preferable.

In the present invention, by using the above-described NIR absorbing dye (A) upon being dispersed in the following transparent resin (B), in the obtained NIR absorbing dye (A)-containing resin layer, namely in the near infrared ray absorbing layer, it was made possible to widen the shielding region from the peak wavelength of the maximum absorption peak of the NIR absorbing dye (A) to the long wavelength region while keeping the optical properties such that the absorption curve changes steeply in a wavelength range of from 630 to 700 nm which is important in an optical filter, particularly a near infrared ray cut filter. Specifically, as for the optical properties of the near infrared ray absorbing layer in such present embodiment, the transmittance of visible light of from 450 to 600 nm is 70% or more, the transmittance of light in a wavelength region of from 695 to 720 nm is not more than 10%, and the amount of change D of transmittance expressed by the foregoing equation (1) is not more than −0.8.

The near infrared ray absorbing layer which the optical filter according to the present embodiment has contains the above-described NIR absorbing dye (A) dispersed in a transparent resin (B) having a refractive index of 1.54 or more. The refractive index of the transparent resin (B) is preferably 1.55 or more, and more preferably 1.56 or more. Though there is no particular upper limit of the refractive index of the transparent resin (B), about 1.72 is exemplified from the standpoint of easiness of availability or the like.

The transparent resin (B) is not particularly limited so long as it is a transparent resin having a refractive index of 1.54 or more. Specifically, among thermoplastic resins such as a polyester resin, an acrylic resin, a polyolefin resin, a polycarbonate resin, a polyamide resin, an alkyd resin, etc., and among resins which can be cured by heat or light, such as an ene/thiol resin, an epoxy resin, a thermosetting acrylic resin, a photosetting acrylic resin, a silicone resin, a silsesquioxane resin, etc., the transparent resin (B) having a refractive index of 1.54 or more is used.

Of these, from the standpoint of transparency, an acrylic resin, a polyester resin, a polycarbonate resin, an ene/thiol resin, an epoxy resin, or the like, each having a refractive index of 1.54 or more, is preferably used; and an acrylic resin, a polyester resin, or a polycarbonate resin, each having a refractive index of 1.54 or more, is more preferably used. So long as the refractive index of the transparent resin is 1.54 or more, the above-described resins may be mixed and used, or an alloyed resin thereof may also be used.

As the transparent resin (B), a resin whose refractive index has been adjusted within the foregoing range by a conventionally known method such as introduction of a specified structure into a main chain or side chain of a polymer by adjusting a molecular structure of the raw material component or the like on the occasion of manufacturing a transparent resin as classified above, etc. is used.

A commercially available product may also be used as the transparent resin (B). As for the commercially available product, examples of the acrylic resin include resins obtained by curing OGSOL EA-F5503 (a trade name, manufactured by Osaka Gas Chemicals Co., Ltd., refractive index: 1.60) or OGSOL EA-F5003 (a trade name, manufactured by Osaka Gas Chemicals Co., Ltd., refractive index: 1.60), and the like. In addition, examples of the polyester resin include OKPH4HT (a trade name, manufactured by Osaka Gas Chemicals Co., Ltd., refractive index: 1.64), OKPH4 (a trade name, manufactured by Osaka Gas Chemicals Co., Ltd., refractive index: 1.61), B-OKP2 (a trade name, manufactured by Osaka Gas Chemicals Co., Ltd., refractive index: 1.64), and VYLON 103 (a trade name, manufactured by Toyobo Co., Ltd., refractive index: 1.55); examples of the polycarbonate resin include LeXan ML9103 (a trade name, manufactured by Sabic, refractive index: 1.59); and examples of the polymer alloy include PANLITE AM-8 Series (a trade name, manufactured by Teijin Chemicals Ltd.) and Xylex 7507 (a trade name, manufactured by Sabic), both of which are an alloy of a polycarbonate and a polyester.

In the transparent resin (B), the structure introduced for the purpose of regulating the refractive index to 1.54 or more is not particularly limited so long as it is a structure which may allow the refractive index to fall within the foregoing range. For example, a polyester resin into which a fluorene derivative represented by the following formula (B1) is introduced as an aromatic diol may be suitably used as the polyester resin from the standpoints of the refractive index value and the transparency in a visible light region.

[Chem. 18]

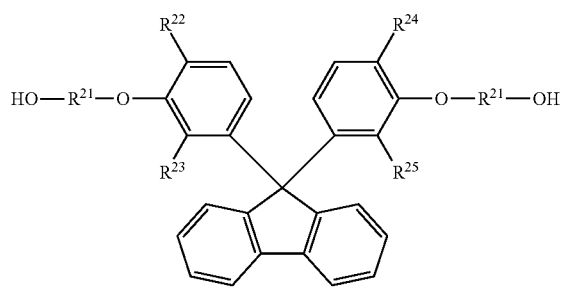

(B1)

(Here, in the formula (B1), $R^{21}$ represents an alkylene group having from 2 to 4 carbon atoms; and each of $R^{22}$, $R^{23}$, $R^{24}$, and $R^{25}$ independently represents a hydrogen atom, an alkyl group having from 1 to 7 carbon atoms, or an aryl group having from 6 to 7 carbon atoms.)

The content of the NIR absorbing dye (A) in the near infrared ray absorbing layer is preferably a proportion of from 0.05 to 5 parts by mass, and more preferably a proportion of from 0.05 to 3 parts by mass based on 100 parts by mass of the transparent resin (B). When the content of the NIR absorbing dye (A) is 0.05 parts by mass or more based on 100 parts by mass of the transparent resin (B), the sufficient near infrared absorption properties may be kept. When it is not more than 5 parts by mass, the sufficient near infrared absorption properties may be kept without impairing the transmittance in a visible region.

The optical filter of the present embodiment includes the above-described near infrared ray absorbing layer. The near infrared ray absorbing layer may be, for example, manufactured by using a base material in the following manner. A material obtained by using a releasable base material, molding a near infrared ray absorbing layer on the base material, and then releasing this from the base material to form into a form of a film may be used as the optical filter. In addition, a material obtained by using, as the base material, a transparent base material which may be applied to an optical filter and molding a near infrared ray absorbing layer on the transparent base material may be used as the optical filter.

In order to form a near infrared ray absorbing layer on a base material, first of all, the NIR absorbing dye (A) and the transparent resin (B) or the raw material component of the transparent resin (B) and other component blended as the need arises are dispersed or dissolved in a solvent to prepare a coating liquid.

Examples of the other component blended as the need arises include a near infrared ray or infrared ray absorber, a color tone correcting dye, an ultraviolet ray absorber, a leveling agent, an antistatic agent, a heat stabilizer, a photostabilizer, an antioxidant, a dispersant, a flame retarder, a lubricant, a plasticizer, a silane coupling agent, a heat or photopolymerization initiator, a polymerization catalyst, and the like, each of which is blended within the range where the effects of the present invention are not hindered. Such an arbitrary component is preferably blended in an amount of not more than 15 parts by mass based on 100 parts by mass of the transparent resin (B) or the raw material component of the transparent resin (B) in the coating liquid, respectively. Incidentally, in the present description, the terms "near infrared ray or infrared ray absorber" are used on the assumption that a near infrared ray absorbing dye is not included.

As for the above-described near infrared ray or infrared ray absorber, examples of inorganic fine particles include ITO (indium tin oxides), ATO (antimony-doped tin oxides), lanthanum boride, and the like. Above all, an ITO fine particle is especially preferable in the case where shielding properties of light in an infrared wavelength region is required because it has a high transmittance of light in a visible wavelength region and also has light absorption properties in a wide range including even an infrared wavelength region of more than 1,200 nm.

From the standpoints of suppressing the scattering and keeping the transparency, a number average aggregate particle diameter of the ITO fine particle is preferably from 5 to 200 nm, more preferably from 5 to 100 nm, and much more preferably from 5 to 70 nm. Here, the number average aggregate particle diameter as referred to in the present description means a value measured with respect to a dispersion liquid for particle diameter measurement having a specimen fine particle dispersed in a dispersion medium such as water, an alcohol, etc. by using a dynamic light scattering particle size distribution analyzer.

The near infrared ray or infrared ray absorber may be blended in a proportion of preferably from 0.1 to 20 parts by mass, and more preferably from 0.3 to 10 parts by mass based on 100 parts by mass of the transparent resin (B) or the raw material component of the transparent resin (B) in terms of a range of the amount at which the near infrared ray or infrared ray absorber may exhibit its function while ensuring other physical properties required for the near infrared ray absorbing layer.

Preferred examples of the ultraviolet ray absorber include a benzotriazole-based ultraviolet ray absorber, a benzophenone-based ultraviolet ray absorber, a salicylate-based ultraviolet ray absorber, a cyanoacrylate-based ultraviolet ray absorber, a triazine-based ultraviolet ray absorber, an oxanilide-based ultraviolet ray absorber, a nickel complex salt-based ultraviolet ray absorber, an inorganic ultraviolet ray absorber, and the like. Examples of a commercially available product thereof include a trade name "TINUVIN 479", manufactured by Ciba, and the like.

Examples of the inorganic ultraviolet ray absorber include particles of, for example, zinc oxide, titanium oxide, cerium oxide, zirconium oxide, mica, kaolin, sericite, etc. From the standpoint of transparency, a number average aggregate particle diameter of the inorganic ultraviolet ray absorber is preferably from 5 to 200 nm, more preferably from 5 to 100 nm, and much more preferably from 5 to 70 nm.

The ultraviolet ray absorber may be blended in a proportion of preferably from 0.01 to 10 parts by mass, and more preferably from 0.05 to 5 parts by mass based on 100 parts by mass of the transparent resin (B) or the raw material component of the transparent resin (B) in terms of a range of the amount at which the ultraviolet ray absorber may exhibit its function while ensuring other physical properties required for the near infrared ray absorbing layer.

Examples of the photostabilizer include hindered amines; and nickel complexs such as nickel bis(octylphenyl) sulfide, nickel complex-3,5-di-tert-butyl-4-hydroxybenzyl phosphoric acid monoethylate, nickel dibutyl dithiocarbamate, etc. They may also be used in combination of two or more kinds thereof. The content of the photostabilizer in the coating liquid is preferably from 0.01 to 10 parts by mass, and especially preferably from 0.5 to 5 parts by mass based on 100 parts by mass of the transparent resin (B) or the raw material component of the transparent resin (B).

Examples of the silane coupling agent include aminosilanes such as γ-aminopropyltriethoxysilane, N-β-(aminoethyl)-γ-aminopropyltrimethoxysilane, N-β-(aminoethyl)-N'-β-(aminoethyl)-γ-aminopropyltriethoxysilane, and γ-anilinopropyltrimethoxysilane, epoxysilanes such as γ-glycidoxypropyltrimethoxysilane and β-(3,4-epoxycyclohexyl)ethyltrimethoxysilane, vinylsilanes such as vinyltrimethoxysilane and N-β-(N-vinylbenzylaminoethyl)-γ-aminopropyltrimethoxysilane, γ-methacryloxypropyltrimethoxysilane, γ-chloropropyltrimethoxysilane, γ-mercaptopropyltrimethoxysilane, and the like.

The kind of the silane coupling agent used may be properly selected depending upon the transparent resin (B) used in combination. The content of the silane coupling agent in the coating liquid is preferably from 1 to 20 parts by mass, and especially preferably from 5 to 15 parts by mass based on 100 parts by mass of the transparent resin (B) or the raw material component of the transparent resin (B).

Examples of the photopolymerization initiator include acetophenones, benzophenones, benzoins, benzils, Michler's ketones, benzoin alkyl ethers, benzyl dimethyl ketals, thioxanthones, and the like. In addition, examples of the heat polymerization initiator include azobis-based or peroxide-based polymerization initiators. They may also be used in combination of two or more kinds thereof. The content of the photo- or heat polymerization initiator in the coating liquid is preferably from 0.01 to 10 parts by mass, and especially preferably from 0.5 to 5 parts by mass based on 100 parts by mass of the transparent resin (B) or the raw material component of the transparent resin (B).

The solvent which the coating liquid contains is not particularly limited so long as it is a solvent capable of stably dispersing or dissolving the NIR absorbing dye (A) and the transparent resin (B) or the raw material component of the transparent resin (B) therein. Specifically, examples thereof include ketones such as acetone, methyl ethyl ketone, methyl isobutyl ketone, cyclopentanone, cyclohexanone, etc.; ethers such as tetrahydrofuran, 1,4-dioxane, 1,2-dimethoxyethane, etc.; esters such as ethyl acetate, butyl acetate, methoxyethyl acetate, etc.; alcohols such as methanol, ethanol, 1-propanol, 2-propanol, 1-butanol, 2-butanol, 2-methyl-1-propanol, 2-methoxyethanol, 4-methyl-2-pentanol, 2-butoxyethanol, 1-methoxy-2-propanol, diacetone alcohol, etc.; hydrocarbons such as n-hexane, n-heptane, isooctane, benzene, toluene, xylene, gasoline, light oil, kerosene, etc.; acetonitrile, nitromethane, water, and the like. They may also be used in combination of two or more kinds thereof.

The amount of the solvent is preferably from 10 to 5,000 parts by mass, and especially preferably from 30 to 2,000 parts by mass based on 100 parts by mass of the transparent resin (B) or the raw material component of the transparent resin (B). Incidentally, the content of a non-volatile component (solid content) in the coating liquid is preferably from 2 to 50% by mass, and especially preferably from 5 to 40% by mass relative to the whole amount of the coating liquid.

For the preparation of the coating liquid, a stirring device such as a magnetic stirrer, a rotation/revolution-type mixer, a bead mill, a planetary mill, an ultrasonic homogenizer, etc. may be used. In order to ensure the high transparency, it is preferable to conduct the stirring sufficiently. The stirring may be conducted either continuously or intermittently.

For coating of the coating liquid, a coating method such as a dip coating method, a cast coating method, a spray coating method, a spinner coating method, a bead coating method, a wire bar coating method, a blade coating method, a roller coating method, a curtain coating method, a slit die coater method, a gravure coater method, a slit reverse coater method, a micro gravure method, an inkjet method, a comma coater method, etc. may be adopted. Besides, a bar coater method, a screen printing method, a flexo printing method, or the like may also be adopted.

A releasable supporting base material on which the coating liquid is coated may be in the form of a film or a plate, and its material is not particularly limited so long as it is releasable. Specifically, a glass plate; a release-treated plastic film, for example, a film made of, e.g., a polyester resin such as polyethylene terephthalate (PET), polybutylene terephthalate (PBT), etc., a polyolefin resin such as polyethylene, polypropylene, an ethylene/vinyl acetate copolymer, etc., an acrylic resin such as polyacrylate, polymethyl methacrylate, etc., a urethane resin, a vinyl chloride resin, a fluorine resin, a polycarbonate resin, a polyvinyl butyral resin, a polyvinyl alcohol resin, etc.; a stainless steel plate; and the like may be used.

In addition, examples of the transparent base material used for the optical filter as it is, together with the near infrared ray absorbing layer obtained by coating the coating liquid, include a transparent base material as described later.

By coating the above-described coating liquid on such a base material and then drying, the near infrared ray absorbing layer is formed on the base material. In the case where the coating liquid contains the raw material component of the transparent resin (B), a curing treatment is further conducted. Though in the case where the reaction is heat curing, drying and curing may be simultaneously conducted, in the case of photo-curing, the curing treatment is provided separately from drying. In addition, the near infrared ray absorbing layer formed on the releasable supporting base material is released and used for manufacture of an optical filter.

The near infrared ray absorbing layer according to the optical filter of the present embodiment may also be manufactured by means of extrusion molding depending upon the kind of the transparent resin (B), and furthermore, a plurality of the films thus manufactured may be stacked and integrated with each other by means of thermo compression bonding or the like.

In the present embodiment, a thickness of the near infrared ray absorbing layer is not particularly limited, and it may be properly defined depending upon an application, namely a disposition space within the used device or required absorption properties or the like. It is preferably in the range of from 0.1 to 100 μm, and more preferably in the range of from 1 to 50 μm. By setting within the foregoing range, both sufficient near infrared ray absorbing ability and flatness in film thickness may be made compatible with each other. By setting 0.1 μm or more or furthermore 1 μm or more, the near infrared ray absorbing ability may be sufficiently revealed. When it is not more than 100 μm, the flatness in film thickness is easily obtainable, and a scattering in absorptivity may be made to be hardly generated. When it is not more than 50 μm, it becomes advantageous for achieving more downsizing of the device.

The near infrared ray absorbing layer used in the present embodiment has a transmittance of visible light of from 450 to 600 nm of 70% or more, a transmittance of light in a wavelength region of from 695 to 720 nm of not more than 10%, and an amount of change D of transmittance expressed by the following equation (1) of not more than −0.8

$$D(\%/nm) = [T_{700}(\%) - T_{630}(\%)]/[700(nm) - 630(nm)] \quad (1)$$

In the equation (1), $T_{700}$ is a transmittance at a wavelength of 700 nm in a transmission spectrum of the above-described near infrared ray absorbing layer; and $T_{630}$ is a transmittance at a wavelength of 630 nm in the transmission spectrum of the above-described near infrared ray absorbing layer.

Incidentally, the transmittance of the near infrared ray absorbing layer can be measured by using an ultraviolet-visible spectrophotometer.

In the near infrared ray absorbing layer, the transmittance of visible light of from 450 to 600 nm is 70% or more, and preferably 80% or more. In addition, the transmittance of light in a wavelength region of from 695 to 720 nm is not more than 10%, and preferably not more than 8%. Furthermore, the amount of change D of transmittance is not more than −0.8, and preferably not more than −0.86.

So long as the transmittance of visible light in a visible light wavelength region of from 450 to 600 nm is 70% or more, preferably 80% or more and the transmittance of light in a wavelength region of from 695 to 720 nm is not more than 10%, preferably not more than 8%, it is useful for an application as a near infrared ray cut filter. In addition, so far as the amount of change D of transmittance is not more than −0.8, preferably not more than −0.86, the change of transmittance in a wavelength range of from 630 to 700 nm becomes sufficiently steep, so that it is suitable for a near infrared ray absorbing material of, for example, a digital still camera, a digital video camera, etc. Furthermore, so long as the amount of change D of transmittance is not more than −0.8, preferably not more than −0.86, the utilization efficiency of light in a visible wavelength region is enhanced while shielding light in a near infrared wavelength region, so that such is advantageous from the standpoint of suppressing a noise in imaging of a dark portion.

The near infrared ray absorbing layer according to the optical filter of the present embodiment has such properties that the transmittance of light in a visible wavelength region (represented by the transmittance at 630 nm) is high and the transmittance changes steeply in a wavelength range of from 630 to 700 nm due to optical properties of the NIR absorbing dye (A1) contained as the NIR absorbing dye (A), for example, the compound shown in Table 1, and further has such properties that due to an action of the transparent resin (B) combined therewith, which has a refractive index of 1.54 or more, its light shielding wavelength region is wide as from 695 to 720 nm as compared with a conventional near infrared ray absorbing layer. Accordingly, by using the near infrared ray absorbing layer per se solely or in combination with other selective wavelength shielding layer or the like, an optical filter in which the light absorption properties of the NIR absorbing dye (A) are effectively utilized is obtainable.

In addition, near infrared ray shielding properties thereof utilize the absorption of a near infrared ray by the NIR absorbing dye (A), and therefore, there is not generated a problem of incident angle dependence of spectral transmittance as in a reflection type filter.

Furthermore, since the near infrared ray absorbing layer according to the optical filter of the present embodiment can be manufactured by coating a coating liquid prepared by dispersing or dissolving the NIR absorbing dye (A) and the transparent resin (B) in a solvent on a base material and drying, followed by further curing, if desired, downsizing and slimming of the optical film may be achieved easily and sufficiently.

The optical filter of the present embodiment contains the above-described near infrared ray absorbing layer. The configuration of the optical filter is not particularly limited so far as it contains the near infrared ray absorbing layer, and the near infrared ray absorbing layer per se may solely configure the optical filter, or it may configure the optical filter together with other configuration element. Examples of the other configuration element include, in addition to the above-described transparent base material, a selective wavelength shielding layer that controls transmission and shielding of light in a specified wavelength region.

The selective wavelength shielding layer is preferably a selective wavelength shielding layer that transmits visible light of from 420 to 695 nm therethrough and shields light in a specified wavelength region. For example, in the case where the optical filter is used as a near infrared ray cut filter for solid-state imaging element, the wavelength region of light which the selective wavelength shielding layer shields is preferably from 710 to 1,100 nm, and more preferably from 710 to 1,200 nm. Incidentally, a lower limit of the wavelength region of light which the selective wavelength shielding layer shields may be properly changed depending upon the light absorption properties of the dye which the near infrared ray absorbing layer to be combined contains. For example, in the case where the NIR absorbing dye (A1) in which the λmax at the maximum absorption peak of the absorption spectrum thereof is present in a region of from 700 to 720 nm is used as the NIR absorbing dye (A1), a lower limit of the wavelength region of light which the selective wavelength shielding layer combined with the near infrared ray absorbing layer containing this dye shields may be 720 nm. Similar to the foregoing, an upper limit thereof is preferably 1,100 nm, and more preferably 1,200 nm. Incidentally, in the following, a lower limit of the wavelength region of light which the selective wavelength shielding layer combined with the near infrared ray absorbing layer containing the NIR absorbing dye (A1) shields may be properly adjusted in conformity with the NIR absorbing dye (A1) used, similarly to the foregoing.

Furthermore, the selective wavelength shielding layer preferably has optical properties of shielding light in an ultraviolet ray wavelength region of not more than 400 nm, and more preferably has shielding properties of light of not more than 410 nm. The selective wavelength shielding layer may be made to shield light in a prescribed wavelength region by a single layer thereof, or may also be made to shield light in a prescribed wavelength region by a combination of plural layers thereof. In the present embodiment, it may be possible to prepare an optical filter that shields a specified wavelength region with high performance by light absorption properties of the above-described near infrared ray absorbing layer and optical properties of the selective wavelength shielding layer combined.

In this way, in the case where the optical filter of the present embodiment contains a selective wavelength shielding layer that transmits visible light of from 420 to 695 nm therethrough and shields light in a prescribed wavelength region, for example, a light in a wavelength region of from 710 to 1,100 nm, specifically, the optical properties which the optical filter has are preferably the following optical properties.

The transmittance of visible light of from 420 to 620 nm is preferably 70% or more, and more preferably 75% or more. In addition, the transmittance of light in a wavelength region of from 710 to 860 nm is preferably not more than 0.3%. Furthermore, an amount of change Df of transmittance expressed by the following equation (2) is preferably not more than −0.8, and more preferably not more than −0.86.

$$Df(\%/nm)=[Tf_{700}(\%)-Tf_{630}(\%)]/[700(nm)-630(nm)] \qquad (2)$$

In the equation (2), $Tf_{700}$ is a transmittance at a wavelength of 700 nm in a transmission spectrum of the above-described optical filter; and $Tf_{630}$ is a transmittance at a wavelength of 630 nm in the transmission spectrum of the above-described optical filter.

The optical filter of the present embodiment having the above-described optical properties is an optical filter in which the change of transmittance in a wavelength range of from 630 to 700 nm is sufficiently steep, and the utilization efficiency of light in a visible wavelength region is enhanced while shielding light in a near infrared wavelength region. Such an optical filter is suitable as a near infrared ray absorbing filter of, for example, a digital still camera, a digital video camera, etc., so that such is advantageous from the standpoint of suppressing a noise in imaging of a dark portion.

The selective wavelength shielding layer is disposed on one side or both sides of the above-described near infrared ray absorbing layer depending upon an application of the optical filter. The number of the disposed selective wavelength shield layer is not limited. One or more selective wavelength shielding layers may be disposed on only one side, or one or more selective wavelength shielding layers may be disposed in the independent number, respectively on the both sides, depending upon an application. The stacking order of respective configuration elements of the optical filter including the transparent base material is not particularly limited, and it is properly set up depending upon an application for which the optical filter is used.

In addition, in order to increase the utilization efficiency of light, a configuration for reducing the surface reflection as in a moth eye structure may also be provided. The moth eye structure is, for example, a structure in which a regular protrusion arrangement with a period of smaller than 400 nm is formed, and an effective refractive index continuously changes in the thickness direction, so that the surface reflectance of light having a longer wavelength than the period is suppressed. And it can be formed on the surface of the optical filter by means of mold forming or the like.

FIG. 1 is a cross-sectional view showing diagrammatically an example of an optical filter according to the present embodiment. FIG. 1(a) shows a cross-sectional view of an optical filter 10A having a near infrared ray absorbing layer 11 on a transparent base material 12. In addition, FIG. 1(b) shows a cross-sectional view of an optical filter 10B in which a selective wavelength shielding layer 13 is disposed on the both principal surfaces of a near infrared ray absorbing layer 11.

Examples of the configuration shown in FIG. 1(a), namely the configuration having the near infrared ray absorbing layer 11 on the transparent base material 12, include a method in which the near infrared ray absorbing layer 11 is formed directly on the transparent base material 12 as described above; and a method in which a single body of the near infrared ray absorbing layer 11 in a form of a film as obtained above is stuck on either one principal surface of a transparent base material in a form of a film or a plate via a non-illustrated adhesive layer. In addition, examples of a modification of the configuration having the near infrared ray absorbing layer 11 on the transparent base material 12 in the optical filter according to the present embodiment include a configuration in which the near infrared ray absorbing layer 11 is sandwiched by two sheets of the transparent base material 12; and a configuration in which the near infrared ray absorbing layer 11 is formed or stuck on the both principal surfaces of the transparent base material 12.

Examples of an adhesive in the above-described adhesive layer include acrylic acid ester copolymer-based, polyvinyl chloride-based, epoxy resin-based, polyurethane-based, vinyl acetate copolymer-based, styrene-acrylic copolymer-based, polyester-based, polyamide-based, styrene-butadiene copolymer-based, butyl rubber-based, silicone resin-based, and the like adhesives. The adhesive layer may be previously provided on the near infrared ray absorbing layer 11. In that case, from the standpoints of workability and handling properties, it is preferable to stick a release film made of silicone, PET, or the like onto the sticking surface thereof. To the adhesive, additives having a variety of functions, such as an ultraviolet ray absorber, etc., may be added.

The transparent base material 12 is not particularly limited in terms of a shape thereof so long as when combined with the near infrared ray absorbing layer 11 to form an optical filter, it may transmit light in a visible wavelength region therethrough enough to fulfill its functions. It may be in a form of a block, a plate, or a film. Examples of a material that constitutes the transparent base material include crystals such as quartz crystal, lithium niobate, sapphire, etc., glasses, polyester resins such as polyethylene terephthalate (PET), polybutylene terephthalate (PBT), etc., polyolefin resins such as polyethylene, polypropylene, an ethylene/vinyl acetate copolymer, etc., norbornene resins, acrylic resins such as polyacrylate, polymethyl methacrylate, etc., urethane resins, vinyl chloride resins, fluorine resins, polycarbonate resins, polyvinyl butyral resins, polyvinyl alcohol resins, and the like. Such a material may also be a material having absorption properties at a wavelength in an ultraviolet region and/or a near infrared region. The transparent base material 12 may also be an absorption type glass filter in which CuO or the like is added to, for example, a fluorophosphate-based glass, a phosphate-based glass, or the like.

The glass as the transparent base material 12 may be properly selected and used among materials that are transparent in a visible region with respect to the presence or absence of an alkali component contained and properties such as a size of coefficient of linear expansion, etc., while taking into consideration the device used, the place at which the glass is disposed, and the like. In particular, a borosilicate glass is preferable because it is easily processable and is suppressed in the generation of a scratch, an extraneous matter, or the like on the optical surface; and an alkali component-free glass is preferable because bonding properties, weather resistance, and the like are enhanced.

In addition, the crystals such as quartz crystal, lithium niobate, sapphire, etc. are used as a material of a low-pass filter for reducing moire or false color or a wavelength plate in an imaging device such as a digital still camera, a digital video camera, a surveillance camera, an on-vehicle camera, a web camera, etc. In the case of using such a crystal as the material of the transparent base material 12, functions of a low-pass filter or a wavelength plate may also be imparted to the optical filter according to the present embodiment, and such is preferable in view of the fact that more downsizing and slimming of the imaging device may be achieved.

Furthermore, in a solid-state imaging element or solid-state imaging element package of the above-described imaging device, a cover for protecting the solid-state imaging element is air-tightly sealed. When this cover is used as the transparent base material 12, an optical filter capable of being used as a cover is obtainable, and more downsizing and slimming of the imaging device may be achieved. Though a material of the cover may be any of a crystal, a glass and a resin, from the viewpoint of heat resistance, a crystal or a glass is preferable. In the case of selecting a resin, a material that takes heat resistance into consideration, for example, an acrylic resin, a silicone resin, a fluorine resin, an organic-inorganic hybrid material containing a silsesquioxane, etc., or the like is preferable. When the cover contains α-ray emitting elements (radioactive isotopes) as impurities, it emits an α-ray to induce a transient malfunction (soft error) in the solid-state imaging element. In consequence, it is preferable to use a raw material which has been purified in a high purity such that the content of the α-ray emitting elements is as small as possible for the cover, thereby preventing the incorporation of such elements as far as possible even in the manufacturing step. Among the α-ray emitting elements, the content of U and Th is controlled to preferably not more than 20 ppb, and more preferably not more than 5 ppb. In addition, a film for shielding an α-ray may also be provided on one surface of the cover (surface adjacent to the solid-state imaging element).

In the glass plate used as the transparent base material 12, the surface thereof may be subjected to a surface treatment with a silane coupling agent. By using a glass plate having been subjected to a surface treatment with a silane coupling agent, the adhesiveness to the near infrared ray absorbing layer 11 may be increased. Examples of the silane coupling agent include aminosilanes such as γ-aminopropyltriethoxysilane, N-β-(aminoethyl)-γ-aminopropyltrimethoxysilane, N-β-(aminoethyl)-N'-β-(aminoethyl)-γ-aminopropyltriethoxysilane, and γ-anilinopropyltrimethoxysilane, epoxysilanes such as γ-glycidoxypropyltrimethoxysilane and β-(3,4-epoxycyclohexyl)ethyltrimethoxysilane, vinylsilanes such as vinyltrimethoxysilane and N-β-(N-vinylbenzylaminoethyl)-γ-aminopropyltrimethoxysilane, γ-methacryloxypropyltrimethoxysilane, γ-chloropropyltrimethoxysilane, γ-mercaptopropyltrimethoxysilane, and the like. A thickness of the glass plate is preferably in the range of from 0.03 to 5 mm from the standpoints of achieving downsizing and slimming of the device and suppressing the breakage at the time of handling, and more preferably in the range of from 0.05 to 1 mm from the standpoints of weight reduction and strength.

In the case of using a film made of a transparent plastic such as polyethylene terephthalate (PET), etc. as the transparent base material 12, its thickness is preferably in the range of from 10 to 300 μm. In addition, it is preferable to subject the surface of the film to a corona treatment or an easy adhesion treatment before forming the near infrared ray absorbing layer 11.

In the case of using a film made of a transparent plastic as the transparent base material 12, the other principal surface of the transparent base material 12 may be stuck onto the glass plate via an adhesive or a bonding agent. For the glass plate, the same materials as those exemplified for the transparent base material 12 can be used, and in particular, a borosilicate glass is preferable because it is easily processable and is suppressed in the generation of a scratch, an extraneous matter, or the like on the optical surface.

As described later, there may be the case where the optical filter 10A is, for example, used upon sticking the side of the transparent base material 12 directly onto a solid-state imaging element of an imaging device. In that case, from the viewpoint of suppressing separation after sticking, or the like, it is preferable that a difference between a coefficient of linear expansion of the transparent base material 12 and a coefficient of linear expansion of a portion to be stuck is not more than $30 \times 10^{-7}$/K. For example, in the case where the material quality of the portion to be stuck is silicon, materials having a coefficient of linear expansion in the vicinity of from $30 \times 10^{-7}$ to $40 \times 10^{-7}$/K, for example, glasses of AF33 and TEMPAX, all of which are manufactured by SCHOTT; SW-3, SW-Y, SW-YY, AN100, and EN-A1, all of which are manufactured by Asahi Glass Co., Ltd. (all are a trade name); and the like, are suitable as the material of the transparent base material 12. In the case where the material quality of the portion to be stuck is a ceramic such as alumina, etc., materials having a coefficient of linear expansion in the vicinity of from $50 \times 10^{-7}$ to $80 \times 10^{-7}$/K, for example, glasses of D263 and B270, all of which are manufactured by SCHOTT; FP1 and FP01eco, all of which are manufactured by Asahi Glass Co., Ltd.; and the like, are suitable as the material of the transparent base material 12.

In the optical filter 10B of the configuration shown in FIG. 1(b), examples of the selective wavelength shielding layer 13 formed on the both principal surfaces of the near infrared ray absorbing layer 11 include a dielectric multilayered film, a layer capable of absorbing light of a specified wavelength, containing at least one member selected from a near infrared ray or infrared ray absorber, a color tone correcting dye and an ultraviolet ray absorber, and the like.

In the optical filter 10B, the two sheets of the selective wavelength shielding layer 13 combined may be the same as or different from each other. In the case where the two sheets of the selective wavelength shielding layer 13 are configured as a first selective wavelength shielding layer 13a and a second selective wavelength shielding layer 13b which are different from each other in the optical properties, the selective wavelength shielding properties and an alignment sequence thereof are properly adjusted depending upon the used optical device. From this viewpoint, specifically, examples of a positional relation of the near infrared ray absorbing layer 11, the first selective wavelength shielding layer 13a, and the second selective wavelength shielding layer 13b include the following positional relations (i) to (iii).

(i) (First selective wavelength shielding layer 13a)/(near infrared ray absorbing layer 11)/(second selective wavelength shielding layer 13b)

(ii) (Near infrared ray absorbing layer 11)/(first selective wavelength shielding layer 13a)/(second selective wavelength shielding layer 13b)

(iii) (Near infrared ray absorbing layer 11)/(second selective wavelength shielding layer 13b)/(first selective wavelength shielding layer 13a)

On the occasion of installing the thus obtained optical filter 10B in a device, the direction thereof is properly selected depending upon a design.

In addition, in the case where the near infrared ray absorbing layer 11 is provided on a transparent base material, it is preferable that the transparent base material is disposed on the side coming into contact with the first selective wavelength shielding layer 13a or the second selective wavelength shielding layer 13b. That is, in the case where the transparent base material is present, it is preferable that the transparent base material is not located in the outermost layer.

The dielectric multilayered film is a selective wavelength shielding layer in which a function to control transmission and shielding of light in a specified wavelength region is revealed utilizing an interference of light by stacking a low refractive index dielectric film and a high refractive index dielectric film alternately each other.

A high refractive index material constituting the high refractive index dielectric film is not particularly limited so long as it is a material whose refractive index is higher than that of a low refractive index material used in combination therewith. Specifically, a material having a refractive index of more than 1.6 is preferable. More specifically, examples thereof include $Ta_2O_5$ (2.22), $TiO_2$ (2.41), $Nb_2O_5$ (2.3), $ZrO_2$ (1.99), and the like. Of these, in the present invention, when film deposition properties, refractive index, and the like are decided collectively including reproducibility and stability thereof, $TiO_2$ or the like is preferably used. Incidentally, the numeral within the parenthesis after each of the compounds expresses a refractive index. Hereinafter, with respect to the low refractive index material, the numeral within the parenthesis after each of the compounds similarly expresses a refractive index, too.

A low refractive index material constituting the low refractive index dielectric film is not particularly limited so long as it is a material whose refractive index is lower than that of the high refractive index material used in combination therewith. Specifically, a material having a refractive index of less than 1.55 is preferable. More specifically, examples thereof include $SiO_2$ (1.46), $SiO_xN_y$ (1.46 or more and less than 1.55), $MgF_2$ (1.38), and the like. Of these, in the present invention, $SiO_2$ is preferable from the standpoints of reproducibility, stability, economy, and the like in film deposition properties.

Examples of the layer capable of absorbing light of a specified wavelength, containing at least one member selected from a near infrared ray or infrared ray absorber, a color tone correcting dye and an ultraviolet ray absorber include a light absorbing layer in which each absorber is dispersed in a transparent resin by a conventionally known method. Examples of the transparent resin include thermoplastic resins such as polyester resins, acrylic resins, polyolefin resins, polycarbonate resins, polyamide resins, alkyd resins, etc.; resins which can be cured by heat or light, such as ene/thiol resins, epoxy resins, thermosetting acrylic resins, photosetting acrylic resins, silsesquioxane resins, etc.; and the like. The content of each absorber in such a light absorbing layer is properly adjusted depending upon the light absorbing ability of each absorber within the range where the effects of the present invention are not hindered.

For example, in the case of using an infrared ray absorbing layer in which an ITO fine particle is dispersed in a transparent resin, the ITO fine particle is contained in a proportion of preferably from 0.5 to 30% by mass, and more preferably contained from 1 to 30% by mass in the infrared absorbing layer. When the content of the ITO fine particle is 0.5% by mass or more, a fixed effect relative to the shielding properties of light in an infrared wavelength region is obtainable. In addition, when the content of the ITO fine particle is not more than 30% by mass, no absorption of light in a visible wavelength region is exhibited, and transparency may be kept.

For example, in the case of using the optical filter according to the present embodiment as a near infrared ray cut filter for solid-state imaging element, the wavelength region of light which the selective wavelength shielding layer used in combination with the above-described near infrared ray absorbing layer 11 shields is preferably from 710 to 1,100 nm, and more preferably from 710 to 1,200 nm. Furthermore, it is preferable that the selective wavelength shielding layer has optical properties of shielding light in an ultraviolet ray wavelength region of not more than 400 nm, and it is more preferable to have shielding properties of light not more than 410 nm. In the case of constituting such a selective wavelength shielding layer by a dielectric multilayered film, for example, as shown in FIG. 1(b), the optical filter 10B having a structure in which the near infrared ray absorbing layer 11 is sandwiched by the first dielectric multilayered film 13a and the second dielectric multilayered film 13b which are different from each other in terms of a wavelength region of shielding light is preferable.

In that case, for example, the first dielectric multilayered film 13a may be made as a layer having optical properties of transmitting visible light of from 420 to 695 nm and reflecting light in a wavelength region in which a wavelength of 710 nm or more and not more than the wavelength of an end of the long wavelength side of the absorption wavelength region by the near infrared ray absorbing layer 11 is the wavelength of an end of the short wavelength side, whereas a wavelength in the vicinity of from 820 to 950 nm is the wavelength of an end of the long wavelength side.

Here, the absorption wavelength region by the near infrared ray absorbing layer 11 refers to a wavelength region in which in a region of from visible light to near infrared light, the transmittance is not more than 5%. Incidentally, the wavelength of an end of the short wavelength side in the wavelength region of light which the first dielectric multilayered film 13a reflects is specifically preferably in the range of from a wavelength shorter by 10 nm than the wavelength of an end of the long wavelength side of the absorption wavelength region by the near infrared ray absorbing layer 11 to the wavelength of the end of the long wavelength side, and furthermore, it is more preferably a wavelength shorter by from 3 to 10 nm than the wavelength of the end of the long wavelength side. The first dielectric multilayered film 13a may have a reflection wavelength region other than the foregoing as the need arises.

In addition, for example, the second dielectric multilayered film 13b may be made as a layer having optical properties of transmitting visible light of from 420 to 695 nm and reflecting light in an ultraviolet ray wavelength region of preferably not more than 400 nm, and more preferably not more than 410 nm and light in a wavelength region in which a wavelength of at least more than 710 nm and not more than the wavelength of an end of the long wavelength side of the reflection wavelength region of the first dielectric multilayered film 13a is the wavelength of an end of the short wavelength side, whereas a wavelength of preferably 1,100 nm or more, and more preferably 1,200 nm or more is the wavelength of an end of the long wavelength side. Incidentally, the wavelength of the end of the short wavelength side in the wavelength region of light which the second dielectric multilayered film 13b reflects is specifically preferably in the range of from a wavelength shorter by 100 nm than the wavelength of the end of the long wavelength side of the reflection wavelength region of the above-described first dielectric multilayered film 13a to the wavelength of the end of the long wavelength side.

For example, in the case where the absorption wavelength region by the near infrared ray absorbing layer 11 is from 695 to 720 nm, the reflection wavelength region of the first dielectric multilayered film 13a is preferably one in which the wavelength of an end of the short wavelength side is a wavelength selected from 710 to 717 nm, whereas the wavelength of an end of the long wavelength side is a wavelength selected from 820 to 950 nm. In that case, the reflection wavelength region of the second dielectric multilayered film 13b is preferably one in which the wavelength shorter by from 20 to 100 nm than the wavelength of the end of the long wavelength side of the first dielectric multilayered film 13a is a wavelength of an end of the short wavelength side, whereas the wavelength of from 1,100 to 1,200 nm is a wavelength of an end of the long wavelength side.

The second dielectric multilayered film 13b may be designed such that it is separated into a dielectric multilayered film having optical properties of reflecting light in an ultraviolet ray wavelength region of preferably not more than 400 nm, and more preferably not more than 410 nm and a dielectric multilayered film having optical properties of reflecting light in a wavelength region in which a wavelength of at least more than 710 nm and not more than the wavelength of an end of the long wavelength side of the reflection wavelength region of the above-described first dielectric multilayered film 13a is the wavelength of an end of the short wavelength side, whereas a wavelength of preferably 1,100 nm or more, and more preferably 1,200 nm or more is the wavelength of an end of the long wavelength side, followed by providing them individually. However, from the viewpoint of slimming, it is preferable to be designed as a single dielectric multilayered film.

In addition, it is preferable that the first dielectric multilayered film 13a is provided on the far side from the solid-state imaging element as compared with the near infrared ray absorbing layer 11. The arrangement location of the second dielectric multilayered film 13b is not particularly limited. Specifically, examples of a positional relation of the near infrared ray absorbing layer 11, the first dielectric multilayered film 13a, and the second dielectric multilayered film 13b include the following positional relations (i) to (iii) in the order near the solid-state imaging element.

(i) (Second dielectric multilayered film 13b)/(near infrared ray absorbing layer 11)/(first dielectric multilayered film 13a)

(ii) (Near infrared ray absorbing layer 11)/(first dielectric multilayered film 13a)/(second dielectric multilayered film 13b)

(iii) (Near infrared ray absorbing layer 11)/(second dielectric multilayered film 13b)/(first dielectric multilayered film 13a)

Of these, in the present embodiment, the disposition (i) is the most preferable from the viewpoint that a strain or the like on manufacture is not generated in the obtained optical filter 10B.

In addition, one in which the near infrared ray absorbing layer 11 is formed on a transparent base material may be used. Even in that case, examples of the positional relation of the near infrared ray absorbing layer 11, the first dielectric multilayered film 13a, and the second dielectric multilayered film 13b from the solid-state imaging element include the above-described positional relations (i) to (iii). The positional relation between the transparent base material and the near infrared ray absorbing layer 11 is a disposition in which the near infrared ray absorbing layer 11 is located on the near side to the solid-state imaging element. When these are combined, in the case of using one in which the near infrared ray absorbing layer 11 is formed on a transparent base material, the following dispositions (i)' to (iii)' in the order near the solid-state imaging element may be possible.

(i)' (Second dielectric multilayered film 13b)/(near infrared ray absorbing layer 11)/(transparent base material)/(first dielectric multilayered film 13a)

(ii)' (Near infrared ray absorbing layer 11)/(transparent base material)/(first dielectric multilayered film 13a)/(second dielectric multilayered film 13b)

(iii)' (Near infrared ray absorbing layer 11)/(transparent base material)/(second dielectric multilayered film 13b)/(first dielectric multilayered film 13a)

Of these, in the present embodiment, the disposition (i)' is the most preferable.

Specific layer number and film thickness of the dielectric multilayered film are set up by using a design technique in a conventional band pass filter or the like using a dielectric multilayered film on the basis of a refractive index of each of the used high refractive index material and low refractive index material depending upon the required optical properties in each of the first dielectric multilayered film 13a and the second dielectric multilayered film 13b. Incidentally, when the material of each layer is selected according to the setting, a method of adjusting the thickness of each layer and stacking the layers using this is established. Therefore, it is easy to manufacture the dielectric multilayered film in conformity with the design.

As spectral characteristics of the optical filter, a performance for changing the transmittance steeply in a boundary wavelength region between the light transmission wavelength and the light shielding wavelength is required. In order to obtain the performance for changing the transmittance steeply in a boundary wavelength region between the light transmission wavelength and the light shielding wavelength, the dielectric multilayered film has the total number of stacking of the low refractive index dielectric film and the high refractive index dielectric film of preferably 15 layers or more, more preferably 25 layers or more, and still more preferably 30 layers or more. When the total number of stacking increases, the takt time at the time of manufacture becomes long, warpage or the like of the dielectric multilayered film is generated, and the film thickness of the dielectric multilayered film increases. Therefore, it is preferably not more than 100 layers, more preferably not more than 75 layers, and still more preferably not more than 60 layers. So long as the stacking order of the low refractive index dielectric film and the high refractive index dielectric film is alternate, the first layer may be either the low refractive index dielectric film or the high refractive index dielectric film, and the total number of stacking may be either odd or even.

From the viewpoint that not only the above-described preferred stacking number is satisfied, but also slimming of the optical filter is achieved, the film thickness of the dielectric multilayered film is preferably thin. Though the film thickness of such a dielectric multilayered film varies with the selective wavelength shielding properties, it is preferably from 2,000 to 5,000 nm. In addition, in the case where the dielectric multilayered film is arranged on the both surfaces of the near infrared ray absorbing layer, or each surface of the transparent base material and the near infrared ray absorbing layer formed on the transparent base material, there may be the case where warpage is generated due to a stress of the dielectric multilayered film. In order to suppress the generation of this warpage, a difference in film thickness of the dielectric multilayered films to be deposited on each surface is preferably small as far as possible upon deposited so as to have the desired selective wavelength shielding properties.

In forming the dielectric multilayered film, for example, a vacuum film deposition process such as a CVD method, a sputtering method, a vacuum vapor deposition method, etc., a wet film deposition process such as a spray method, a dipping method, etc., and the like can be adopted.

The optical filters 10A and 10B of the present embodiment contain the near infrared ray absorbing layer 11. The near infrared ray absorbing layer 11 has such properties that the transmittance of light in a visible wavelength region is high due to optical properties of the contained NIR absorbing dye (A) and that the transmittance changes steeply in a wavelength range of from 630 to 700 nm, and furthermore, has such properties that the light shielding wavelength region is wide to an extent of from 695 to 720 nm due to an action of the transparent resin (B) combined therewith. Since this near infrared ray absorbing layer 11 is present, the optical filters 10A and 10B of the present embodiment having optical properties in which the light absorption properties of the above-described NIR absorbing dye (A) are effectively utilized are obtainable.

In the optical filter 10A of the present embodiment, since the optical filter 10A is used together with a member having other selective wavelength shielding layer, particularly the above-described selective wavelength shielding layer having optical properties of transmitting visible light of from 420 to 695 nm therethrough and shielding light in a wavelength region of from 710 to 1,100 nm depending upon an application for which the optical filter 10A is used, excellent near infrared ray shielding properties in which the light absorption properties of the above-described NIR absorbing dye (A) are effectively utilized are exhibited.

In addition, since the near infrared ray absorbing layer 11 can be formed by coating a coating liquid, which is prepared by dispersing or dissolving the NIR absorbing dye (A) and the transparent resin (B) or the raw material component of the transparent resin (B) and other component blended as the need arises in a solvent, on the principal surface of the transparent base material 12, drying, and if desired, further subjecting to a curing treatment, the optical filter 10A may be manufactured easily and at low costs and is also adaptive to downsizing and slimming.

In addition, since the optical filter 10B of the present embodiment has the near infrared ray absorbing layer 11 in combination with other selective wavelength shielding layer, particularly the above-described selective wavelength shielding layer having optical properties of transmitting visible light of from 420 to 695 nm therethrough and shielding light in a wavelength region of from 710 to 1,100 nm, and more preferably, has such optical properties that the selective wavelength shielding layer shields light in an ultraviolet ray wavelength region of not more than 400 nm, it may be used as an infrared ray cut filter having excellent near infrared ray shielding properties in which light absorption properties of the above-described NIR absorbing dye (A) are effectively utilized.

According such an optical filter 10B of the present embodiment, for example, it can be achieved optical properties excellent in terms of near infrared ray shielding properties such that the transmittance of visible light of from 420 to 620 nm is 70% or more, the transmittance of light in a wavelength region of from 710 to 860 nm is not more than 0.3%, and the amount of change Df of transmittance expressed by the foregoing equation (2) is not more than −0.8.

In addition, in the optical filter 10B of the present embodiment, in the case where the selective wavelength shielding layer which is preferably used in combination with the near infrared ray absorbing layer 11 is a layer in which various absorbers other than the above-described NIR absorbing dye (A), such as a near infrared ray or infrared ray absorber, a color tone correcting dye, an ultraviolet ray absorber, etc., are dispersed in a transparent resin, it can also be formed in the same step as that in the near infrared ray absorbing layer 11, so that it may be manufactured easily and at low costs. Furthermore, the dielectric multilayered film can also be manufactured by a thoroughly known method and can be easily fabricated. Accordingly, the optical filter 10B of the present embodiment can also be manufactured easily and at low costs and can be also adaptive to downsizing and slimming.

The optical filter of the present embodiment can be used as a near infrared ray cutting optical filter of an imaging device such as a digital still camera, a digital video camera, a surveillance camera, an on-vehicle camera, a web camera, etc., an automatic exposure meter, or the like, an optical filter for PDP, and the like. The optical filter of the present embodiment is suitably used in an imaging device such as a digital still camera, a digital video camera, a surveillance camera, an on-vehicle camera, a web camera, etc., and the optical filter is, for example, disposed between an imaging lens and a solid-state imaging element.

In addition, the optical filter of the present embodiment can also be used upon being stuck directly onto a solid-state imaging element of an imaging device such as a digital still camera, a digital video camera, a surveillance camera, an on-vehicle camera, a web camera, etc., a light receiving element of an automatic exposure meter, an imaging lens, PDP, or the like via an adhesive layer. Furthermore, it can also be similarly used upon being stuck directly onto a glass window or a lamp of a vehicle (e.g., an automobile, etc.) via an adhesive layer.

An example of an imaging device using the optical filter of the present embodiment arranged between an imaging lens and a solid-state imaging element is hereunder described by reference to FIG. 2.

Figure 2:
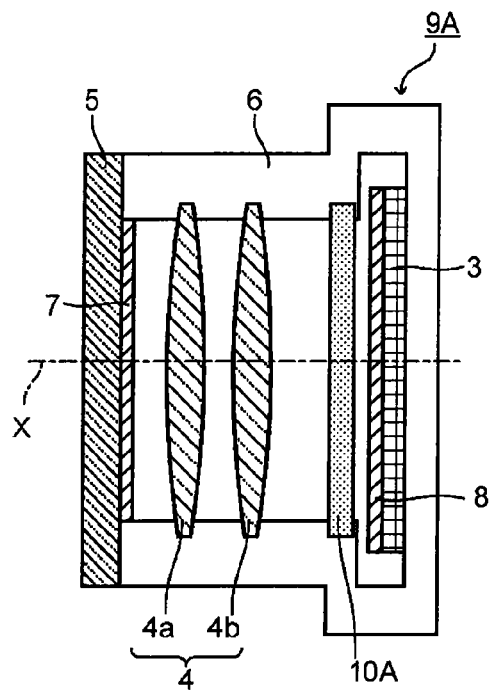
FIG. 2 This is a cross-sectional view showing an example of an imaging device using an optical filter of an embodiment of the present invention.
Figure 2:
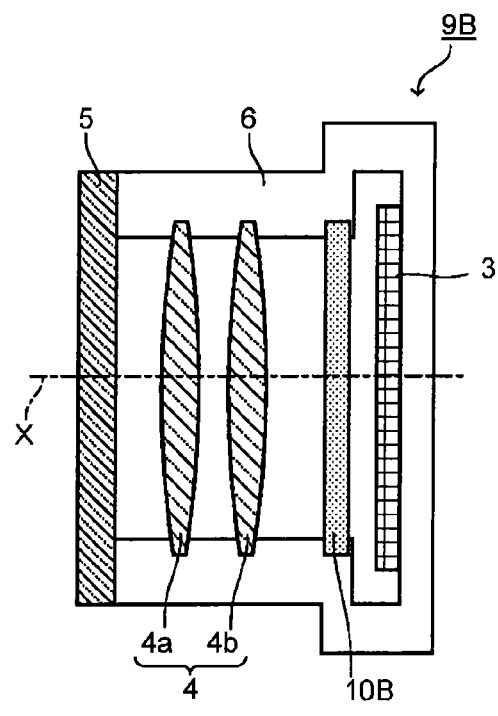

FIG. 2(*a*) is a cross-sectional view showing diagrammatically a principal part of an example of an imaging device using the above-described optical filter 10A. As shown in FIG. 2(*a*), this imaging device 9A has a solid-state imaging element 3 in which a second dielectric multilayered film 8 being the same as the second dielectric multilayered film 13*b* which the above-described optical filter 10B has is formed as a selective layer on the front surface thereof; has, on the front surface thereof, the optical filter 10A, two imaging lenses 4, and a cover glass 5 in this order; and further has a housing 6 immobilizing them therein. The two lenses 4 are composed of a first lens 4*a* and a second lens 4*b* disposed toward the imaging surface of the solid-state imaging element 3. In the cover glass 5, a first dielectric multilayered film 7 being the same as the first dielectric multilayered film 13*a* which the above-described optical filter 10B has is formed on the side of the first lens 4*a*.

The optical filter 10A is disposed in such a manner that the transparent base material 12 is located on the side of the solid-state imaging element 3, and the near infrared ray absorbing layer 11 is on the side of the second lens 4*b*. Alternatively, the optical filter 10A may also be disposed in such a manner that the near infrared ray absorbing layer 11 is located on the side of the solid-state imaging element 3, and the transparent base material 12 is on the side of the second lens 4*b*. The solid-state imaging element 3 and the two lenses 4 are disposed along an optical axis x.

In the imaging device 9A, the light which has been made incident from the side of a subject goes through the cover glass 5 and the first dielectric multilayered film 7, the first lens 4*a*, the second lens 4*b*, the optical filter 10A, and further the second dielectric multilayered film 8, and is then received by the solid-state imaging element. The solid-state imaging element 3 converts this received light into an electric signal, which is then outputted as an image signal. Since the incident light passes through the first dielectric multilayered film 7, the optical filter 10A having the near infrared ray absorbing layer 11, and the second dielectric multilayered film 8 in this order, it is received by the solid-state imaging element 3 as light from which the near infrared ray has been sufficiently shielded.

FIG. 2(*b*) is a cross-sectional view showing diagrammatically a principal part of an example of an imaging device using the above-described optical filter 10B. As shown in FIG. 2(*b*), this imaging device 9B has a solid-state imaging element 3; has, on the front surface thereof, the optical filter 10B, two imaging lenses 4, and a cover glass 5 in this order; and further has a housing 6 immobilizing them therein. The two lenses 4 are composed of a first lens 4*a* and a second lens 4*b* disposed toward the imaging surface of the solid-state imaging element 3. The optical filter 10B is disposed in such a manner that the second dielectric multilayered film 13*b* is located on the side of the solid-state imaging element 3, and the first dielectric multilayered film 13*a* is on the side of the second lens 4*b*. The solid-state imaging element 3 and the two lenses 4 are disposed along an optical axis x.

In the imaging device 9B, the light which has been made incident from the side of a subject goes through the cover glass 5, the first lens 4*a*, the second lens 4*b*, and the optical filter 10B, and is then received by the solid-state imaging element 3. The solid-state imaging element 3 converts this received light into an electric signal, which is then outputted as an image signal. As described above, since the optical filter 10B is an optical filter having an excellent near infrared ray shielding function effectively utilizing the light absorption properties of the NIR absorbing dye (A), light from which the near infrared ray has been sufficiently shielded is received by the solid-state imaging element 3.

Incidentally, the imaging device 9B may also be configured such that the optical filter 10B provided on the front surface of the solid-state imaging element 3 is replaced by a transparent base material, and instead thereof, the cover glass 5 located on the most front surface in the imaging device 9B is replaced by the optical filter 10A or 10B having the near infrared ray absorbing layer 11 according to the present embodiment and arranged. In the case of using the optical filter 10A, it is disposed such that the near infrared ray absorbing layer 11 is located on the principal surface on the near side to the solid-state imaging element. In that case, the above-described second dielectric multilayered film may be disposed on the principal surface of the near infrared ray absorbing layer 11 of the optical filter 10A on the side of the solid-state imaging element. Alternatively, the second dielectric multilayered film may be arranged on the principal surface of any one of the first lens 4a, the second lens 4b, and the transparent base material, on the principal surface of the solid-state imaging element on the side of the transparent base material, or in the interior of the solid-state imaging element outer than a photoelectric conversion element, for example, on the outside of the above-described flattened layer.

On the other hand, the first dielectric multilayered film may be arranged on the principal surface of the transparent base material 12 which the optical filter 10A has on the opposite side to the solid-state imaging element. In the case of using the optical filter 10B, the optical filter 10B is arranged in the imaging device 30 so as to have any one of the disposition orders as described above in (i) to (iii).

Second Embodiment

Figure 3:
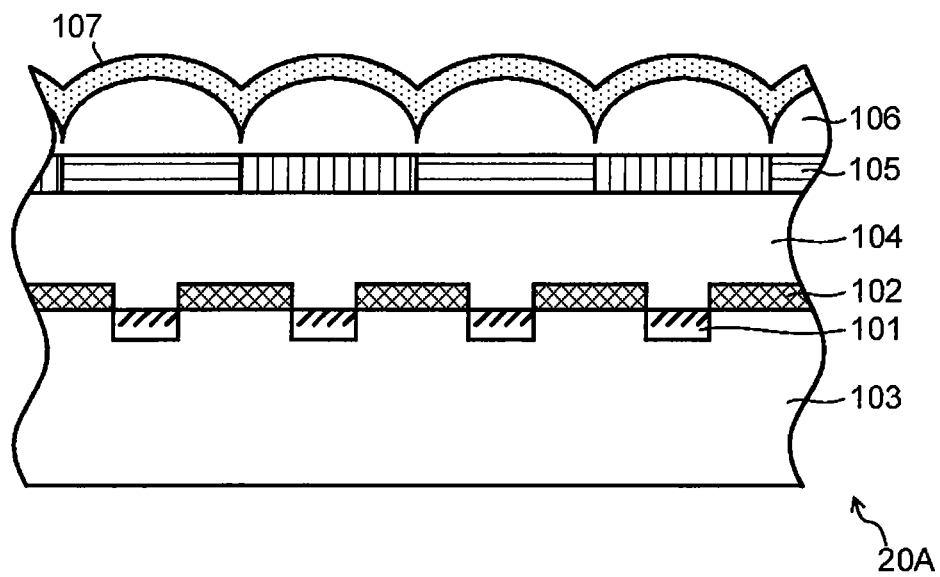
FIG. 3 This is a cross-sectional view showing an example of a solid-state imaging element according to an embodiment of the present invention.

FIG. 3 is a cross-sectional view showing diagrammatically a part of a solid-state imaging element according to the present embodiment. The solid-state imaging element of the present embodiment is a solid-state imaging element used for an imaging device such as a small-sized camera, etc., which is installed in an information appliance such as a digital still camera, a digital video camera, a mobile phone, a laptop computer, PDA (personal digital assistance), etc. In the following embodiments, in order to avoid overlapping explanations, the points common to those in the first embodiment are omitted under certain circumstances, and the explanation is made centering on different points.

As shown in FIG. 3, in this solid-state imaging element 20A, a flattened layer 104, a color filter layer 105, and a microlens 106 are provided in this order on a semiconductor substrate 103 such as a silicon substrate, etc, having a photoelectric conversion element 101 and a light shielding layer 102 formed thereon. Furthermore, a near infrared ray absorbing layer 107 in which the NIR absorbing dye (A) is dispersed in the transparent resin (B) similar to the above-described optical filter is provided on the microlens 106.

A plurality of the photoelectric conversion elements 101 are formed on the surface layer of the semiconductor substrate 103, and the light shielding layer 102 for shielding all light including visible light is formed in portions excluding those photoelectric conversion elements 101. The light which has been made incident into the photoelectric conversion elements 101 is subjected to photoelectric conversion by a photodiode. The flattened layer 104 is formed on the light-receiving elements 101 and the light-shielding layer 102, and made the whole thereof flat.

The color filter layer 105 is formed corresponding to the photoelectric conversion element 101. For example, in the case of a primary color system, it is composed of red (R), green (G) and blue (B) color filter layers, and in the case of a complementary color system (YMC), it is composed of yellow (Y), magenta (Mg) and cyan (Cy) color filter layers. The number of colors of the color filter layers is not limited, and in order to more widen the color reproducibility, for example, in the above-described primary color system, three or more colors may be adopted by adding a yellow color or the like. In addition, the disposition of each color is not particularly limited. Furthermore, though in the present embodiment, the color filter layer 105 may be provided entire surface, there may be a structure in which a part thereof is not provided, or the color filter layer 105 per se is not present. The color filter is, for example, formed of a resin containing a pigment or a dye.

The microlens 106 is, for example, formed of a resin such as polystyrene resins, acrylic resins, polyolefin resins, polyimide resins, polyamide resins, polyester resins, polyethylene resins, novolak resins, etc. by adopting a heat molding method, an etching method, or the like. The microlens 106 may also be formed of a glass, a crystal, or the like in addition to a resin. The light which has passed through the microlens 106 is condensed into the photoelectric conversion element 101.

The near infrared ray absorbing layer 107 can be formed by coating a coating liquid prepared in the same manner as that in the above-described first embodiment on the microlens 106 and drying, followed by further curing if desired. Incidentally, coating, drying, and curing conducted if desired, may be divided plural times and conducted. As the preparation method of a coating liquid and the coating method of a coating liquid, the same methods as those adopted in the first embodiment are adopted. In consequence, all of the explanations described in the first embodiment are also applicable to the present embodiment.

In addition, the thickness, optical properties and the like of the near infrared ray absorbing layer 107 can be made the same as those in the near infrared ray absorbing layer in the above-described first embodiment.

Though illustration is omitted, it is preferable that the solid-state imaging element 20A of the present embodiment further contains a selective wavelength shielding layer on one side or both sides of the near infrared ray absorbing layer 107.

It is preferable that the selective wavelength shielding layer has such optical properties that it transmits visible light of from 420 to 695 nm therethrough and shields light in a wavelength region of from 710 to 1,100 nm. The wavelength region shielded is preferably from 710 to 1,200 nm. By using the near infrared ray absorbing layer 107 in combination with such a selective wavelength shielding layer, the light in a near infrared ray region can be shielded with high performance. It is preferable that the selective wavelength shielding layer further has optical properties of shielding light in an ultraviolet ray wavelength region of not more than 400 nm, and it is more preferable to have shielding properties of light of not more than 410 nm.

The selective wavelength shielding layer may be made to shield light in the above-described prescribed wavelength region by a single layer thereof, and may also be made to shield light in the prescribed wavelength region by a combination of plural layers thereof. In addition, in the inner side of the near infrared ray absorbing layer 107, it is not always necessary to provide the selective wavelength shielding layer so as to come into contact with the near infrared ray absorbing layer 107, and the location may be properly selected so long as it is present between the photoelectric conversion element 101 and the near infrared ray absorbing layer 107. For example, it also may be provided on an undersurface of the microlens 106, an undersurface of the color filter layer 105, or an undersurface of the flattened layer 104, or may also be provided in two or more places thereof In the solid-state imaging element 20A of the present embodiment, in the case of providing a selective wavelength shielding layer outside the near infrared ray absorbing layer 107, since no constituent element is present outer than the near infrared ray absorbing layer 107, it will be inevitably provided on the outer surface of the near infrared ray absorbing layer 107. However, it is not always necessary to completely achieve infrared ray shielding by only the solid-state imaging element 20A. Such may also be adapted by providing the selective wavelength shielding layer provided outside the above-described infrared ray absorbing layer 107 on any one of principal surfaces of the various optical members provided on the front surface of the solid-state imaging element 20A in an imaging device as described later. An installation location may be properly selected among them depending upon an application.

Examples of a specific combination of the near infrared ray absorbing layer 107 and the selective wavelength shielding layer include a combination in which the first dielectric multilayered film transmitting visible light of from 420 to 695 nm therethrough and having the reflection wavelength region described below, the near infrared ray absorbing layer 107, and the second dielectric multilayered film transmitting visible light of from 420 to 695 nm therethrough and having the reflection wavelength region described below are disposed in this order from the far side from the photoelectric conversion element 101.

The reflection wavelength region which the first dielectric multilayered film has is, for example, one including a region in which the wavelength of an end of the short wavelength side thereof is 710 nm or more and not more than the wavelength of an end of the long wavelength side of the absorption wavelength region by the near infrared ray absorbing layer 107, and the wavelength of an end of the long wavelength side thereof is preferably a wavelength in the vicinity of from 820 to 950 nm. The reflection wavelength region may further include other region as the need arises.

The reflection wavelength region which the second dielectric multilayered film has is, for example, one including a region in which the wavelength of an end of the short wavelength side thereof is more than 710 nm and not more than the wavelength of the end of the long wavelength side of the reflection wavelength region of the above-described first dielectric multilayered film, and the wavelength of an end of the long wavelength side thereof is a wavelength of preferably 1,100 nm or more, and more preferably 1,200 nm or more. It is preferable that the reflection wavelength region includes an ultraviolet ray wavelength region of not more than 400 nm, and more preferably not more than 410 nm.

In that case, as described above, the first dielectric multilayered film is formed on a top surface of the near infrared ray absorbing layer 107; however, the second dielectric multilayered film may also be provided on a top surface or undersurface of the microlens 106, on an undersurface of the color filter layer 105, or on an undersurface of the flattened layer 104.

Furthermore, in the solid-state imaging element 20A, an antireflection layer may also be formed by a conventionally known method, for example, on a top surface of the microlens 106, on the near infrared ray absorbing layer 107 provided on a top surface of the microlens 106, or in the case where a selective wavelength shielding layer is formed thereon, on it. By providing the antireflection layer, re-reflection of the incident light may be prevented from occurring, and the quality of an imaged image may be enhanced. Incidentally, specific modes regarding the selective wavelength shielding layer including preferred modes may be made the same as those in the selective wavelength shielding layer in the optical filter of the above-described first embodiment.

In the solid-state imaging element 20A, one layer of the near infrared ray absorbing layer 107 is provided on a top surface of the microlens 106. The near infrared ray absorbing layer 107 may be provided on an undersurface of the microlens 106, on an undersurface of the color filter layer 105, or on an undersurface of the flattened layer 104, or may also be provided in two or more places thereof.

Figure 4:
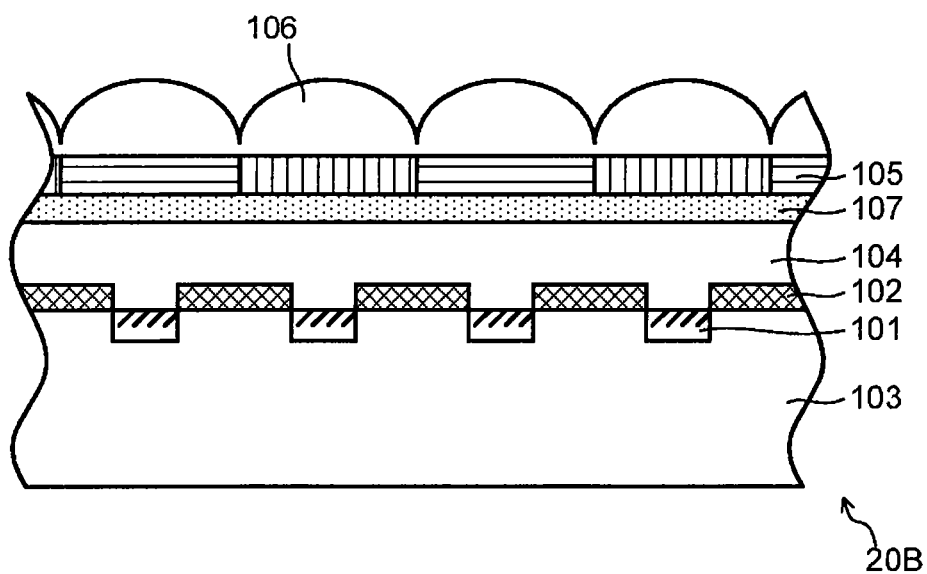
FIG. 4 This is a cross-sectional view showing a modification example of a solid-state imaging element of an embodiment of the present invention.

FIG. 4 shows such an example. In a solid-state imaging element 20B shown in FIG. 4, the near infrared ray absorbing layer 107 is provided between the flattened layer 104 and the color filter layer 105. In the solid-state imaging element 20B, in comparison with the solid-state imaging element 20A, the formation of the near infrared absorbing layer 107 is easy because it is installed on a flat surface as compare with the top surface of the microlens 106.

Though illustration is omitted, also the solid-state imaging element 20B preferably further contains a selective wavelength shielding layer on one side or both sides of the near infrared absorbing layer 107. The optical properties and disposition of the selective wavelength shielding layer may be made the same as those described in the above-described solid-state imaging element 20A. In the case of providing the selective wavelength shielding layer so as to come into contact with the near infrared ray absorbing layer 107, in comparison with the solid-state imaging element 20A, the formation of such a layer is easy because the surface on which the foregoing layer is provided is a flat surface.

In the case where the solid-state imaging element 20A or 20B of the present embodiment has the near infrared ray absorbing layer 107 in combination with the above-described selective wavelength shielding layer having optical properties of transmitting visible light of from 420 to 695 nm therethrough and shielding light in a wavelength region of from 710 to 1,100 nm, a near infrared ray cut filter which has been conventionally disposed as a separate body can be omitted, so that downsizing, slimming and low costs of an imaging device may be achieved.

The near infrared ray absorbing layer 107 has such properties that the transmittance of light in a visible wavelength region is high and the transmittance changes steeply in a wavelength range of from 630 to 700 nm due to optical properties of the contained NIR absorbing dye (A), and further has such properties that the light shielding wavelength region is wide to an extent of from 695 to 720 nm due to an action of the transparent resin (B) combined therewith. Since this near infrared ray absorbing layer 107 is present, the solid-state imaging elements 20A and 20B of the present embodiment having optical properties in which the light absorption properties of the above-described NIR absorbing dye (A) are effectively utilized are obtainable.

In the solid-state imaging element 20A or 20B of the present embodiment, since this near infrared ray absorbing layer 107 is used together with other selective wavelength shielding layer, particularly the above-described selective wavelength shielding layer having optical properties of transmitting visible light of from 420 to 695 nm therethrough and shielding light in a wavelength region of from 710 to 1,100 nm, a solid-state imaging element having excellent near infrared ray shielding properties in which the light absorption properties of the above-described NIR absorbing dye (A) are effectively utilized can be realized.

Furthermore, even in the case where the solid-state imaging element 20A or 20B does not contain the above-described selective wavelength shielding layer having optical properties of transmitting visible light of from 420 to 695 nm therethrough and shielding light in a wavelength region of from 710 to 1,100 nm, by which a near infrared ray cut filter function can be exhibited by using together with the near infrared ray absorbing layer 107, in an imaging device using the solid-state imaging element 20A or 20B, by providing the above-described selective wavelength shielding layer in other optical member configuring the imaging device disposed on the front surface of the solid-state imaging element 20A or 20B, an imaging device having excellent near infrared ray shielding properties in which the light absorption properties of the above-described NIR absorbing dye (A) are effectively utilized can be realized.

In addition, since the near infrared ray absorbing layer 107 can be formed by coating a coating liquid prepared by dispersing or dissolving the NIR absorbing dye (A) and the transparent resin (B) or the raw material component of the transparent resin (B) and other component blended as the need arises in a solvent, on a top surface of the microlens 106, drying, and if desired, further subjecting to a curing treatment, the functions as a solid-state imaging element are not impaired. Furthermore, in the case where the selective wavelength shielding layer which is preferably used in combination with the near infrared ray absorbing layer 107 is a layer in which various absorbers other than the above-described NIR absorbing dye (A), such as a near infrared ray or infrared ray absorber, a color tone correcting dye, an ultraviolet ray absorber, etc., are dispersed in a transparent resin, it can also be formed in the same step as that in the near infrared ray absorbing layer 107, so that the functions as a solid-state imaging element are not impaired. Furthermore, the dielectric multilayered film can also be formed without impairing the functions as a solid-state imaging element.

For that reason, the solid-state imaging elements 20A and 20B of the present embodiment may have optical properties in which the light absorption properties of the above-described NIR absorbing dye (A) are effectively utilized along with the functions as a solid-state imaging element, and by using this, an imaging device in which not only downsizing, slimming, and lost costs are achieved, but the quality of an imaged image is excellent is obtainable.

Third Embodiment

Figure 5:
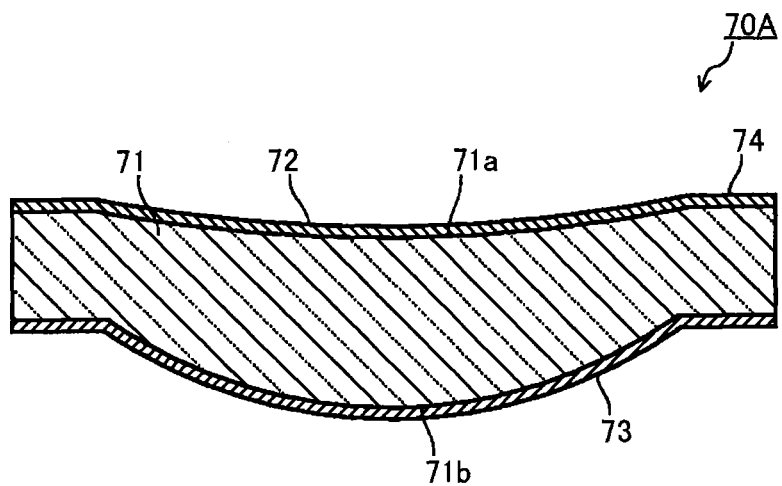
FIG. 5 This is a cross-sectional view showing an example of an imaging device lens according to an embodiment of the present invention.

FIG. 5 is a cross-sectional view showing an imaging device lens according to the present embodiment. This imaging device lens is a lens configuring the whole or a part of a lens system to be subjected to image formation into the solid-state imaging element in an imaging device such as a small-sized camera, etc., which is installed in an information appliance such as a digital still camera, a digital video camera, a mobile phone, a laptop computer, PDA, etc.

In an imaging device lens 70A shown in FIG. 5, a glass concavo-convex lens in which a one-sided surface 71a has a concave surface, and the other surface 71b has a convex surface and which has a flat plate part 74 in the periphery thereof is used as a lens main body 71. A near infrared ray absorbing layer 72 in which similar to the above-described optical filter, the NIR absorbing dye (A) is dispersed in the transparent resin (B) is provided on the surface 71a on the concave surface side of this glass concavo-convex lens, and an antireflection film 73 is provided on the other surface 71b on the convex surface side. As for the concavo-convex lens shown in FIG. 5, a lens having the function of a convex lens is called a convex meniscus, and a lens having the function of a concave lens is called a concave meniscus.

The near infrared ray absorbing layer 72 can be formed by coating a coating liquid prepared in the same manner as that in the above-described first embodiment on the one-sided surface 71a of the lens main body 71 and drying, followed by further curing, if desired. Incidentally, coating, drying, and curing conducted if desired, may be divided plural times and conducted. As the preparation method of a coating liquid and the coating method of a coating liquid, the same methods as those adopted in the first embodiment are adopted. In consequence, all of the explanations described in the first embodiment are also applicable to the present embodiment.

In addition, the thickness, optical properties and the like of the near infrared ray absorbing layer 72 are the same as those in the near infrared ray absorbing layer in the above-described first embodiment.

In addition, for example, the antireflection film 73 may be provided on the one-sided surface 71a of the lens main body 71 by a conventionally known method, while providing the near infrared ray absorbing layer 72 on the other surface 71b. Furthermore, in place of the antireflection film 73, the near infrared ray absorbing layer 72 the same as that on the one-sided surface 71a may also be formed on the other surface 71b. That is, the near infrared ray absorbing layer 72 may also be provided on all of the both principal surfaces 71a and 71b of the lens main body 71.

Though illustration is omitted, it is preferable that the imaging device lens 70A of the present embodiment further contains a selective wavelength shielding layer on one side or both sides of the near infrared ray absorbing layer 72.

It is preferable that the selective wavelength shielding layer has optical properties of transmitting visible light of from 420 to 695 nm therethrough and shielding light in a wavelength region of from 710 to 1,100 nm. The wavelength region in which the light is shielded is more preferably from 710 to 1,200 nm. By using the near infrared ray absorbing layer 72 in combination with such a selective wavelength shielding layer, the light in a near infrared ray region may be shielded with high performance. It is preferable that the selective wavelength shielding layer further has optical properties of shielding light in an ultraviolet ray wavelength region of not more than 400 nm, and it is more preferable to have shielding properties of light of not more than 410 nm.

The selective wavelength shielding layer may be made to shield light in the above-described prescribed wavelength region by a single layer thereof, and may also be made to shield light in the prescribed wavelength region by a combination of plural layers thereof. In addition, in the inner side of the near infrared ray absorbing layer 72, it is not always necessary to provide the selective wavelength shielding layer so as to come into contact with the near infrared ray absorbing layer 72. For example, it may also be provided on the opposite surface of the lens main body 71 to the surface on which the near infrared ray absorbing layer 72 is present.

In the imaging device lens 70A of the present embodiment, in the case of providing a selective wavelength shielding layer outside the near infrared ray absorbing layer 72, since no constituent element is present outer than the near infrared ray absorbing layer 72, it will be inevitably provided on the outer surface of the near infrared ray absorbing layer 72.

Here, in the imaging device lens 70A, it is not always necessary to completely achieve infrared ray shielding by only the imaging device lens. Such may also be adapted by providing the selective wavelength shielding layer provided on one side or both sides of the above-described infrared ray absorbing layer 72 on the principal surface of other optical member disposed on the front surface of the solid-state imaging element together with the imaging device lens 70A in an imaging device as described later, or on the surface of the solid-state imaging element, namely the principal surface on the front side. An installation location may be properly selected among them depending upon an application.

Examples of a specific combination of the near infrared ray absorbing layer 72 and the selective wavelength shielding layer include a combination in which the first dielectric multilayered film transmitting visible light of from 420 to 695 nm therethrough and having the reflection wavelength region described below, the near infrared ray absorbing layer 72, and the second dielectric multilayered film transmitting visible light of from 420 to 695 nm therethrough and having the reflection wavelength region described below are disposed in this order from the far side from the solid-state imaging element.

The reflection wavelength region which the first dielectric multilayered film has is, for example, one including a region in which the wavelength of an end of the short wavelength side thereof is 710 nm or more and not more than the wavelength of an end of the long wavelength side of the absorption wavelength region by the near infrared ray absorbing layer 72, and the wavelength of an end of the long wavelength side thereof is preferably a wavelength in the vicinity of from 820 to 950 nm. The reflection wavelength region may further include other region as the need arises.

The reflection wavelength region which the second dielectric multilayered film has is, for example, one including a region in which the wavelength of an end of the short wavelength side thereof is more than 710 nm and not more than the wavelength of the end of the long wavelength side of the reflection wavelength region of the above-described first dielectric multilayered film, and the wavelength of an end of the long wavelength side thereof is a wavelength of preferably 1,100 nm or more, and more preferably 1,200 nm or more. It is preferable that the reflection wavelength region includes an ultraviolet ray wavelength region of not more than 400 nm, and more preferably not more than 410 nm.

The arrangement location of each of the above-described first dielectric multilayered film and second dielectric multilayered film in the imaging device lens 70A is determined depending upon the direction of the imaging device lens 70A arranged on the front surface of the solid-state imaging element in the imaging device.

The lens used for the lens main body 71 is not particularly limited with respect to the shape and material quality and the like so long as it is a lens which has been conventionally used for an application of this sort.

Examples of a material constituting the lens main body 71 include crystals such as quartz crystal, lithium niobate, sapphire, etc.; glasses such as BK7, quartz, a low melting point glass for precision press molding, etc.; plastics such as polyester resins such as polyethylene terephthalate (PET), polybutylene terephthalate (PBT), etc., polyolefin resins such as polyethylene, polypropylene, an ethylene/vinyl acetate copolymer, etc., norbornene resins, acrylic resins such as polyacrylate, polymethyl methacrylate, etc., urethane resins, vinyl chloride resins, fluorine resins, polycarbonate resins, polyvinyl butyral resins, polyvinyl alcohol resins, etc.; and the like. Such a material may also be one having absorption properties against light having a wavelength in an ultraviolet region and/or a near infrared region. In addition, the lens main body 71 may also be constituted of a colored glass in which CuO or the like is, for example, added to a fluorophosphate-based glass, a phosphate-based glass, or the like. In addition, though each of the drawings is concerned with an example of the refraction type lens, a diffraction lens utilizing diffraction such as a Fresnel lens, etc., a hybrid lens using jointly refraction and diffraction, or the like may be adapted.

Figure 6:
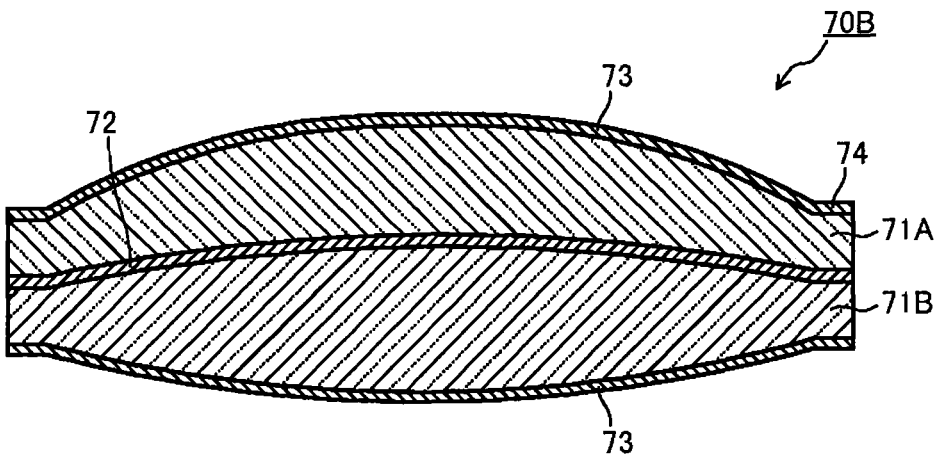
FIG. 6 This is a cross-sectional view showing a modification example of an imaging device lens according to an embodiment of the present invention.

The lens main body 71 may also be of a structure in which plural lenses are bonded to each other with a bonding agent. In that case, the near infrared ray absorbing layer 72 may be provided on the bonded surface. FIG. 6 shows an example of such an imaging device lens. In this imaging device lens 70B, the lens main body 71 is configured of two lenses 71A and 71B; the lenses 71A and 71B have the flat plate part 74 in the peripheries thereof; the near infrared ray absorbing layer 72 is provided on the bonded surface between the lenses 71A and 71B; and the antireflection film 73 is provided on the surfaces of the opposite sides to the bonded surface. In this imaging device lens 70B, the near infrared ray absorbing layer 72 may be provided on one of the two lenses 71A and 72B, for example, on the lens 71A and integrated with the other, for example, the lens 71B with a bonding agent. Alternatively, the two lenses 71A and 71B may also be stuck onto each other with the near infrared ray absorbing layer 72 as a bonding agent.

Though illustration is omitted, also the imaging device lens 70B preferably further contains a selective wavelength shielding layer on one side or both sides of the near infrared ray absorbing layer 72. The optical properties and disposition of the selective wavelength shielding layer may be made the same as those described in the above-described imaging device lens 70A.

The type of the lens used for the lens main body 71, the presence or absence of the antireflection film 73, and the like are properly determined taking into consideration an application, the type and disposition location of the lens to be used in combination, and the like.

In the case of using a lens made of a glass as the lens main body 71, the surface thereof may be subjected to a surface treatment with a silane coupling agent for the purpose of increasing the adhesiveness between the near infrared ray absorbing layer 72 and the antireflection film 73. Examples of the silane coupling agent which may be used include aminosilanes such as γ-aminopropyltriethoxysilane, N-β-(aminoethyl)-γ-aminopropyltrimethoxysilane, N-β-(aminoethyl)-N'-β-(aminoethyl)-γ-aminopropyltriethoxysilane, and γ-anilinopropyltrimethoxysilane, epoxysilanes such as γ-glycidoxypropyltrimethoxysilane and β-(3,4-epoxycyclohexyl)ethyltrimethoxysilane, vinylsilanes such as vinyltrimethoxysilane and N-β-(N-vinylbenzylaminoethyl)-γ-aminopropyltrimethoxysilane, γ-methacryloxypropyltrimethoxysilane, γ-chloropropyltrimethoxysilane, γ-mercaptopropyltrimethoxysilane, and the like.

In the case of using a lens made of a plastic as the lens main body 71, it is preferable to subject the lens surface to a corona treatment or an easy adhesion treatment before forming the near infrared ray absorbing layer 72 or the antireflection film 73.

In the case where the imaging device lens 70A or 70B of the present embodiment has the near infrared ray absorbing layer 72 in combination with the above-described selective wavelength shielding layer having optical properties of transmitting visible light of from 420 to 695 nm therethrough and shielding light in a wavelength region of from 710 to 1,100 nm, a near infrared ray cut filter which has been conventionally disposed as a separate body may be omitted, so that downsizing, slimming and lost costs of an imaging device may be achieved.

The near infrared ray absorbing layer 72 has such properties that the transmittance of light in a visible wavelength region is high and the transmittance changes steeply in a wavelength range of from 630 to 700 nm due to optical properties of the contained NIR absorbing dye (A), and further has such properties that the light shielding wavelength region is wide to an extent of from 695 to 720 nm due to an action of the transparent resin (B) combined therewith. Since this near infrared ray absorbing layer 72 is present, the imaging device lenses 70A and 70B of the present embodiment having optical properties in which the light absorption properties of the above-described NIR absorbing dye (A) are effectively utilized are obtainable.

In the imaging device lenses 70A and 70B of the present embodiment, since this near infrared ray absorbing layer 72 is used together with other selective wavelength shielding layer, particularly the above-described selective wavelength shielding layer having optical properties of transmitting visible light of from 420 to 695 nm therethrough and shielding light in a wavelength region of from 710 to 1,100 nm, an imaging device lens having excellent near infrared ray shielding properties in which the light absorption properties of the above-described NIR absorbing dye (A) are effectively utilized can be realized.

Furthermore, even in the case where the imaging device lens 70A or 70B does not contain the above-described selective wavelength shielding layer having the optical properties transmitting visible light of from 420 to 695 nm therethrough and shielding light in a wavelength region of from 710 to 1,100 nm, by which a near infrared ray cut filter function is exhibited by using together with the near infrared ray absorbing layer 72, in an imaging device using the imaging device lens 70A or 70B, by providing the above-described selective wavelength shielding layer on other optical member configuring the imaging device together with the imaging device lens 70A or 70B, an imaging device having excellent near infrared ray shielding properties in which the light absorption properties of the above-described NIR absorbing dye (A) are effectively utilized can be realized.

In addition, since the near infrared ray absorbing layer 72 can be formed by coating a coating liquid prepared by dispersing or dissolving the NIR absorbing dye (A) and the transparent resin (B) or the raw material component of the transparent resin (B) and other component blended as the need arises in a solvent, on the principal surface of the lens main body 71, drying, and if desired, further subjecting to a curing treatment, the imaging device lens 70 may be manufactured easily and at low costs. Furthermore, in the case where the selective wavelength shielding layer which is preferably used in combination with the near infrared ray absorbing layer 72 is a layer in which various absorbers other than the above-described NIR absorbing dye (A), such as a near infrared ray or infrared ray absorber, a color tone correcting dye, an ultraviolet ray absorber, etc., are dispersed in a transparent resin, it may also be formed in the same step as that in the near infrared ray absorbing layer 72, so that it can be manufactured easily and at low costs. Furthermore, the dielectric multilayered film can also be manufactured by a thoroughly known method and can be easily fabricated.

For that reason, the imaging device lenses 70A and 70B of the present embodiment may have optical properties in which the light absorption properties of the above-described NIR absorbing dye (A) are effectively utilized along with the functions as an imaging device lens, and by using this, an imaging device in which not only downsizing, slimming, and lost costs are achieved, but the quality of an imaged image is excellent is obtainable.

Fourth Embodiment

Figure 7:
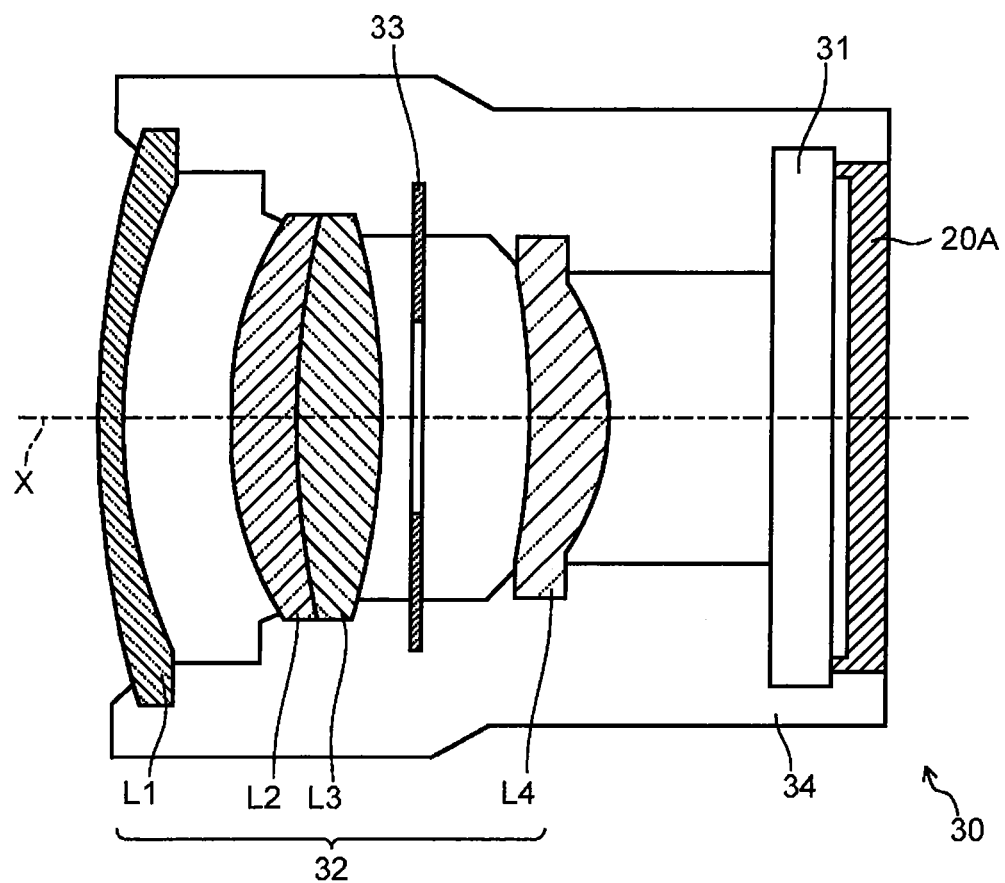
FIG. 7 This is a cross-sectional view showing an example of an imaging device using a solid-state imaging element of an embodiment of the present invention.

FIG. 7 is a cross-sectional view showing diagrammatically a principal part of an example of an imaging device according to the present embodiment using the solid-state imaging element 20A of the above-described second embodiment. As shown in FIG. 7, this imaging device 30 has the solid-state imaging element 20A, a cover glass 31, a group of plural lenses 32, a diaphragm 33, and a housing 34 immobilizing them therein. The group of plural lenses 32 is composed of a first lens L1, a second lens L2, a third lens L3, and a fourth lens L4 disposed toward the imaging surface of the solid-state imaging element 20A. The diaphragm 33 is disposed between the fourth lens L4 and the third lens L3. The solid-state imaging element 20A, the group of lenses 32, and the diaphragm 33 are disposed along the optical axis x.

Incidentally, in the solid-state imaging element 20A, a selective wavelength shielding layer having optical properties of transmitting visible light of from 420 to 695 nm therethrough and shielding light in a wavelength region of from 710 to 1,100 nm is provided on one side or both sides of the near infrared ray absorbing layer 107. Here, the wavelength region in which the light is shielded is more preferably from 710 to 1,200 nm.

In the imaging device 30, the light which has been made incident from the side of a subject goes through the first lens L1, the second lens L2, the third lens L3, the diaphragm 33, the fourth lens L4, and the cover glass 31 and is then received by the solid-state imaging element 20A. The solid-state imaging element 20A converts this received light into an electric signal, which is then outputted as an image signal. In the solid-state imaging element 20A, the near infrared ray absorbing layer 107 is provided, and furthermore, the selective wavelength shielding layer having optical properties of transmitting visible light of from 420 to 695 nm therethrough and shielding light in a wavelength region of from 710 to 1,100 nm is provided on one side or both sides of the near infrared ray absorbing layer 107. Therefore, the light from which the near infrared ray has been shielded is received by the solid-state imaging element 20A.

In the foregoing, the selective wavelength shielding layer may be provided in a form of coming into contact with the principal surface on one side or both sides of the near infrared absorbing layer 107. Alternatively, it may also be provided on any interlayer between the near infrared ray absorbing layer 107 and the photoelectric conversion element 101 within the solid-state imaging element 20A. Furthermore, it may also be provided on the principal surface on one side or both sides of any one member selected from the above-described group of lenses 32 and cover glass 31 as the need arises.

It is preferable that the above-described selective wavelength shielding layer to be used further has optical properties of shielding light in an ultraviolet ray wavelength region of not more than 400 nm, and it is more preferable to have shielding properties of light of not more than 410 nm. In the case where the above-described selective wavelength shielding layer shields light in a near infrared ray region but does not have optical properties of shielding light in an ultraviolet ray wavelength region of not more than 400 nm, a selective wavelength shielding layer shielding light in such an ultraviolet ray wavelength region may be provided separately from this. Though the location at which the selective wavelength shielding layer is arranged is not particularly limited, it may be located inside the near infrared ray absorbing layer 107 and on any interlayer between it and the photoelectric conversion element 101. In addition, such a selective wavelength shielding layer may also be provided in two or more places.

Here, examples of a specific combination of the near infrared ray absorbing layer 107 and the selective wavelength shielding layer which the solid-state imaging element 20A has include a combination in which a first dielectric multilayered film having the same optical properties as those described in the above-described second embodiment, the near infrared ray absorbing layer 107, and a second dielectric multilayered film having the same optical properties as those described in the above-described second embodiment are disposed in this order from the far side from the photoelectric conversion element 101. The combination in which these are disposed is as follows.

The first dielectric multilayered film may be provided on any one surface selected from the surface of the near infrared ray absorbing layer 107 which the solid-state imaging element 20A has, namely the principal surface on the side of the cover glass 31 or both principal surfaces of the cover glass 31, both principal surfaces of each of the second to fourth lenses, and the inside principal surface of the first lens. As for the disposition of the second dielectric multilayered film, it may be provided at the location described in the above-described solid-state imaging element 20A.

In the imaging device 30, the case where a solid-state imaging element the same as the solid-state imaging element 20A, except for not having the near infrared ray absorbing layer 107, is used, and instead thereof, the imaging device lens 70A having the near infrared ray absorbing layer 72 in the above-described third embodiment is arranged in place of the fourth lens L4 is described. In this imaging device, the imaging device lens 70A is disposed in such a manner that the near infrared ray absorbing layer 72 which this lens has is located on the far side from the solid-state imaging element. In that case, in the imaging device lens 70A, the above-described second dielectric multilayered film may be disposed on the principal surface on the opposite side to the side on which the near infrared ray absorbing layer 72 is present in place of the above-described antireflection film 73. Alternatively, the second dielectric multilayered film may be arranged on any one principal surface of the lens 32, any one principal surface of the cover glass 31, or the principal surface of the solid-state imaging element on the side of the cover glass 31 or the inside of the solid-state imaging device outer than the photoelectric conversion element, for example, on the outside of the above-describe flattened layer.

On the other hand, the first dielectric multilayered film may be arranged on any one surface selected from the principal surface of the near infrared ray absorbing layer 72 which the imaging device lens 70A has, on the opposite side to the imaging element, namely the principal surface on the side of the third lens L3, or both principal surfaces in the second lens L2 and third lens L3, and the principal surface of the inside of the first lens.

In addition, the imaging device 30 may also be configured in such a manner that a solid-state imaging element the same as the solid-state imaging element 20A, except for not having the near infrared ray absorbing layer 107, is used, and instead thereof, for example, the optical filter 10A or 10B having the near infrared ray absorbing layer 11 in the above-described first embodiment is arranged in place of the cover glass 31. In the case of using the optical filter 10A, it is disposed in such a manner that the near infrared absorbing layer 11 is located on the principal surface on the near side to the solid-state imaging element. In that case, the above-described dielectric multilayered film may be disposed on the principal surface of the near infrared ray absorbing layer 11 of the optical filter 10A on the side of the solid-state imaging element. Alternatively, the second dielectric multilayered film may be arranged on the principal surface of the solid-state imaging element on the side of the optical filter 10A or the inside of the solid-state imaging device outer than the photoelectric conversion element, for example, on the outside of the above-describe flattened layer.

On the other hand, the first dielectric multilayered film may be arranged on any one surface selected from the principal surface of the transparent base material 12 which the optical filter 70A has, on the opposite side to the solid-state imaging element, namely the principal surface on the side of the fourth lens L4, or both principal surfaces in the second lens L2, third lens L3 and forth lens L4, and the principal surface of the inside of the first lens.

In the case of using an optical filter having a combination of the above-described near infrared ray absorbing layer, the first dielectric multilayered film, and the second dielectric multilayered film as in the optical filter 10B, the optical filter 10B and the like are arranged in the imaging device 30 so as to have a disposition order as described in the foregoing (i) to (iii).

As described above, due to optical properties of the NIR absorbing dye (A) contained in the near infrared ray absorbing layer 107 which the solid-state imaging element 20A has, the near infrared ray absorbing layer 72 which the imaging device lens 70A has, or the near infrared ray absorbing layer 11 which the optical filter 10A or 10B has, properties such that the transmittance of light in a visible wavelength region is high and the transmittance changes steeply in a wavelength range of from 630 to 700 nm are revealed, and furthermore, due to an action of the transparent resin (B) combined therewith, properties that the light shielding wavelength region is wide to an extent of from 695 to 720 nm are revealed. Accordingly, since the solid-state imaging element 20A, the imaging device lens 70A, and the optical filter 10A and 10B, which the imaging device according to the present embodiment has, have a near infrared ray absorbing layer, optical properties in which the light absorption properties of the above-described NIR absorbing dye (A) are effectively utilized are revealed.

In this way, when the solid-state imaging element 20A, the imaging device lens 70A, and the optical filter 10A and 10B have a combination of this near infrared ray absorbing layer with other selective wavelength shielding layer, particularly the above-described selective wavelength shielding layer having optical properties of transmitting visible light of from 420 to 695 nm therethrough and shielding light in a wavelength region of from 710 to 1,100 nm, a solid-state imaging element and an imaging device lens each having excellent near infrared ray shielding properties in which the light absorption properties of the above-described NIR absorbing dye (A) are effectively utilized can be realized. In consequence, in the imaging device according to the present embodiment containing such a solid-state imaging element 20A or imaging device lens 70A, or the optical filter 10A or 10B provided in place of the cover glass 31, a near infrared ray cut filter which has been conventionally disposed as a separate body can be omitted, so that not only it may be possible to contrive to achieve downsizing, slimming and lost costs of an imaging device, but also an imaged image with good quality is obtainable.

In addition, as described above, the imaging device according to the present embodiment may also be configured in such a manner that it has the solid-state imaging element 20A or imaging device lens 70A containing the above-described near infrared absorbing layer, and furthermore, the other selective wavelength shielding layer combined with this near infrared ray absorbing layer, particularly the above-described selective wavelength shielding layer having optical properties of transmitting visible light of from 420 to 695 nm therethrough and shielding light in a wavelength region of from 710 to 1,100 nm, is arranged on an optical member disposed separately from the solid-state imaging element 20A or imaging device lens 70A along the optical axis x of the imaging device.

By taking such a configuration, an imaging device according to the present embodiment having excellent near infrared ray shielding properties in which the light absorption properties of the above-described NIR absorbing dye (A) are effectively utilized is obtainable. Even in that case, a near infrared ray cut filter which has been conventionally disposed as a separate body can be omitted, so that not only it may be possible to contrive to achieve downsizing, slimming and lost costs of an imaging device, but also an imaged image with good quality is obtainable.

In addition, the imaging device using the solid-state imaging element of the present embodiment is not limited to one having the structure shown in FIG. 7 but may be applied to imaging devices of various structures so long as they include a solid-state imaging element.

EXAMPLES

The present invention is hereunder described in more detail by reference to the following Examples. Examples 1 to 7 and Examples 10 to 16 are concerned with a working example, and Examples 8 and 9 and Examples 17 and 18 are concerned with a comparative example.

Incidentally, the transmittance and the amount of change D of transmittance in the Examples were measured by the following methods.

[Transmittance and Amount of Change D or Df of Transmittance]

With respect to the near infrared ray absorbing layer and the optical filter, a transmission spectrum (transmittance) was measured by using an ultraviolet-visible spectrophotometer (Model U-4100, manufactured by Hitachi High-Technologies Corporation) and calculated.

[Manufacture of Optical Filter]

Optical filters of the working examples and comparative examples, each having a configuration in which the near infrared ray absorbing layer 11 was formed on the transparent substrate base material 12 as shown in FIG. 1(*a*), by using, as the NIR absorbing dye (A), the NIR absorbing dye (A1) shown in the foregoing Table 1 and the NIR absorbing dye (A2) shown in the foregoing Table 2, respectively.

Example 1

Only the NIR absorbing dye (A1) was used as the NIR absorbing dye (A). Compound (F12-1) shown in Table 1 as the NIR absorbing dye (A1) and a 50% by mass tetrahydrofuran solution of an acrylic resin (a trade name: OGSOL EA-F5503, manufactured by Osaka Gas Chemicals Co., Ltd., refractive index: 1.60) were mixed in a proportion such that the amount of the Compound (F12-1) was 0.23 parts by mass based on 100 parts by mass of the acrylic resin, and were stirred and dissolved at room temperature, thereby obtaining a coating liquid. The obtained coating liquid was coated on a glass plate (soda glass) having a thickness of 1 mm by a die coating method and then heat dried at 100° C. for 5 minutes. Thereafter, the coating film was cured upon irradiation with 360 mJ/cm$^2$ of an ultraviolet ray having a wavelength of 365 nm, thereby obtaining Optical Filter 1 in which a near infrared ray absorbing layer having a film thickness of 10 μm was formed on the glass plate. The transmittance of the obtained Optical Filter 1 was measured. A result obtained by subtracting, from the result of the transmission, a measurement result of the transmittance measured on a glass plate having a thickness 1 mm on which no near infrared ray absorbing layer was formed is shown in Table 3.

Example 2

Optical Filter 2 in which a near infrared ray absorbing layer having a film thickness of 10 μm was formed on the glass plate was obtained in the same manner as that in Example 1, except for using, as the NIR absorbing dye (A1), Compound (F12-2) shown in the foregoing Table 1. The transmittance of the obtained Optical Filter 2 was measured. A result obtained by subtracting, from the result of the transmission, a measurement result of the transmittance measured on a glass plate having a thickness 1 mm in which no near infrared ray absorbing layer was formed is shown in Table 3.

Example 3

Optical Filter 3 in which a near infrared ray absorbing layer having a film thickness of 10 μm was formed on the glass plate was obtained in the same manner as that in Example 1, except for using, as the NIR absorbing dye (A1), Compound (F12-4) shown in the foregoing Table 1 and changing the proportion such that the amount of the Compound (F12-4) was 0.23 parts by mass based on 100 parts by mass of the acrylic resin. The transmittance of the obtained Optical Filter 3 was measured. A result obtained by subtracting, from the result of the transmission, a measurement result of the transmittance measured on a glass plate having a thickness 1 mm in which no near infrared ray absorbing layer was formed is shown in Table 3.

Example 4

Optical Filter 4 in which a near infrared ray absorbing layer having a film thickness of 10 μm was formed on the glass plate was obtained in the same manner as that in Example 4, except for using, as the NIR absorbing dye (A1), Compound (F12-5) shown in the foregoing Table 1. The transmittance of the obtained Optical Filter 4 was measured. A result obtained by subtracting, from the result of the transmission, a measurement result of the transmittance measured on a glass plate having a thickness 1 mm in which no near infrared ray absorbing layer was formed is shown in Table 3.

Example 5

Optical Filter 5 in which a near infrared ray absorbing layer having a film thickness of 3 μm was formed on the glass plate was obtained in the same manner as that in Example 1, except for using, as the NIR absorbing dye (A1), Compound (F11-1) shown in the foregoing Table 1 and changing the proportion such that the amount of the Compound (F11-1) was 1.2 parts by mass based on 100 parts by mass of the acrylic resin. The transmittance of the obtained Optical Filter 5 was measured. A result obtained by subtracting, from the result of the transmission, a measurement result of the transmittance measured on a glass plate having a thickness 1 mm in which no near infrared ray absorbing layer was formed is shown in Table 3.

Figure 9:
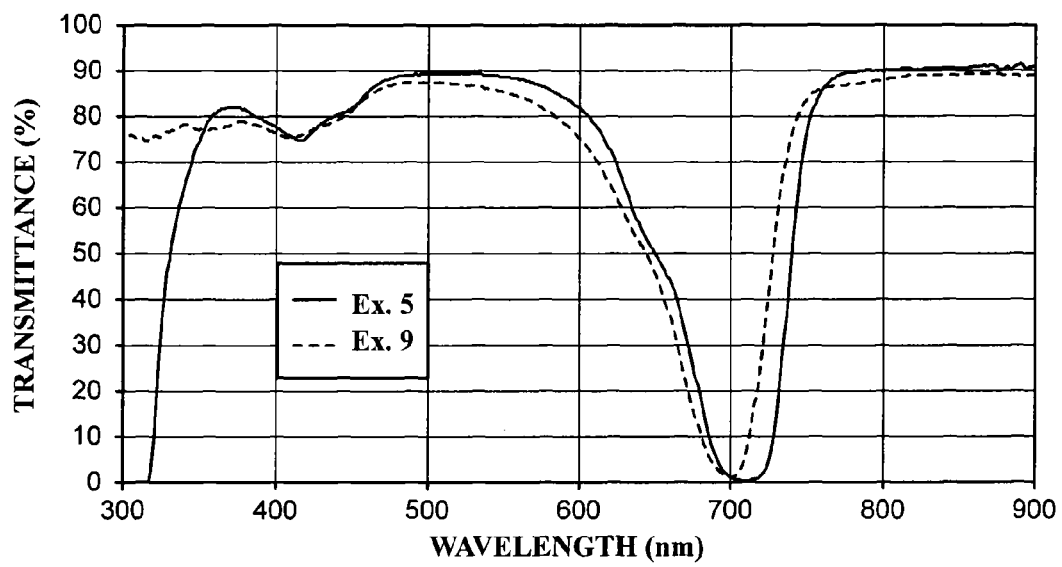
FIG. 9 This is a graph showing a transmission spectrum of a near infrared ray absorbing layer in each of a working example and a comparative example of the present invention.

In addition, the transmission spectrum in a wavelength region of from 300 to 900 nm is expressed by a solid line in FIG. 9.

Example 6

Only the NIR absorbing dye (A1) was used as the NIR absorbing dye (A). Compound (F11-1) shown in the foregoing Table 1 as the NIR absorbing dye (A1) and a 10% by mass cyclopentanone solution of a polycarbonate resin (a sample name: Lexan ML9103, manufactured by Sabic, refractive index: 1.59) were mixed in a proportion such that the amount of the Compound (F11-1) was 0.45 parts by mass based on 100 parts by mass of the polycarbonate resin, and were stirred and dissolved at room temperature, thereby obtaining a coating liquid. The obtained coating liquid was coated on a glass plate (soda glass) having a thickness of 1 mm by a die coating method and then heat dried at 150° C. for 30 minutes, thereby obtaining Optical Filter 6 in which a near infrared ray absorbing layer having a film thickness of 10 μm was formed on the glass plate. The transmittance of the obtained Optical Filter 6 was measured. A result obtained by subtracting, from the result of the transmission, a measurement result of the transmittance measured on a glass plate having a thickness 1 mm in which no near infrared ray absorbing layer was formed is shown in Table 3.

Example 7

The NIR absorbing dye (A1) and the NIR absorbing dye (A2) were used as the NIR absorbing dye (A). Compound (F12-1) shown in the foregoing Table 1 as the NIR absorbing dye (A1), Compound (F21) shown in the foregoing Table 2 as the NIR absorbing dye (A2) and a 20% by mass cyclohexanone solution of a polyester resin (a trade name: B-OKP2, manufactured by Osaka Gas Chemicals Co., Ltd., refractive index: 1.64) were mixed in a proportion such that the amount of the Compound (F12-1) was 0.08 parts by mass and the amount of the Compound (F21) was 2.1 parts by mass based on 100 parts by mass of the polyester resin, and were stirred and dissolved at room temperature, thereby obtaining a coating liquid. The obtained coating liquid was coated on a glass plate (soda glass) having a thickness of 1 mm by a die coating method and then heat dried at 150° C. for 30 minutes, thereby obtaining Optical Filter 7 in which a near infrared ray absorbing layer having a film thickness of 10 μm was formed on the glass plate. The transmittance of the obtained Optical Filter 7 was measured. A result obtained by subtracting, from the result of the transmission, a measurement result of the transmittance measured on a glass plate having a thickness 1 mm in which no near infrared ray absorbing layer was formed is shown in Table 3.

Example 8

Only the NIR absorbing dye (A1) was used as the NIR absorbing dye (A). Compound (F11-1) shown in the foregoing Table 1 as the NIR absorbing dye (A1) and a 15% by mass cyclohexanone solution of an acrylic resin (a trade name: BR-80, manufactured by Mitsubishi Rayon Co., Ltd., refractive index: 1.49) were mixed in a proportion such that the amount of the Compound (F11-1) was 0.45 parts by mass based on 100 parts by mass of the acrylic resin, and were stirred and dissolved at room temperature, thereby obtaining a coating liquid. The obtained coating liquid was coated on a glass plate (soda glass) having a thickness of 1 mm by a die coating method and then heat dried at 150° C. for 30 minutes, thereby obtaining Optical Filter 8 in which a near infrared ray absorbing layer having a film thickness of 10 μm was formed on the glass plate. The transmittance of the obtained Optical Filter 8 was measured. A result obtained by subtracting, from the result of the transmission, a measurement result of the transmittance measured on a glass plate having a thickness 1 mm in which no near infrared ray absorbing layer was formed is shown in Table 3.

Example 9

Only the NIR absorbing dye (A1) was used as the NIR absorbing dye (A). Compound (F11-1) shown in the foregoing Table 1 as the NIR absorbing dye (A1) and a 25% by mass toluene solution of a cycloolefin resin (a trade name: ARTON RH5200, manufactured by JSR Corporation, refractive index: 1.52) were mixed in a proportion such that the amount of the Compound (F11-1) was 0.2 parts by mass based on 100 parts by mass of the cycloolefin resin, and were stirred and dissolved at room temperature, thereby obtaining a coating liquid. The obtained coating liquid was coated on a glass plate (soda glass) having a thickness of 1 mm by a die coating method, heated at 70° C. for 10 minutes, and then further heated for drying at 110° C. for 10 minutes, thereby obtaining Optical Filter 9 in which a near infrared ray absorbing layer having a film thickness of 22 μm was formed on the glass plate. The transmittance of the obtained Optical Filter 9 was measured. A result obtained by subtracting, from the result of the transmission, a measurement result of the transmittance measured on a glass plate having a thickness 1 mm in which no near infrared ray absorbing layer was formed is shown in Table 3.

In addition, the transmission spectrum in a wavelength region of from 300 to 900 nm is expressed by a broken line in FIG. 9.

TABLE 3

| | | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| NIR absorbing dye (A) | NIR absorbing dye (A1) | Compound code | F12-1 | F12-2 | F12-4 | F12-5 | F11-1 | F11-1 | F12-1 | F11-1 | F11-1 |
| | | Parts by mass | 0.23 | 0.23 | 0.23 | 0.23 | 1.2 | 0.45 | 0.08 | 0.45 | 0.2 |
| | NIR absorbing dye (A2) | Compound code | — | — | — | — | — | — | F21 | — | — |
| | | Parts by mass | — | — | — | — | — | — | 2.1 | — | — |
| Transparent resin | Transparent resin (B) | Type | EA-F5003 | EA-F5003 | EA-F5003 | EA-F5003 | EA-F5003 | Lexan ML9103 | B-OKP2 | — | — |
| | | Refractive index | 1.60 | 1.60 | 1.60 | 1.60 | 1.60 | 1.59 | 1.64 | — | — |
| | Transparent resin (B)' | Type | — | — | — | — | — | — | — | BR-80 | ARTON RH5200 |

TABLE 3-continued

|  |  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
|  |  | Refractive index | — | — | — | — | — | — | — | 1.49 | 1.52 |
| Light absorption properties | Transmittance (%) | 630 nm | 74.5 | 72.1 | 73.5 | 73.5 | 67.3 | 61.0 | 63.8 | 25.8 | 59.8 |
|  |  | 700 nm | 4.1 | 4.0 | 2.4 | 2.4 | 1.1 | 0.7 | 6.6 | 0.6 | 0.5 |
|  |  | 450 to 600 nm | 81.9 | 79.7 | 82.4 | 82.4 | 88.5 | 81.6 | 80.8 | 65.7 | 81.2 |
|  |  | 695 to 720 nm | 9.0 | 8.7 | 5.4 | 5.4 | 3.4 | 3.1 | 9.0 | 12.0 | 23.9 |
|  | Amount of change D (%/nm) |  | −1.01 | −0.97 | −1.02 | −0.94 | −0.95 | −0.86 | −0.82 | −0.36 | −0.85 |

[Design of Optical Filter]

Optical filters of Examples 10 to 18 having a configuration in which the first dielectric multilayered film 13a, the near infrared absorbing layer 11, and the second dielectric multilayered film 13b were stacked in this order as shown in FIG. 1(b) were designed using the Optical Filters 1 to 9 including the near infrared ray absorbing layer fabricated in Examples 1 to 9, respectively.

Examples 10 to 18

The dielectric multilayered films were all designed in the same manner in Examples 10 to 18. For both of the first dielectric multilayered film and the second dielectric multilayered film, a $TiO_2$ film was supposed as the high refractive index dielectric film, and an $SiO_2$ film was supposed as the low refractive index dielectric film. Specifically, the $TiO_2$ film and the $SiO_2$ film were fabricated, respectively as a sample by means of reactive sputtering by introducing an Ar gas and an $O_2$ gas into a magnetron sputtering apparatus by using a target of Ti or Si. An optical constant of each of the obtained $TiO_2$ film and $SiO_2$ film was determined by the measurement of spectral transmittance.

Figure 8:
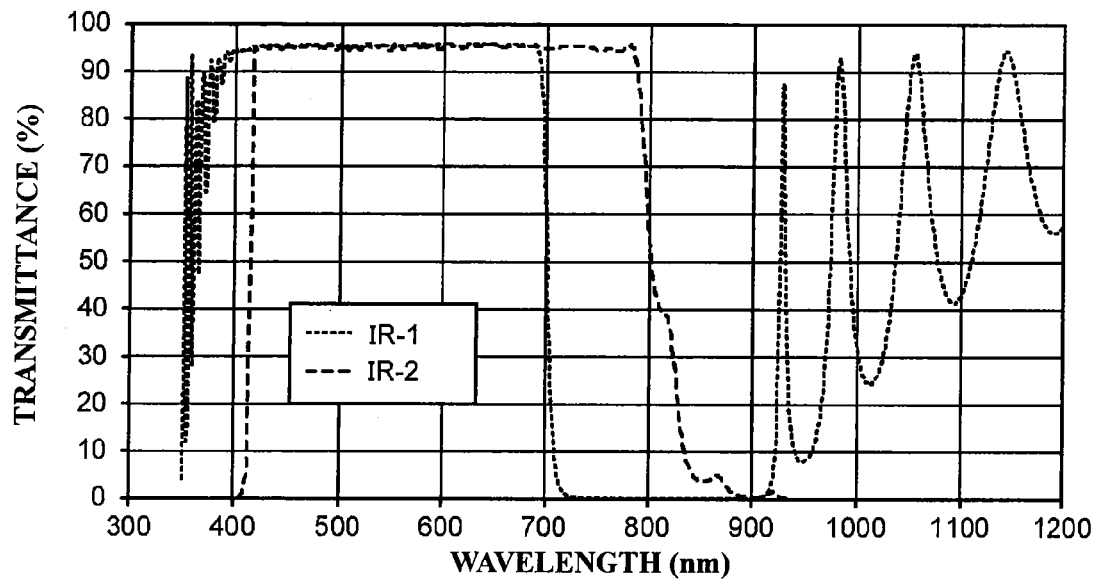
FIG. 8 This is a graph showing a transmission spectrum of a selective wavelength shielding layer used in combination with a near infrared ray absorbing layer according to an embodiment of the present invention.
Figure 8:
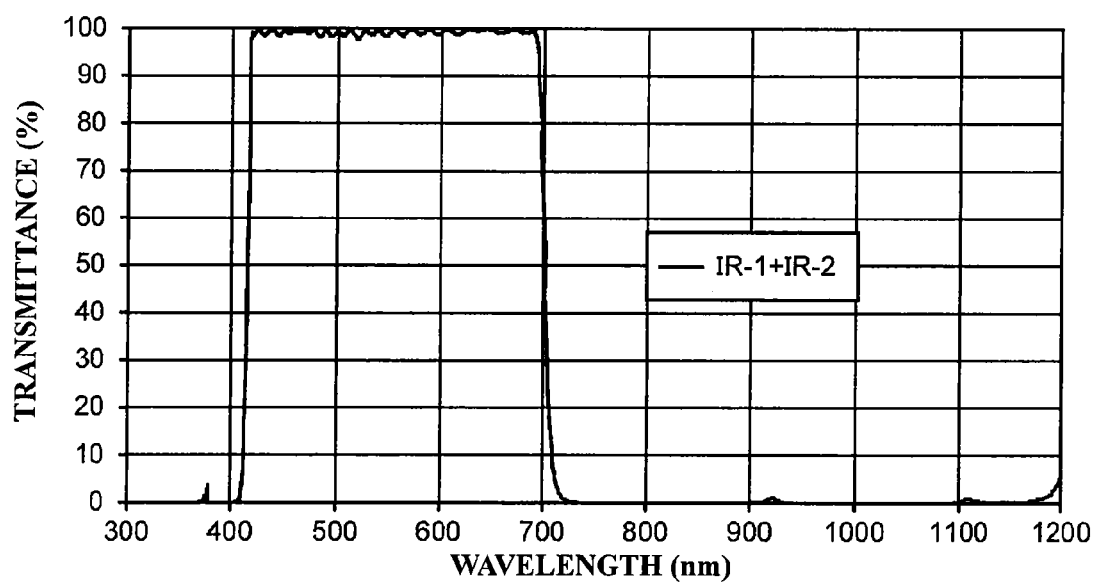

In the configuration in which dielectric multilayered films in which a high refractive index dielectric film and a low refractive index dielectric film were stacked alternately each other were formed, the simulation was conducted while using, as parameters, the stacking number of dielectric multilayered films, the film thickness of the $TiO_2$ film (high refractive index dielectric film), and the film thickness of the $SiO_2$ film (low refractive index dielectric film), thereby determining the configuration of the first dielectric multilayered film so as to transmit 90% or more of light having a wavelength of from 400 to 700 nm therethrough and have a transmittance of light having a wavelength of from 715 to 900 nm of not more than 5%. The configuration of the obtained first dielectric multilayered film is shown in Table 4, and a transmittance spectrum of this first dielectric multilayered film is expressed as IR-1 by a dotted line in FIG. 8(a). Incidentally, in the first dielectric multilayered film, the first layer was set up so as to be formed on the side of the near infrared ray absorbing layer, and the film thickness of the whole was 3,536 nm.

TABLE 4

| Layer No. | Material | Film thickness (nm) |
|---|---|---|
| 1 | $TiO_2$ film | 11.47 |
| 2 | $SiO_2$ film | 33.36 |
| 3 | $TiO_2$ film | 108.84 |
| 4 | $SiO_2$ film | 159.96 |

TABLE 4-continued

| Layer No. | Material | Film thickness (nm) |
|---|---|---|
| 5 | $TiO_2$ film | 91.67 |
| 6 | $SiO_2$ film | 149.29 |
| 7 | $TiO_2$ film | 87.63 |
| 8 | $SiO_2$ film | 146.87 |
| 9 | $TiO_2$ film | 86.23 |
| 10 | $SiO_2$ film | 144.69 |
| 11 | $TiO_2$ film | 86.09 |
| 12 | $SiO_2$ film | 144.11 |
| 13 | $TiO_2$ film | 85.75 |
| 14 | $SiO_2$ film | 144.19 |
| 15 | $TiO_2$ film | 85.47 |
| 16 | $SiO_2$ film | 144.41 |
| 17 | $TiO_2$ film | 85.04 |
| 18 | $SiO_2$ film | 144.7 |
| 19 | $TiO_2$ film | 85.5 |
| 20 | $SiO_2$ film | 145.04 |
| 21 | $TiO_2$ film | 85.79 |
| 22 | $SiO_2$ film | 145.63 |
| 23 | $TiO_2$ film | 86.04 |
| 24 | $SiO_2$ film | 145.56 |
| 25 | $TiO_2$ film | 87.01 |
| 26 | $SiO_2$ film | 147.6 |
| 27 | $TiO_2$ film | 88.88 |
| 28 | $SiO_2$ film | 150.87 |
| 29 | $TiO_2$ film | 93.06 |
| 30 | $SiO_2$ film | 156.06 |
| 31 | $TiO_2$ film | 97.72 |
| 32 | $SiO_2$ film | 81.07 |

Similar to the foregoing, in the configuration in which dielectric multilayered films in which a high refractive index dielectric film and a low refractive index dielectric film were stacked alternately each other were formed, the simulation was conducted while using, as parameters, the stacking number of dielectric multilayered films, the film thickness of the $TiO_2$ film (high refractive index dielectric film), and the film thickness of the $SiO_2$ film (low refractive index dielectric film), thereby determining the configuration of the second dielectric multilayered film so as to transmit 90% or more of light having a wavelength of from 420 to 780 nm therethrough and have a transmittance of each of light having a wavelength of not more than 410 nm and light of from 850 to 1,200 nm of not more than 5%. The configuration of the obtained second dielectric multilayered film is shown in Table 5, and a transmittance spectrum of this second dielectric multilayered film is expressed as IR-2 by a broken line in FIG. 8(a). Incidentally, in the second dielectric multilayered film, the first layer was set up so as to be formed on the side of the near infrared ray absorbing layer, and the film thickness of the whole was 4,935 nm. In addition, the transmittance spectrum in the case of stacking the above-described first dielectric multilayered film and second dielectric multilayered film is expressed as "IR-1+IR-2" by a solid line in FIG. 8(b).

TABLE 5

| Layer No. | Material | Film thickness (nm) |
|---|---|---|
| 1 | $TiO_2$ film | 15.54 |
| 2 | $SiO_2$ film | 34.25 |
| 3 | $TiO_2$ film | 125.72 |
| 4 | $SiO_2$ film | 186.08 |
| 5 | $TiO_2$ film | 117.87 |
| 6 | $SiO_2$ film | 189.31 |
| 7 | $TiO_2$ film | 119.25 |
| 8 | $SiO_2$ film | 190.84 |
| 9 | $TiO_2$ film | 121.11 |
| 10 | $SiO_2$ film | 190.78 |
| 11 | $TiO_2$ film | 119.73 |
| 12 | $SiO_2$ film | 190.19 |
| 13 | $TiO_2$ film | 121.31 |
| 14 | $SiO_2$ film | 190.03 |
| 15 | $TiO_2$ film | 120.16 |
| 16 | $SiO_2$ film | 189.49 |
| 17 | $TiO_2$ film | 118.82 |
| 18 | $SiO_2$ film | 188.83 |
| 19 | $TiO_2$ film | 117.79 |
| 20 | $SiO_2$ film | 184.04 |
| 21 | $TiO_2$ film | 112.75 |
| 22 | $SiO_2$ film | 175.14 |
| 23 | $TiO_2$ film | 105 |
| 24 | $SiO_2$ film | 167.35 |
| 25 | $TiO_2$ film | 103.17 |
| 26 | $SiO_2$ film | 164.8 |
| 27 | $TiO_2$ film | 101.29 |
| 28 | $SiO_2$ film | 164.42 |
| 29 | $TiO_2$ film | 101.53 |
| 30 | $SiO_2$ film | 165 |
| 31 | $TiO_2$ film | 101.31 |
| 32 | $SiO_2$ film | 167.99 |
| 33 | $TiO_2$ film | 105.43 |
| 34 | $SiO_2$ film | 172.9 |
| 35 | $TiO_2$ film | 108.56 |
| 36 | $SiO_2$ film | 87.54 |

Figure 10:
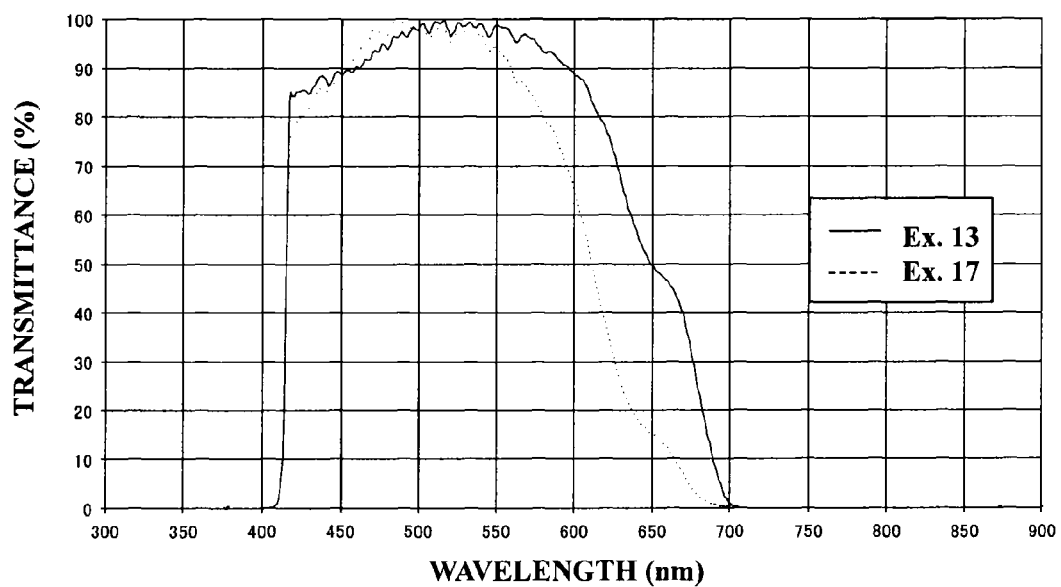
FIG. 10 This is a graph showing a transmission spectrum of each of a working example and a comparative example of the present invention.
Figure 11:
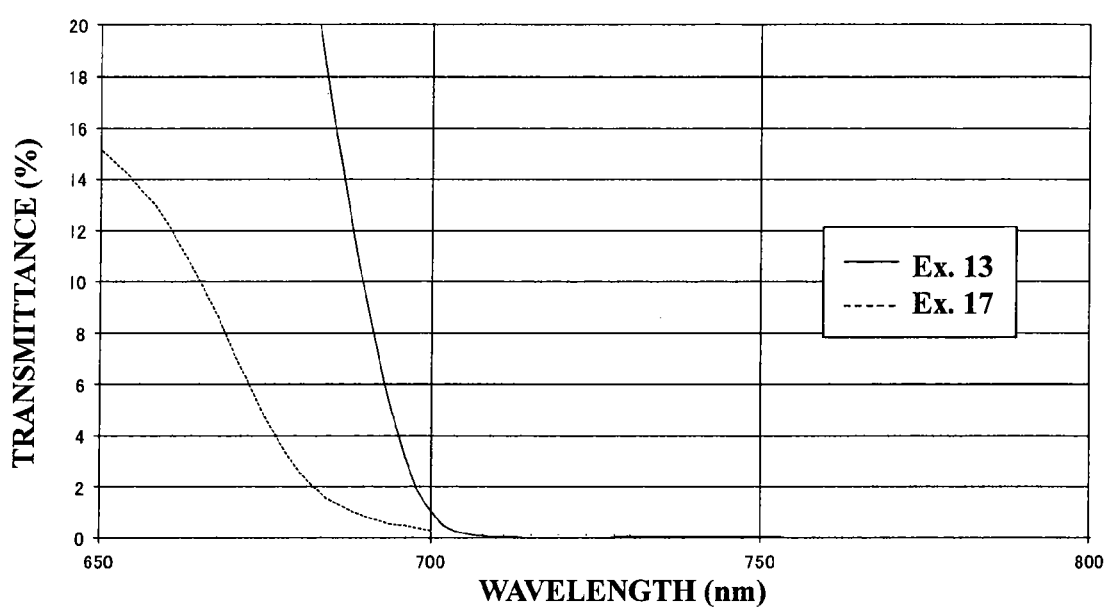
FIG. 11 This is a graph showing enlargedly a near infrared wavelength region of the transmission spectrum of FIG. 10.

With respect to the above-described designed optical filters of Examples 10 to 18, the transmittance spectrum was prepared. Table 6 shows a specification and optical properties of these optical filters. With respect to the optical filters of Examples 13 and 17, the transmittance spectrum (0 to 100%) in a wavelength region of from 300 to 900 nm is shown in FIG. 10, and the transmittance spectrum (0 to 20%) in a wavelength region of from 650 to 800 nm is shown in FIG. 11. In FIGS. 10 and 11, the solid line shows the transmittance spectrum of Example 13, and the broken line shows the transmittance spectrum of Example 17, respectively.

TABLE 6

| | | | | Ex. 10 | Ex. 11 | Ex. 12 |
|---|---|---|---|---|---|---|
| Near infared absorbing layer | NIR absorbing dye (A) | NIR absorbing dye (A1) | Compound code | F12-1 | F12-2 | F12-4 |
| | | | Parts by mass | 0.23 | 0.23 | 0.23 |
| | | NIR absorbing dye (A2) | Compound code | — | — | — |
| | | | Parts by mass | — | — | — |
| | Transparent resin | Transparent resin (B) | Type | EA-F5003 | EA-F5003 | EA-F5003 |
| | | | Refractive index | 1.60 | 1.60 | 1.60 |
| | | Transparent resin (B)' | Type | — | — | — |
| | | | Refractive index | — | — | — |
| | First dielectric multilayered film | | | Alternately stacked film of $TiO_2/SiO_2$ (total layer number: 32, film thickness: 3,536 nm) | | |
| | Second dielectric multilayered film | | | Alternately stacked film of $TiO_2/SiO_2$ (total layer number: 36, film thickness: 4,935 nm) | | |
| Optical filter | Light absorption properties | Transmittance (%) | 630 nm | 74.1 | 71.7 | 73.2 |
| | | | 700 nm | 2.1 | 2.1 | 1.2 |
| | | | 710 nm | 0.1 | 0.1 | 0.0 |
| | | | 420 to 620 nm | 77.7 | 75.3 | 72.3 |
| | | | 710 to 860 nm | 0.06 | 0.06 | 0.04 |
| | | Amount of change Df (%/nm) | | −1.028 | −0.995 | −1.028 |

| | | | | Ex. 13 | Ex. 14 |
|---|---|---|---|---|---|
| | Near infared absorbing layer | NIR absorbing dye (A) | NIR absorbing dye (A1) | Compound code | F12-5 | F11-1 |
| | | | Parts by mass | 0.23 | 1.2 |
| | | NIR absorbing dye (A2) | Compound code | — | — |
| | | | Parts by mass | — | — |
| | Transparent resin | Transparent resin (B) | Type | EA-F5003 | EA-F5003 |
| | | | Refractive index | 1.60 | 1.60 |
| | | Transparent resin (B)' | Type | — | — |
| | | | Refractive index | — | — |
| | First dielectric multilayered film | | | Alternately stacked film of $TiO_2/SiO_2$ (total layer number: 32, film thickness: 3,536 nm) | |
| | Second dielectric multilayered film | | | Alternately stacked film of $TiO_2/SiO_2$ (total layer number: 36, film thickness: 4,935 nm) | |
| Optical filter | Light absorption properties | Transmittance (%) | 630 nm | 67.3 | 67.0 |
| | | | 700 nm | 1.0 | 0.6 |
| | | | 710 nm | 0.0 | 0.0 |

TABLE 6-continued

|  |  |  |  |  |  |
|---|---|---|---|---|---|
|  |  |  | 420 to 620 nm | 77.6 | 76.4 |
|  |  |  | 710 to 860 nm | 0.04 | 0.06 |
|  |  |  | Amount of change Df (%/nm) | −0.947 | −0.949 |

|  |  |  |  | Ex. 15 | Ex. 16 |
|---|---|---|---|---|---|
| Near infared absorbing layer | NIR absorbing dye (A) | NIR absorbing dye (A1) | Compound code | F11-1 | F12-1 |
|  |  |  | Parts by mass | 0.45 | 0.08 |
|  |  | NIR absorbing dye (A2) | Compound code | — | F21 |
|  |  |  | Parts by mass | — | 2.1 |
|  | Transparent resin | Transparent resin (B) | Type | Lexan ML9103 | B-OKP2 |
|  |  |  | Refractive index | 1.59 | 1.64 |
|  |  | Transparent resin (B)' | Type | — | — |
|  |  |  | Refractive index | — | — |
|  | First dielectric multilayered film |  |  | Alternately stacked film of $TiO_2/SiO_2$ (total layer number: 32, film thickness: 3,536 nm) | |
|  | Second dielectric multilayered film |  |  | Alternately stacked film of $TiO_2/SiO_2$ (total layer number: 36, film thickness: 4,935 nm) | |
| Optical filter | Light absorption properties | Transmittance (%) | 630 nm | 60.7 | 63.9 |
|  |  |  | 700 nm | 0.4 | 3.7 |
|  |  |  | 710 nm | 0.0 | 0.3 |
|  |  |  | 420 to 620 nm | 70.5 | 70.1 |
|  |  |  | 710 to 860 nm | 0.06 | 0.29 |
|  |  |  | Amount of change Df (%/nm) | −0.862 | −0.860 |

|  |  |  |  | Ex. 17 | Ex. 18 |
|---|---|---|---|---|---|
| Near infared absorbing layer | NIR absorbing dye (A) | NIR absorbing dye (A1) | Compound code | F11-1 | F11-1 |
|  |  |  | Parts by mass | 0.45 | 0.2 |
|  |  | NIR absorbing dye (A2) | Compound code | — | — |
|  |  |  | Parts by mass | — | — |
|  | Transparent resin | Transparent resin (B) | Type | — | — |
|  |  |  | Refractive index | — | — |
|  |  | Transparent resin (B)' | Type | BR-80 | ARTON RH5200 |
|  |  |  | Refractive index | 1.49 | 1.52 |
|  | First dielectric multilayered film |  |  | Alternately stacked film of $TiO_2/SiO_2$ (total layer number: 32, film thickness: 3,536 nm) | |
|  | Second dielectric multilayered film |  |  | Alternately stacked film of $TiO_2/SiO_2$ (total layer number: 36, film thickness: 4,935 nm) | |
| Optical filter | Light absorption properties | Transmittance (%) | 630 nm | 25.7 | 59.5 |
|  |  |  | 700 nm | 0.3 | 0.3 |
|  |  |  | 710 nm | 0.1 | 0.3 |
|  |  |  | 420 to 620 nm | 37.8 | 67.8 |
|  |  |  | 710 to 860 nm | 0.14 | 0.32 |
|  |  |  | Amount of change Df (%/nm) | −0.363 | −0.847 |

It should not be construed that the present invention is limited to the above-described embodiments and working examples, but needless to say, the present invention may be carried out in various modes within the range where the gist of the invention is not deviated.

Incidentally, the present application is based on a Japanese patent application filed on Jun. 6, 2011 (Japanese Patent Application No. 2011-126555), the whole contents of which are incorporated herein by reference.

INDUSTRIAL APPLICABILITY

On the occasion of using solely or in combination with another selective wavelength shielding member, the optical filter of the present invention not only has good near infrared ray shielding properties, but also may achieve sufficient downsizing and slimming. Therefore, it is useful for imaging devices such as a digital still camera, etc., display devices such as a plasma display, etc., glass windows for vehicle (e.g., an automobile, etc.), lamps, and the like. On the occasion of using solely or in combination with another selective wavelength shielding member, the solid-state imaging element of the present invention has a good near infrared ray shielding function together with a function as a solid-state imaging element. Therefore, it is useful for imaging devices such as a small-sized camera, etc., which is installed in an information appliance such as a digital still camera, a digital video camera, a mobile phone, a laptop computer, PDA, etc. On the occasion of using solely or in combination with another selective wavelength shielding member, the imaging device lens of the present invention not only has good near infrared ray shielding properties, but also may achieve sufficient downsizing, slimming and low costs. Therefore, it is useful for imaging devices using a solid-state imaging element, such as a small-sized camera, etc., which is installed in an information appliance such as a digital still camera, a digital video camera, a mobile phone, a laptop computer, PDA, etc.

DESCRIPTIONS OF REFERENCE NUMERALS AND SIGNS 10A, 10B: Optical filter
12: Transparent base material
11, 72, 107: Near infrared ray absorbing layer
13: Selective wavelength shielding layer
7, 13a: First dielectric multilayered film
8, 13b: Second dielectric multilayered film
20A, 20B: Solid-state imaging element
9A, 9B, 30: Imaging device
5, 31: Cover glass
4, 32, 70A, 70B: Imaging device lens
71: Lens main body
101: Photoelectric conversion element
102: Light shielding layer
103: Semiconductor substrate
104: Flattened layer
105: Color filter layer
106: Microlens
L1 to L4: First to fourth lenses

The invention claimed is:

1. An optical filter comprising:
a near infrared ray absorbing layer which comprises:
    a near infrared ray absorbing dye (A); and
    a transparent resin (B), the near infrared ray absorbing dye (A) being dispersed in the transparent resin (B); and
a selective wavelength shielding layer provided on one side or both sides of the near infrared ray absorbing layer, the selective wavelength shielding layer transmitting visible light of from 420 to 695 nm therethrough and shielding light in a wavelength range of from 720 to 1,100 nm,
wherein
the near infrared ray absorbing dye (A) comprises a near infrared ray absorbing dye (A1), an absorption spectrum of the near infrared ray absorbing dye (A1) in a wavelength range of from 400 to 1,000 nm having a maximum absorption peak at a peak wavelength, wherein the absorption spectrum is measured in a state in which the near infrared ray absorbing dye (A1) is dissolved in a solvent for dye having a refractive index ($n_{20}d$) of less than 1.500;
the absorption spectrum of the near infrared ray absorbing dye (A1) satisfies conditions (a) to (c):
(a) the peak wavelength is in a range of from 695 to 720 nm;
(b) a full width at half maximum of the maximum absorption peak is not more than 60 nm; and
(c) when calculated with an absorbance at the peak wavelength being 1, a value obtained by dividing a difference between an absorbance at 630 nm and an absorbance at the maximum absorption peak by a wavelength difference between 630 nm and the peak wavelength (nm) is from 0.010 to 0.050;
the transparent resin (B) has a refractive index ($n_{20}d$) of 1.54 or more; and
the near infrared ray absorbing layer has a transmittance of visible light of from 450 to 600 nm of 70% or more, a transmittance of light in a wavelength range of from 695 to 720 nm of not more than 10%, and an amount of change of transmittance (D) expressed by equation (1) of not more than −0.8:

$$D(\%/nm)=[T_{700}(\%)-T_{630}(\%)]/[700(nm)-630(nm)] \quad (1)$$

wherein
in the equation (1), $T_{700}$ is a transmittance at a wavelength of 700 nm in a transmission spectrum of the near infrared ray absorbing layer; and $T_{630}$ is a transmittance at a wavelength of 630 nm in the transmission spectrum of the near infrared ray absorbing layer.

2. The optical filter according to claim 1, wherein the peak wavelength is in a range of from 700 to 720 nm in the absorption spectrum, and the amount of change of transmittance (D) of not more than −0.86.

3. The optical filter according to claim 1, wherein the near infrared ray absorbing dye (A1) comprises at least one member selected from squarylium compounds represented by formula (F1):

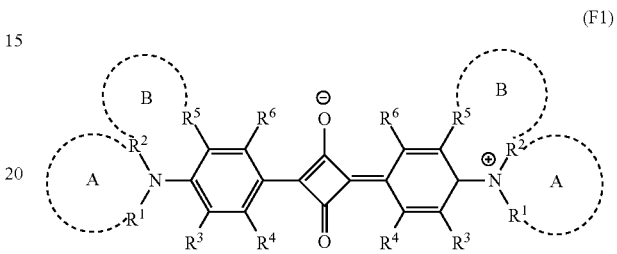

wherein
$R^1$ and $R^2$ are connected to each other to form ring A together with the nitrogen atom, ring A being a heterocyclic ring of a 5-membered or 6-membered ring which may contain an oxygen atom as a ring constituent atom, or $R^2$ and $R^5$ are connected to each other to form ring B together with the nitrogen atom, the carbon atom bonded to the nitrogen atom, and the carbon atom bonded to $R^5$, ring B being a heterocyclic ring of a 5-membered or 6-membered ring which may contain an oxygen atom as a ring constituent atom; $R^1$ that does not form ring A and $R^5$ that does not form ring B each independently represent a hydrogen atom, a fluorine atom, a bromine atom, an alkyl group having from 1 to 6 carbon atoms which may have a substituent, an allyl group which may have a substituent, an aryl group having from 6 to 10 carbon atoms which may have a substituent, or an alaryl group having from 7 to 11 carbon atoms which may have a substituent; and the alkyl group having from 1 to 6 carbon atoms may be any of linear, branched or cyclic;
each of $R^4$ and $R^6$ independently represents a hydrogen atom or —$NR^7R^8$, wherein each of $R^7$ and $R^8$ independently represents a hydrogen atom, an alkyl group having from 1 to 20 carbon atoms, or —C(=O)—$R^9$, and $R^9$ represents an alkyl group having from 1 to 20 carbon atoms or an aryl group having from 6 to 10 carbon atoms which may have a substituent; and
each $R^3$ independently represents a hydrogen atom or an alkyl group having from 1 to 6 carbon atoms.

4. The optical filter according to claim 1, wherein the near infrared ray absorbing dye (A) further comprises a near infrared ray absorbing dye (A2), an absorption spectrum of the near infrared ray absorbing dye (A2) in a wavelength range of from 400 to 1,000 nm having a maximum absorption peak at a peak wavelength, the absorption spectrum being measured in a state in which the near infrared ray absorbing dye (A2) is dissolved in a solvent having a refractive index ($n_{20}d$) of less than 1.500, the absorption spectrum of the near infrared ray absorbing dye (A2) satisfying conditions (d) and (e):
(d) the peak wavelength is in a range of more than 720 nm and not more than 800 nm; and
(e) a full width at half maximum of the maximum absorption peak is not more than 100 nm.

5. The optical filter according to claim 4, wherein the near infrared ray absorbing dye (A2) comprises at least one member selected from cyanine compounds represented by formula (F2):

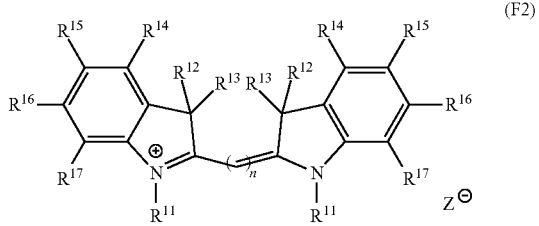

wherein
each $R^{11}$ independently represents an alkyl group having from 1 to 20 carbon atoms, an alkoxy group, an alkylsulfone group, or an anion species thereof;
each of $R^{12}$ and $R^{13}$ independently represents a hydrogen atom or an alkyl group having from 1 to 20 carbon atoms;
Z represents $PF_6$, $ClO_4$, $R^f$—$SO_2$, $(R^f$—$SO_2)_2$—N, or $BF_4$, wherein $R^f$ represents an alkyl group substituted with at least one fluorine atom;
each of $R^{14}$, $R^{15}$, $R^{16}$, and $R^{17}$ independently represents a hydrogen atom, a halogen atom, or an alkyl group having from 1 to 6 carbon atoms; and
n represents an integer of from 1 to 6.

6. The optical filter according to claim 1, wherein the transparent resin (B) comprises at least one member selected from the group consisting of an acrylic resin, an epoxy resin, an ene/thiol resin, a polycarbonate resin, and a polyester resin.

7. The optical filter according to claim 1, wherein in the near infrared ray absorbing layer, a proportion of the near infrared ray absorbing dye (A1) is from 3 to 100% by mass relative to the whole amount of the near infrared ray absorbing dye (A), and a proportion of the near infrared ray absorbing dye (A) is from 0.05 to 5 parts by mass based on 100 parts by mass of the transparent resin (B).

8. The optical filter according to claim 1, wherein the near infrared ray absorbing layer has a film-thickness of from 0.1 to 100 μm.

9. The optical filter according to claim 1, wherein the selective wavelength shielding layer comprises a dielectric multilayered film in which a low refractive index dielectric film and a high refractive index dielectric film are stacked alternately each other.

10. The optical filter according to claim 1, wherein the optical filter has a transmittance of visible light of from 420 to 620 nm being 70% or more, a transmittance of light in a wavelength range of from 710 to 860 nm being not more than 0.3%, and an amount of change of transmittance (Df) expressed by equation (2) being not more than −0.8:

$$Df(\%/nm)=[Tf_{700}(\%)-Tf_{630}(\%)]/[700(nm)-630(nm)] \quad (2)$$

wherein
in the equation (2), $Tf_{700}$ is a transmittance at a wavelength of 700 nm in a transmission spectrum of the optical filter; and $Tf_{630}$ is a transmittance at a wavelength of 630 nm in the transmission spectrum of the optical filter.

11. The optical filter according to claim 1, further comprising a transparent base material, wherein the near infrared ray absorbing layer is provided directly or indirectly on the transparent base material.

12. The optical filter according to claim 11, wherein the transparent base material is a glass sheet.

13. The optical filter according to claim 12, wherein the glass sheet is a colored glass sheet comprising CuO.

14. The optical filter according to claim 1, wherein the selective wavelength shielding layer further shields light in a wavelength range of from 710 to 720 nm.

15. A solid-state imaging element comprising:
a photoelectric conversion element;
a near infrared ray absorbing layer formed on the photoelectric conversion element, the near infrared ray absorbing layer comprising:
a near infrared ray absorbing dye (A); and
a transparent resin (B), the near infrared ray absorbing dye (A) being dispersed in the transparent resin (B); and
a selective wavelength shielding layer provided on one side or both sides of the near infrared ray absorbing layer, the selective wavelength shielding layer transmitting visible light of from 420 to 695 nm therethrough and shielding light in a wavelength range of from 720 to 1,100 nm,
wherein
the near infrared ray absorbing dye (A) comprises a near infrared ray absorbing dye (A1), an absorption spectrum of the near infrared ray absorbing dye (A1) in a wavelength range of from 400 to 1,000 nm having a maximum absorption peak at a peak wavelength, wherein the absorption spectrum is measured in a state in which the near infrared ray absorbing dye (A1) is dissolved in a solvent for dye having a refractive index ($n_{20}d$) of less than 1.500;
the absorption spectrum of the near infrared ray absorbing dye (A1) satisfies conditions (a) to (c):
(a) the peak wavelength is in a range of from 695 to 720 nm;
(b) a full width at half maximum of the maximum absorption peak is not more than 60 nm; and
(c) when calculated with an absorbance at the peak wavelength being 1, a value obtained by dividing a difference between an absorbance at 630 nm and an absorbance at the maximum absorption peak by a wavelength difference between 630 nm and the peak wavelength (nm) is from 0.010 to 0.050;
the transparent resin (B) has a refractive index ($n_{20}d$) of 1.54 or more; and
the near infrared ray absorbing layer has a transmittance of visible light of from 450 to 600 nm of 70% or more, a transmittance of light in a wavelength range of from 695 to 720 nm of not more than 10%, and an amount of change of transmittance (D) expressed by equation (1) of not more than −0.8:

$$D(\%/nm)=[T_{700}(\%)-T_{630}(\%)]/[700(nm)-630(nm)] \quad (1)$$

wherein
in the equation (1), $T_{700}$ is a transmittance at a wavelength of 700 nm in a transmission spectrum of the near infrared ray absorbing layer; and $T_{630}$ is a transmittance at a wavelength of 630 nm in the transmission spectrum of the near infrared ray absorbing layer.

16. The solid-state imaging element according to claim 15, further comprising, on the photoelectric conversion element, at least one member selected from a light shielding layer, a flattened layer, a color filter layer, and a microlens.

17. The solid-state imaging element according to claim 15, wherein the selective wavelength shielding layer comprises a dielectric multilayered film in which a low refractive index dielectric film and a high refractive index dielectric film are stacked alternately each other.

18. The solid-state imaging element according to claim 15, wherein the selective wavelength shielding layer further shields light in a wavelength range of from 710 to 720 nm.

19. An imaging device lens comprising:
a near infrared ray absorbing layer which comprises:
a near infrared ray absorbing dye (A); and
a transparent resin (B), the near infrared ray absorbing dye (A) being dispersed in the transparent resin (B); and
a selective wavelength shielding layer provided on one side or both sides of the near infrared ray absorbing layer, the selective wavelength shielding layer transmitting visible light of from 420 to 695 nm therethrough and shielding light in a wavelength range of from 720 to 1,100 nm, wherein
the near infrared ray absorbing dye (A) comprises a near infrared ray absorbing dye (A1), an absorption spectrum of the near infrared ray absorbing dye (A1) in a wavelength range of from 400 to 1,000 nm having a maximum absorption peak at a peak wavelength, wherein the absorption spectrum is measured in a state in which the near infrared ray absorbing dye (A1) is dissolved in a solvent for dye having a refractive index ($n_{20}d$) of less than 1.500;
the absorption spectrum of the near infrared ray absorbing dye (A1) satisfies conditions (a) to (c):
(a) the peak wavelength is in a range of from 695 to 720 nm;
(b) a full width at half maximum of the maximum absorption peak is not more than 60 nm; and
(c) when calculated with an absorbance at the peak wavelength being 1, a value obtained by dividing a difference between an absorbance at 630 nm and an absorbance at the maximum absorption peak by a wavelength difference between 630 nm and the peak wavelength (nm) is from 0.010 to 0.050;
the transparent resin (B) has a refractive index ($n_{20}d$) of 1.54 or more; and
the near infrared ray absorbing layer has a transmittance of visible light of from 450 to 600 nm of 70% or more, a transmittance of light in a wavelength range of from 695 to 720 nm of not more than 10%, and an amount of change of transmittance (D) expressed by equation (1) of not more than −0.8:

$$D(\%/nm)=[T_{700}(\%)-T_{630}(\%)]/[700(nm)-630(nm)] \qquad (1)$$

wherein
in the equation (1), $T_{700}$ is a transmittance at a wavelength of 700 nm in a transmission spectrum of the near infrared ray absorbing layer; and $T_{630}$ is a transmittance at a wavelength of 630 nm in the transmission spectrum of the near infrared ray absorbing layer.

20. The imaging device lens according to claim 19, wherein the near infrared ray absorbing layer is formed on at least one surface of a lens main body.

21. The imaging device lens according to claim 19, wherein the selective wavelength shielding layer comprises a dielectric multilayered film in which a low refractive index dielectric film and a high refractive index dielectric film are stacked alternately each other.

22. The imaging device lens according to claim 19, wherein the selective wavelength shielding layer further shields light in a wavelength range of from 710 to 720 nm.

23. An imaging device comprising the solid-state imaging element described in claim 15.

24. An imaging device comprising the imaging device lens described in claim 19.

* * * * *